(12) United States Patent
Bertin et al.

(10) Patent No.: US 7,598,544 B2
(45) Date of Patent: Oct. 6, 2009

(54) HYBRID CARBON NANOTUDE FET(CNFET)-FET STATIC RAM (SRAM) AND METHOD OF MAKING SAME

(75) Inventors: Claude L. Bertin, South Burlington, VT (US); Mitchell Meinhold, Arlington, MA (US); Steven L. Konsek, Boston, MA (US); Thomas Rueckes, Rockport, MA (US); Frank Guo, Danville, CA (US)

(73) Assignee: Nanotero, Inc., Woburn, MA (US)

( * ) Notice: Subject to any disclaimer, the term of this patent is extended or adjusted under 35 U.S.C. 154(b) by 422 days.

(21) Appl. No.: 11/332,080

(22) Filed: Jan. 13, 2006

(65) Prior Publication Data

US 2006/0237857 A1 Oct. 26, 2006

Related U.S. Application Data

(60) Provisional application No. 60/644,427, filed on Jan. 14, 2005, provisional application No. 60/644,641, filed on Jan. 18, 2005.

(51) Int. Cl.
*H01L 27/11* (2006.01)
*H01L 21/8244* (2006.01)

(52) U.S. Cl. .............. 257/213; 257/288; 257/618; 257/903; 257/E27.098; 257/E21.661; 365/49.11; 365/154; 365/156; 365/174; 365/181; 365/182; 438/142; 438/197; 438/478

(58) Field of Classification Search ............... None
See application file for complete search history.

(56) References Cited

U.S. PATENT DOCUMENTS

| | | |
|---|---|---|
| 3,448,302 A | 6/1969 | Shanefield |
| 4,845,533 A | 7/1989 | Pryor et al. |
| 4,853,893 A | 8/1989 | Eaton, Jr. et al. |
| 4,888,630 A | 12/1989 | Paterson |
| 4,979,149 A | 12/1990 | Popovic et al. |
| 5,198,994 A | 3/1993 | Natori et al. |
| 5,414,654 A | 5/1995 | Kubota et al. |
| 5,682,345 A | 10/1997 | Roohparvar et al. |
| 5,818,748 A | 10/1998 | Bertin et al. |
| 5,834,818 A | 11/1998 | Beilstein, Jr. et al. |
| 5,920,101 A | 7/1999 | Beilstein, Jr. et al. |
| 6,044,008 A | 3/2000 | Choi |
| 6,048,740 A | 4/2000 | Hsu et al. |
| 6,097,241 A | 8/2000 | Bertin et al. |
| 6,097,243 A | 8/2000 | Bertin et al. |

(Continued)

FOREIGN PATENT DOCUMENTS

GB 2364933 A 2/2002

(Continued)

OTHER PUBLICATIONS

Bachtold et al. Logic Circuits with Carbon Nanotube Transistors. Oct. 4, 2001. Sciencexpress.*

(Continued)

*Primary Examiner*—Andy Huynh
*Assistant Examiner*—Hoang-Quan T Ho
(74) *Attorney, Agent, or Firm*—Wilmer Cutler Pickering Hale and Dorr LLP

(57) ABSTRACT

Hybrid carbon nanotube FET (CNFET), static ram (SRAM) and method of making same. A static ram memory cell has two cross-coupled semiconductor-type field effect transistors (FETs) and two nanotube FETs (NTFETs), each having a channel region made of at least one semiconductive nanotube, a first NTFET connected to the drain or source of the first semiconductor-type FET and the second NTFET connected to the drain or source of the second semiconductor-type FET.

6 Claims, 47 Drawing Sheets

U.S. PATENT DOCUMENTS

| | | | |
|---|---|---|---|
| 6,128,214 | A | 10/2000 | Kuekes et al. |
| 6,141,245 | A | 10/2000 | Bertin et al. |
| 6,159,620 | A | 12/2000 | Heath et al. |
| 6,198,655 | B1 | 3/2001 | Heath et al. |
| 6,219,215 | B1 | 4/2001 | Bertin et al. |
| 6,243,283 | B1 | 6/2001 | Bertin et al. |
| 6,256,767 | B1 | 7/2001 | Kuekes et al. |
| 6,314,019 | B1 | 11/2001 | Kuekes et al. |
| 6,345,362 | B1 | 2/2002 | Bertin et al. |
| 6,346,846 | B1 | 2/2002 | Bertin et al. |
| 6,353,552 | B2 | 3/2002 | Sample et al. |
| 6,373,771 | B1 | 4/2002 | Fifield et al. |
| 6,423,583 | B1 | 7/2002 | Avouris et al. |
| 6,426,687 | B1 | 7/2002 | Osborn |
| 6,430,511 | B1 | 8/2002 | Tour et al. |
| 6,445,006 | B1 | 9/2002 | Brandes et al. |
| 6,459,095 | B1 | 10/2002 | Heath et al. |
| 6,462,977 | B2 | 10/2002 | Butz |
| 6,515,339 | B2 | 2/2003 | Shin et al. |
| 6,518,156 | B1 | 2/2003 | Chen et al. |
| 6,548,841 | B2 | 4/2003 | Frazier et al. |
| 6,559,468 | B1 | 5/2003 | Kuekes et al. |
| 6,574,130 | B2 | 6/2003 | Segal et al. |
| 6,587,408 | B1 | 7/2003 | Jacobson et al. |
| 6,625,047 | B2 | 9/2003 | Coleman, Jr. |
| 6,625,740 | B1 | 9/2003 | Datar et al. |
| 6,643,165 | B2 | 11/2003 | Segal et al. |
| 6,661,270 | B2 | 12/2003 | Nagata |
| 6,706,402 | B2 | 3/2004 | Rueckes et al. |
| 6,707,098 | B2 | 3/2004 | Hofmann et al. |
| 6,740,910 | B2 | 5/2004 | Roesner et al. |
| 6,759,693 | B2 | 7/2004 | Vogeli et al. |
| 6,774,052 | B2 | 8/2004 | Vogeli et al. |
| 6,784,028 | B2 | 8/2004 | Rueckes et al. |
| 6,794,914 | B2 | 9/2004 | Sani et al. |
| 6,803,840 | B2 | 10/2004 | Hunt et al. |
| 6,809,465 | B2 | 10/2004 | Jin |
| 6,835,591 | B2 | 12/2004 | Rueckes et al. |
| 6,911,682 | B2 | 6/2005 | Rueckes et al. |
| 6,918,284 | B2 | 7/2005 | Snow et al. |
| 6,919,592 | B2 | 7/2005 | Segal et al. |
| 6,919,740 | B2 | 7/2005 | Snider |
| 6,924,538 | B2 | 8/2005 | Jaiprakash et al. |
| 6,942,921 | B2 | 9/2005 | Rueckes et al. |
| 6,955,937 | B1 | 10/2005 | Burke et al. |
| 6,968,486 | B2 | 11/2005 | Matsushima |
| 6,969,651 | B1 | 11/2005 | Lu et al. |
| 6,986,962 | B2 | 1/2006 | Oyanagi et al. |
| 7,015,500 | B2 | 3/2006 | Choi et al. |
| 7,054,194 | B2 | 5/2006 | Liaw et al. |
| 7,115,901 | B2 | 10/2006 | Bertin et al. |
| 7,259,410 | B2 | 8/2007 | Jaiprakash et al. |
| 2001/0023986 | A1 | 9/2001 | Mancevski |
| 2002/0173083 | A1 | 11/2002 | Avouris et al. |
| 2002/0175390 | A1 | 11/2002 | Goldstein et al. |
| 2003/0021141 | A1 | 1/2003 | Segal et al. |
| 2003/0021966 | A1 | 1/2003 | Segal et al. |
| 2003/0124325 | A1 | 7/2003 | Rueckes et al. |
| 2003/0132823 | A1 | 7/2003 | Hyman et al. |
| 2003/0148562 | A1 | 8/2003 | Luyken et al. |
| 2003/0165074 | A1 | 9/2003 | Segal et al. |
| 2003/0170930 | A1 | 9/2003 | Choi et al. |
| 2003/0178617 | A1 | 9/2003 | Appenzeller et al. |
| 2003/0199172 | A1 | 10/2003 | Rueckes et al. |
| 2003/0200521 | A1 | 10/2003 | DeHon et al. |
| 2003/0206436 | A1 | 11/2003 | Eaton et al. |
| 2004/0023514 | A1 | 2/2004 | Moriya et al. |
| 2004/0027889 | A1 | 2/2004 | Occhipinti et al. |
| 2004/0031975 | A1 | 2/2004 | Kern et al. |
| 2004/0043148 | A1 | 3/2004 | Wei et al. |
| 2004/0075125 | A1 | 4/2004 | Asao |
| 2004/0085805 | A1 | 5/2004 | Segal et al. |
| 2004/0095837 | A1 | 5/2004 | Choi et al. |
| 2004/0159833 | A1 | 8/2004 | Rueckes et al. |
| 2004/0164327 | A1 | 8/2004 | Shin et al. |
| 2004/0238907 | A1 | 12/2004 | Pinkerton et al. |
| 2004/0245577 | A1* | 12/2004 | Bhattacharyya ............. 257/369 |
| 2005/0012788 | A1 | 1/2005 | Yamaguchi et al. |
| 2005/0058590 | A1 | 3/2005 | Sen et al. |
| 2005/0068128 | A1 | 3/2005 | Yip |
| 2005/0073060 | A1* | 4/2005 | Datta et al. ................. 257/903 |
| 2005/0139902 | A1 | 6/2005 | Jung |
| 2005/0141266 | A1 | 6/2005 | Jung |
| 2005/0141272 | A1 | 6/2005 | Jung |
| 2005/0162896 | A1 | 7/2005 | Jung |
| 2005/0174842 | A1 | 8/2005 | Bertin et al. |
| 2005/0269554 | A1 | 12/2005 | Sen et al. |

FOREIGN PATENT DOCUMENTS

| | | | |
|---|---|---|---|
| WO | WO-01/03208 | A1 | 1/2001 |

OTHER PUBLICATIONS

U.S. Appl. No. 10/341,005, Ward et al.
U.S. Appl. No. 10/341,054, Ward et al.
U.S. Appl. No. 10/341,130, Ward et al.
U.S. Appl. No. 10/341,055, Ward et al.
U.S. Appl. No. 60/636,673, Ghenciu et al.
Appenzeller, J. et al., "A 10 nm MOSFET Concept", *Microelectronic Engineering*, vol. 56, pp. 213-219, 2001.
Appenzeller, J. et al., "Carbon Nanotube Electronics", *IEEE Transactions on Nanotechnology*, vol. 1, No. 4, pp. 184-189, 2002.
Appenzeller, J. et al., "Field-Modulated Carrier Transport in Carbon Nanotube Transistors", *Physical Review Letters*, vol. 89, No. 2, pp. 126801-1-126801-4, 2002.
Appenzeller, J. et al., "Optimized Contact Configuration for the Study of Transport Phenomena in Ropes of Single-wall Carbon Nanotubes", *Applied Physics Letters*, vol. 78, No. 21, pp. 3313-3315, 2001.
Avouris, PH, "Carbon Nanotube Electronics", *Chemical Physics*, vol. 281, pp. 429-445, 2002.
Avouris, PH, "Molecular Electronics with Carbon Nanotubes", *Accounts of Chemical Research*, vol. 35, No. 12, pp. 1026-1035, 2002.
Avouris, Ph. et al., "Carbon Nanotube Electronics and Optoelectronics", *IEEE*, 2004.
Bachtold, A. et al., "Logic Circuits with Carbon Nanotube Transistors", *Science*, vol. 294, pp. 1317-1320, 2001.
Bernholc et al., "Mechanical and Electrical Properties of Nanotubes", *Ann. Rev. Mater. Res.*, vol. 32, p. 347, 2002.
Bertin, C., "Known Good Die", *Area Array Interconnection Handbook*, Chapter 4.
Bradley, K. et al., "Flexible Nanotube Electronics," *Nano Letters*, vol. 3, No. 10, pp. 1353-1355, 2003.
Brehob, M. et al., "The Potential of Carbon-based Memory Systems", pp. 1-5.
Chen, J. et al., "Self-aligned Carbon Nanotube Transistors With Charge Transfer Doping", *Applied Physics Letters*, 86, 123108-1, 2005.
Chen, J. et al., "Self-aligned Carbon Nanotube Transistors with Novel Chemical Doping", *IEEE*, 2004.
Choi, W.B. et al., "Carbon-Nanotube-Based Nonvolatile Memory with Oxide-Nitride-Oxide Film and Nanoscale Channel", *Applied Physics Letters*, vol. 82, No. 2, pp. 275-277, 2003.
Collins, P.G. et al., "Engineering Carbon Nanotubes and Nanotube Circuits Using Electrical Breakdown", *Science*, vol. 292, pp. 706-709, 2001.
Collins, P.G., "Current Saturation and Electrical Breakdown in Multiwalled Carbon Nanotubes", *Physical Review Letters*, vol. 86, No. 14, pp. 3128-3131, 2001.
Collins, P.G., "Nanotubes for Electronics", *Scientific American*, pp. 62-69, Dec. 2000.
Cui, J. B. et al., "Carbon Nanotube Memory Devices of High Charge Storage Stability", *Applied Physics Letters*, vol. 81, No. 17, pp. 3260-3262, 2002.

Das, G. et al., "Wafer-Level Test", *Area Array Interonnection Handbook* (reference book), Chapter 3, editors K. Puttlitz and P. Totta, Kluwer Academic Publishers, 2001.

Derycke, V. et al., "Carbon Nanotube Inter- and Intramolecular Logic Gates", *Nano Letters*, vol. 1, No. 9, pp. 453-456, 2001.

Derycke, V. et al., "Controlling Doping and Carrier Injection in Carbon Nanotube Transistors", *Applied Physics Letters*, vol. 80, No. 15, pp. 2773-2775, Apr. 15, 2002.

Duan, X. et al., "Nonvolatile Memory and Programmable Logic from Molecule-Gated Nanowires", *American Chemical Society, Nano Letters*, vol. 0, No. 0 A-D, Mar. 2002.

Fuhrer, M.S. et al., "High-Mobility Nanotube Transistor Memory", *Nano Letters*, vol. 2, No. 7, pp. 755-759, 2002.

Heinze, S. et al., "Electrocostatic Engineering of Nanotube Transistors for Imrpoved Performance", *Applied Physics Letters*, vol. 83, No. 24, pp. 5038-5040, 2003.

Heinze, S. et al., "Unexpected Scaling of the Performance of Carbon Nanotube Transistsors", published on the web, Feb. 10, 2003.

Heinze, S., "Carbon Nanotubes as Schottky Barrier Transistors", *Physical Review Letters*, vol. 89, No. 10, pp. 106801-1-106801-4, Sep. 2, 2002.

Itoh, K., "VLSI Memory Chip Design", *Springer Publisher*, pp. 37-46, 2001.

Javey, A. et al., "Carbon Nanotube Field-Effect Transistors with Integrated Ohmic Contacts and High-k Gate Dielectrics", *Nano Letters*, vol. 4, No. 3, pp. 447-450, 2004.

Javey, A. et al., "Carbon Nanotube Transistor Arrays for Multistage Complementary Logic and Ring Oscillators", *Nano Letters*, vol. 2, No. 9, pp. 929-932, 2002.

Javey, A. et al., "High-k Dielectrics for Advanced Carbon-nanotube Transistors and Logic Gates", *from a nature materials Online Publication*, www.nature.com/naturematerials, Nov. 17, 2002.

Kinaret, J. et al., "A Carbon-nanotube-based Nanorelay", *Applied Physics Letters*, vol. 82, No. 8, pp. 1287-1289, Feb. 2003.

Lin, Y-M, "Novel Carbon Nanotube FET Design with Tunable Polarity", *IEEE*, 2004.

Luyken, R.J. et al., "Concepts for Hybrid CMOS-molecular Non-volatile Memories", *Nanotechnology*, vol. 14, pp. 273-276, 2003.

Martel, R. et al., "Ambipolar Electrical Transport in Semiconducting Single-Wall Carbon Nanotubes", *Physical Review Letters*, vol. 87, No. 25, pp. 256805-1-256805-4, Dec. 17, 2001.

Martel, R. et al., "Carbon Nanotube Field-Effect Transistors and Logic Circuits", *DAC*, vol. 7. No. 4, pp. 94-98, 2002.

Martel, R. et al., "Single- and Multi-Wall Carbon Nanotube Field-Effect Transistors", *Applied Physics Letters*, vol. 73, No. 17, pp. 2447-2449, Oct. 26, 1998.

Millman, J. et al., "Integrated Electronics: Analog and Digital Circuits and Systems", *McGraw-Hill Book Company*, pp. 322-328, 1972.

Onoa, G.B. et al., "Bulk Production of Singly Dispersed Carbon Nanotubes with Prescribed Lengths", *Nanotechnology*, vol. 16, pp. 2799-2803, 2005.

Radosavljevic et al., "Drain Voltage Scaling in Carbon Nanotube Transistors", *Applied Physics Letters*, vol. 83, No. 12, pp. 2435-2437, Dec. 22, 2003.

Radosavljevic et al., "High Performance of Potassium $n$-Doped Carbon Nanotube Field Transistors", *Applied Physic Letters*, vol. 84, No. 18, pp. 3693-3695, May 3, 2004.

Radoslavjevic, M. et al., "Nonvolatile Molecular Memory Elements Based on Ambipolar Nanotube Field Effect Transistors", *Nano Letters*, vol. 2, No. 7, pp. 761-764, 2002.

Rochefort, A. et al., "Switching Behavior of Semiconducting Carbon Nanotubes Under an External Electric Field", *Applied Physics Letters*, vol. 78, No. 17, pp. 2521-2523, Apr.23, 2001.

Rueckes, T. et al., "Carbon Nanotube-Based Nonvolatile Random Access Memory for Molecular Computing", *Science*, vol. 289, pp. 94-97, Jul. 7, 2000.

Sapmaz, S. et al., "Carbon Nanotubes as Nanoelectromechanical Systems", *Physcial Review B.*, vol. 67, pp. 23514-1-23514-7, 2003.

Shim, M. et al., "Polymer Functionalization for Air-Stable n-Type Carbon Nanotube Field- Effect Transistors", *J. Am. Chem.*, vol. 123, pp. 11512-11513, 2001.

Stadermann, M. et al., "Nanoscale Study of Conduction Through Carbon Nanotube Networks," *Phys. Rev. B 69*, 201402(R), 2004.

Sze, S.M., "Physics of Semiconductor Devices", *John Wiley and Sons*, New York, pp. 431- 438, 1981.

Wind, S. J. et al., "Vertical Scaling of Carbon Nanotubes Field-effect Transistors Using Top Gate Electrodes", *Applied Physics Letters*, vol. 80, No. 20, May 20, 2002.

Wind, S.J. et al., "Fabrication and Electrical Characterization of Top Gate Single-Wall Carbon Nanotube Field-Effect Transistors", *IBM T.J. Watson Research Center*.

Wind, S.J. et al., "Lateral Scaling in Carbon-Nanotube Field-Effect Transistors", *Physical Review Letters*, vol. 91, No. 5, pp. 058301-1-058301-4, Aug. 1, 2003.

Wind, S.J. et al., "Transistor Structures for the Study of Scaling in Carbon Nanotubes", *J. Vac. Sci. Technol. B*, vol. 21, No. 6, pp. 2856-2859, 2003.

Yoneya, N. et al., "Charge Transfer Control by Gate Voltage in Crossed Nanotube Junction", *Applied Physics Letters*, vol. 81, No. 12, pp. 2250-2252, Sep. 16, 2002.

Zhou, Y. et al., "p-Channel, n-Channel Thin Film Transistors and p-n Diodes Based on Single Wall Carbon Nanotube Networks", *Nano Letters*, vol. 4, No. 10, pp. 2031-2035, 2004.

\* cited by examiner

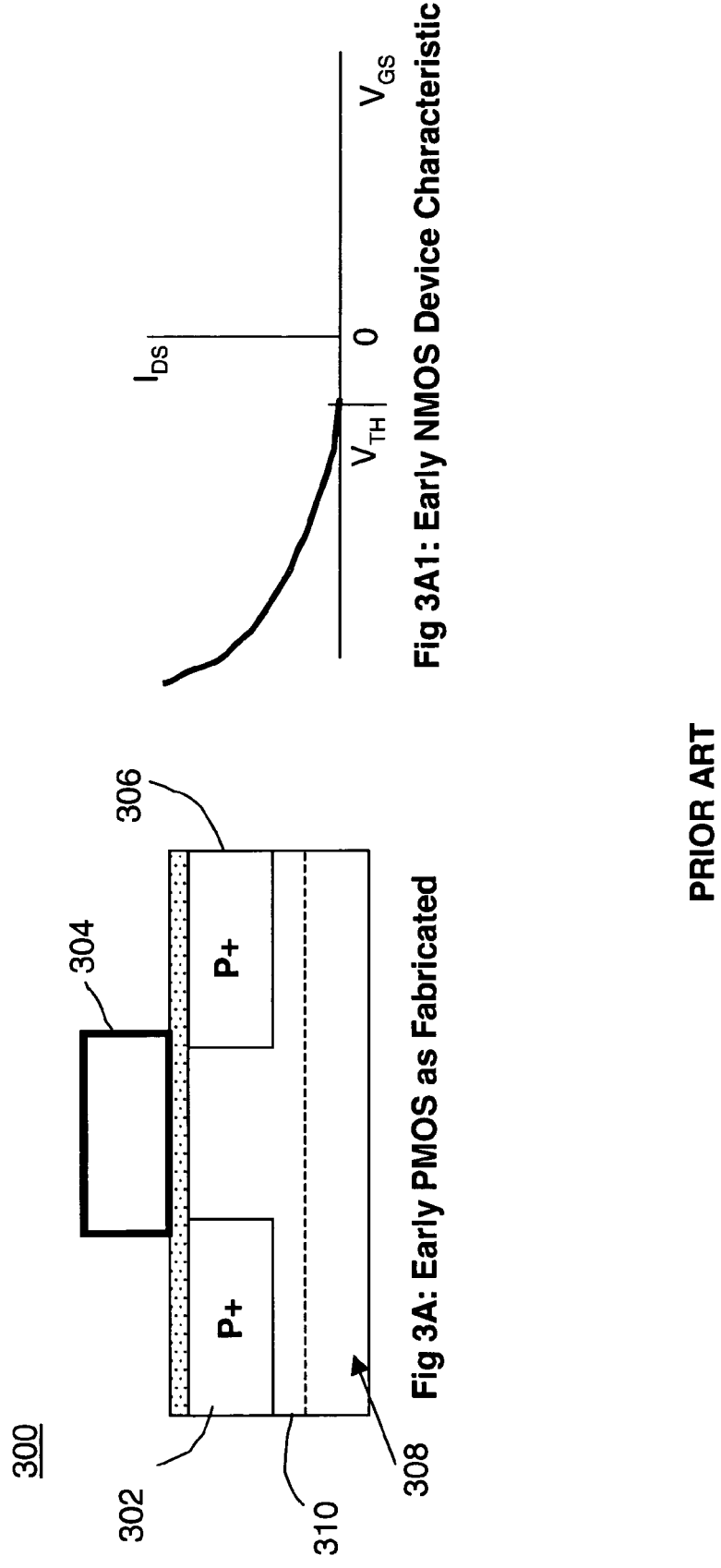
PRIOR ART

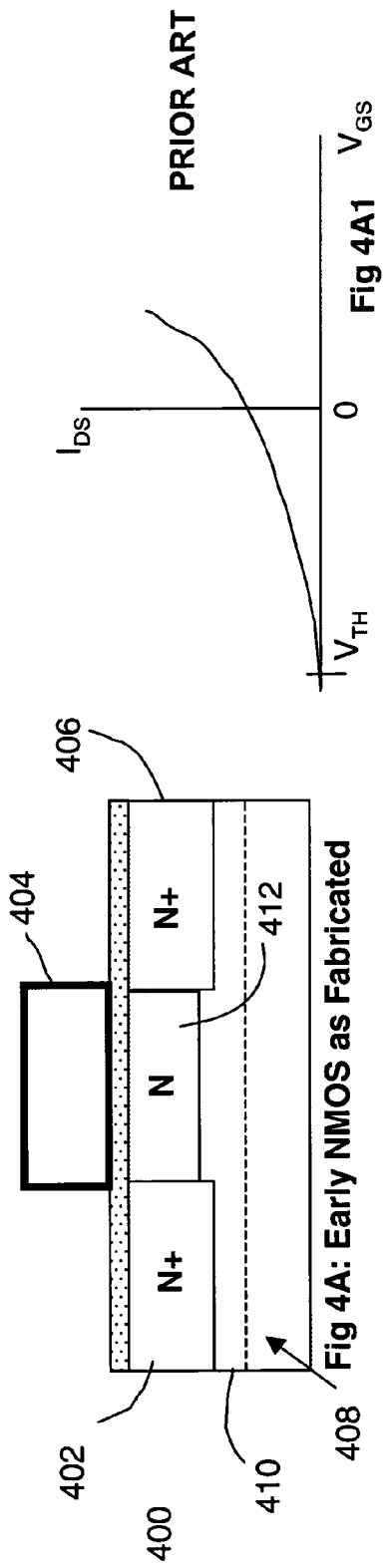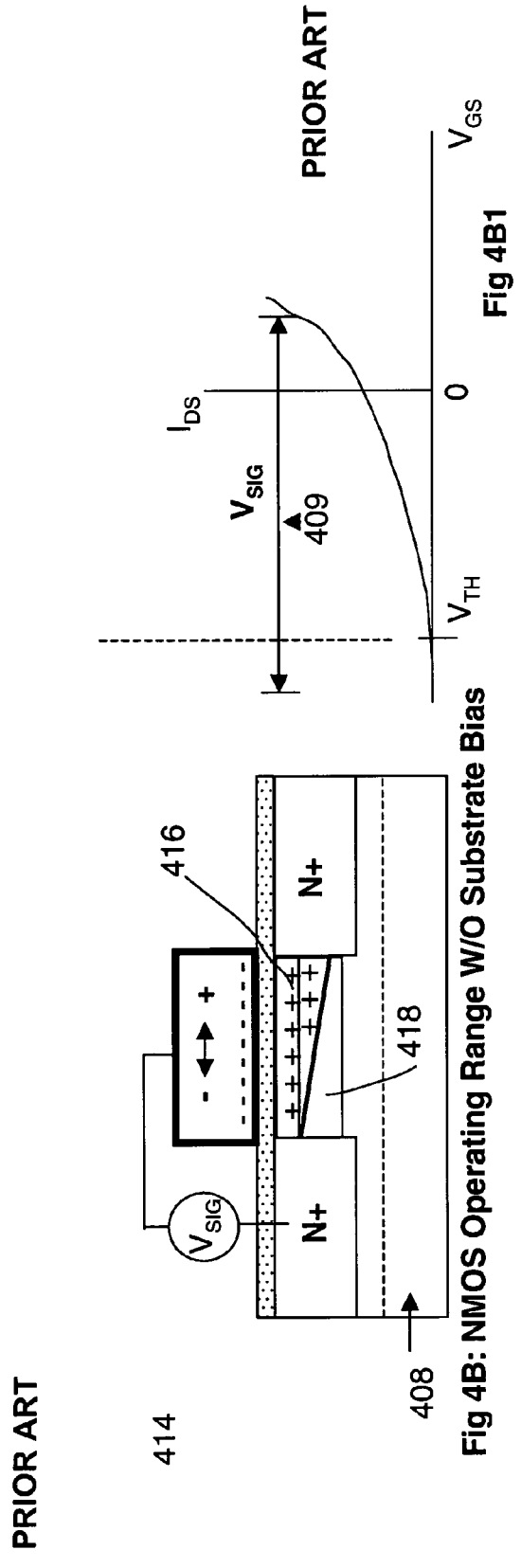

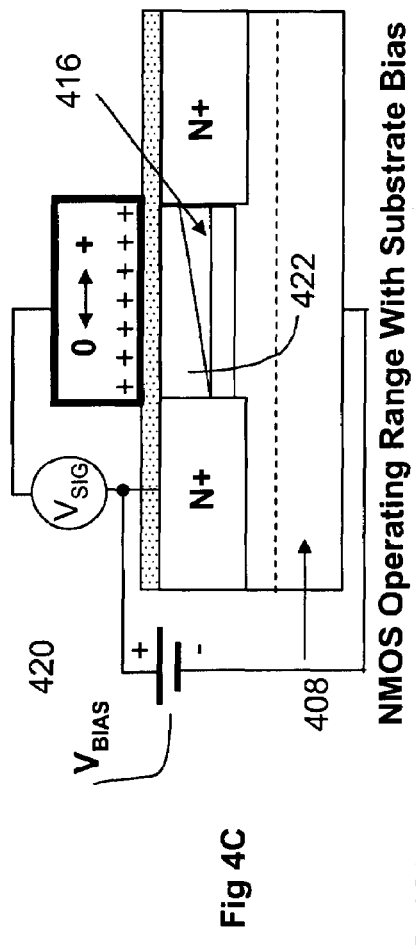
Fig 4C
NMOS Operating Range With Substrate Bias
PRIOR ART
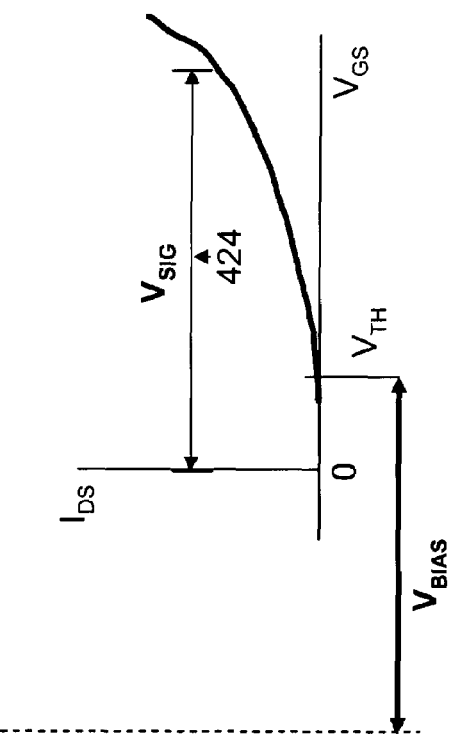
Fig 4C1
PRIOR ART

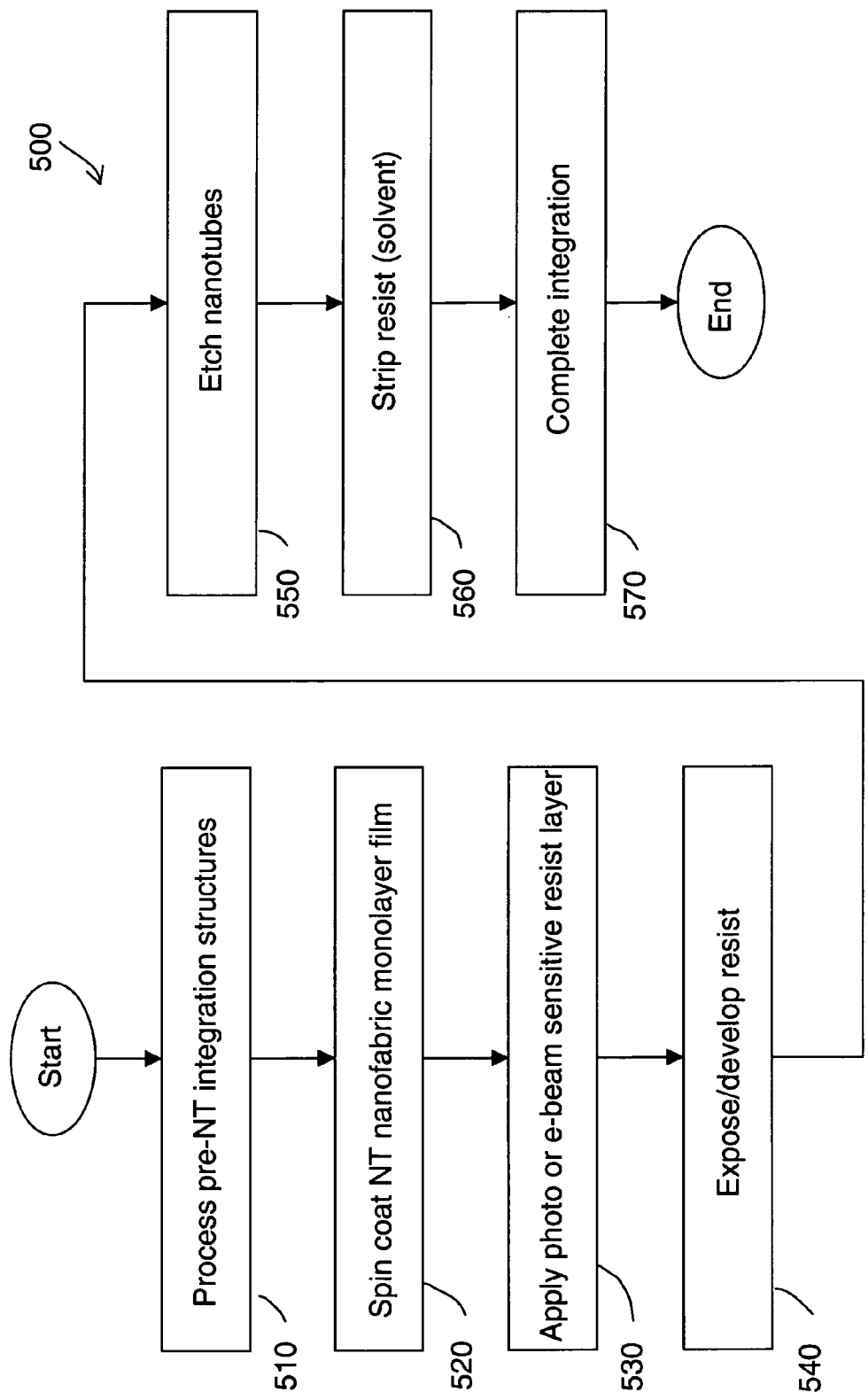
Fig 5: Methods of SWNT Nanofabric Deposition and Patterning

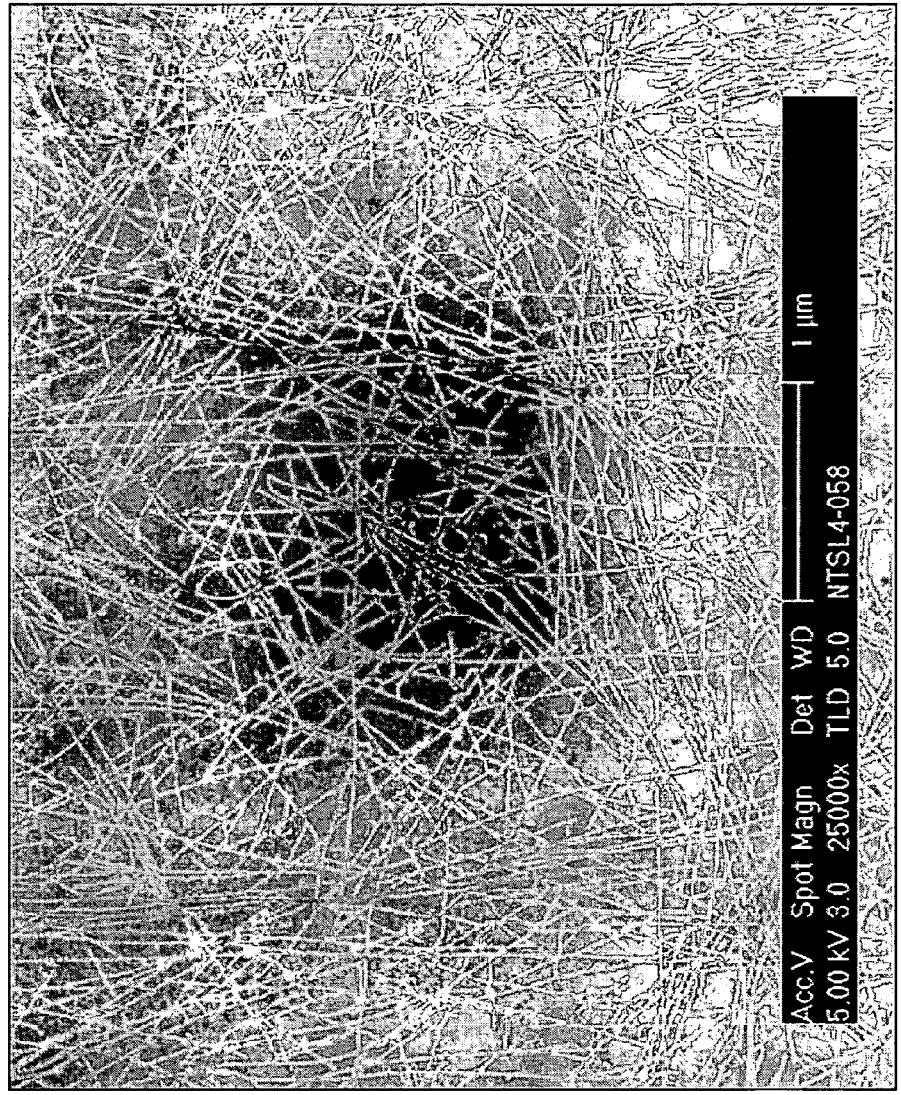
Fig 6A: Deposited Non-woven SWNT Nanofabric
Batch 58;
1 spin R9
SR: 3.0-3.7 kohm

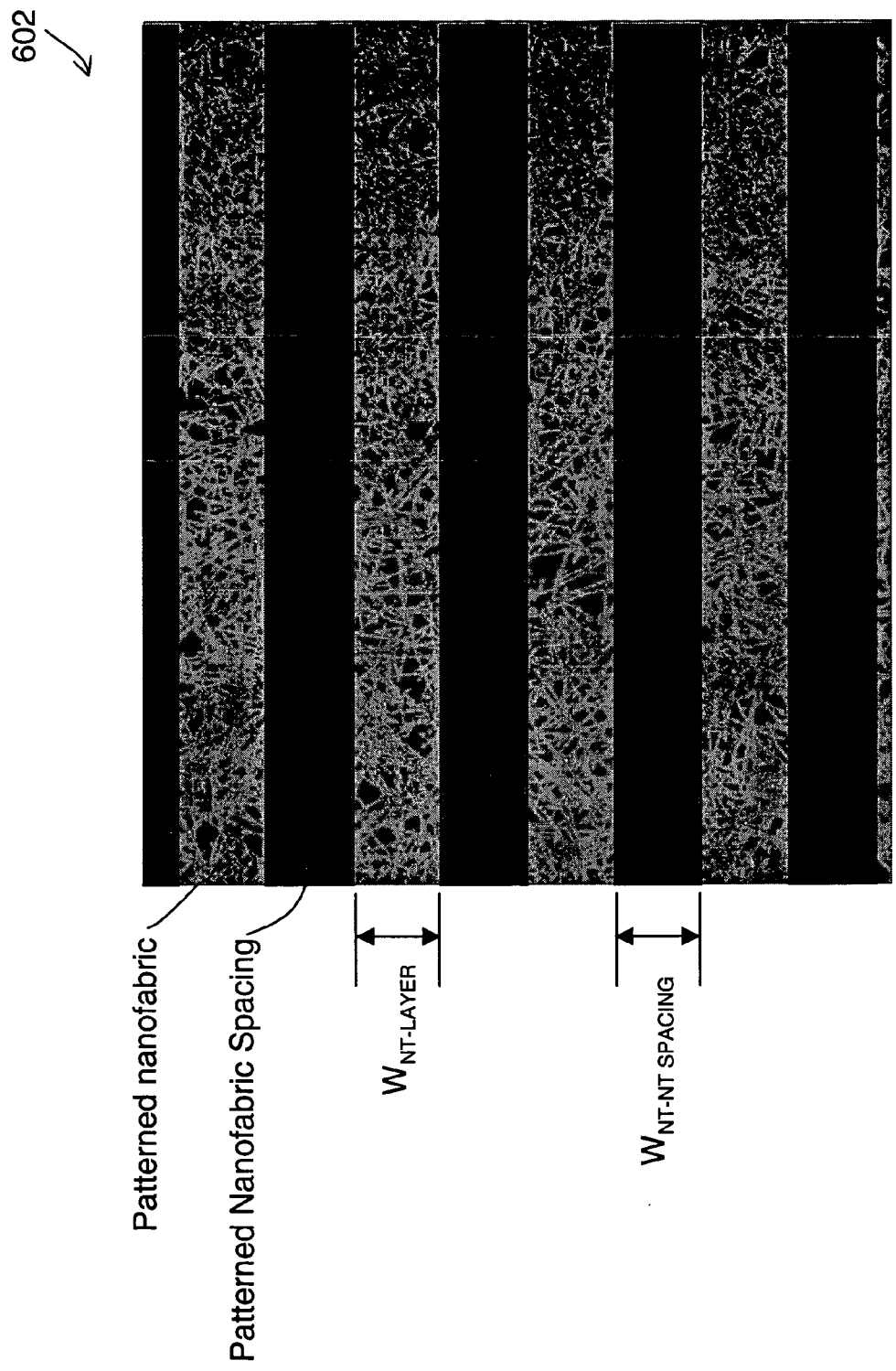
Fig 6B: Patterned Non-woven SWNT Nanofabric

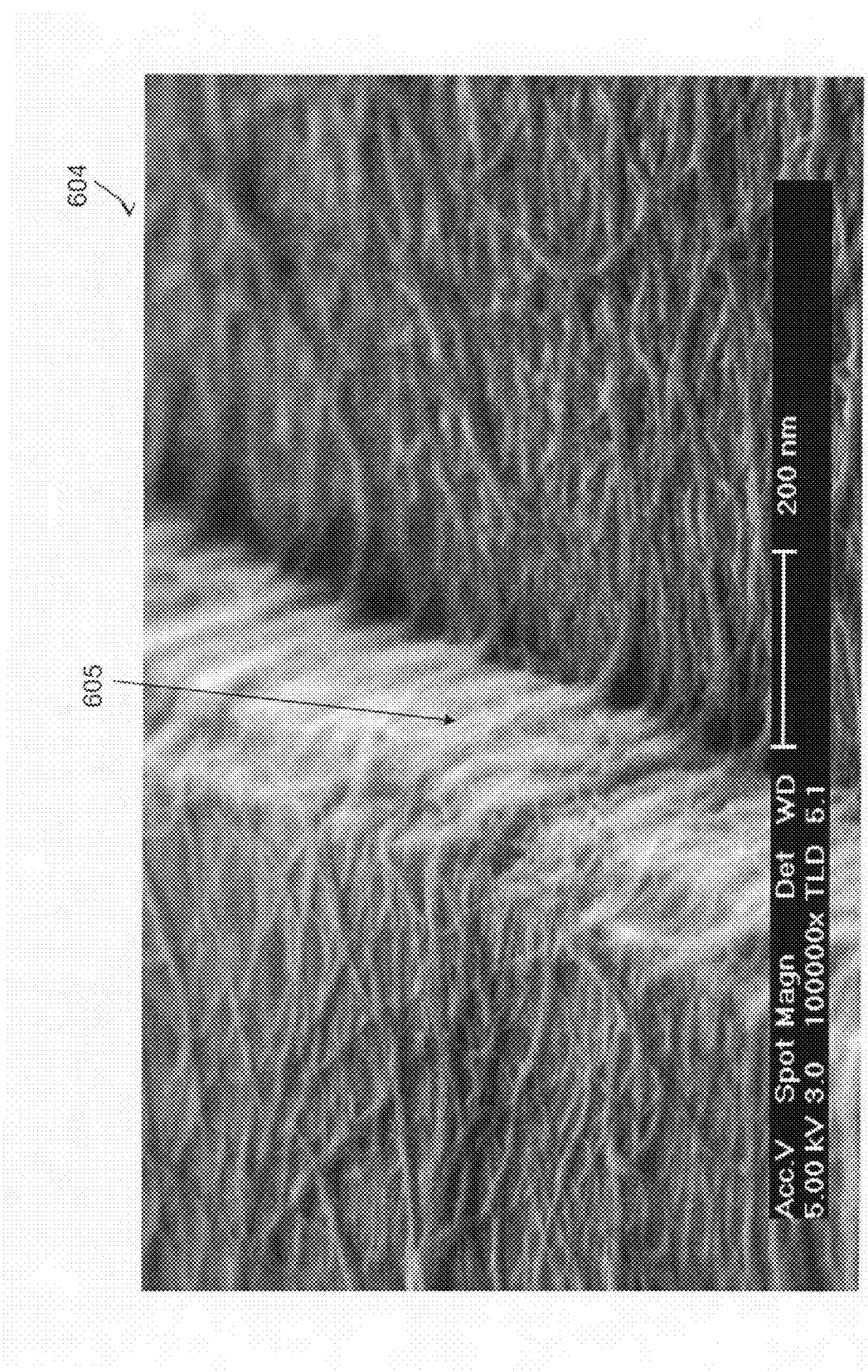
Fig 6C: Deposited Non-woven SWNT Nanofabric Conforming to an underlying Step

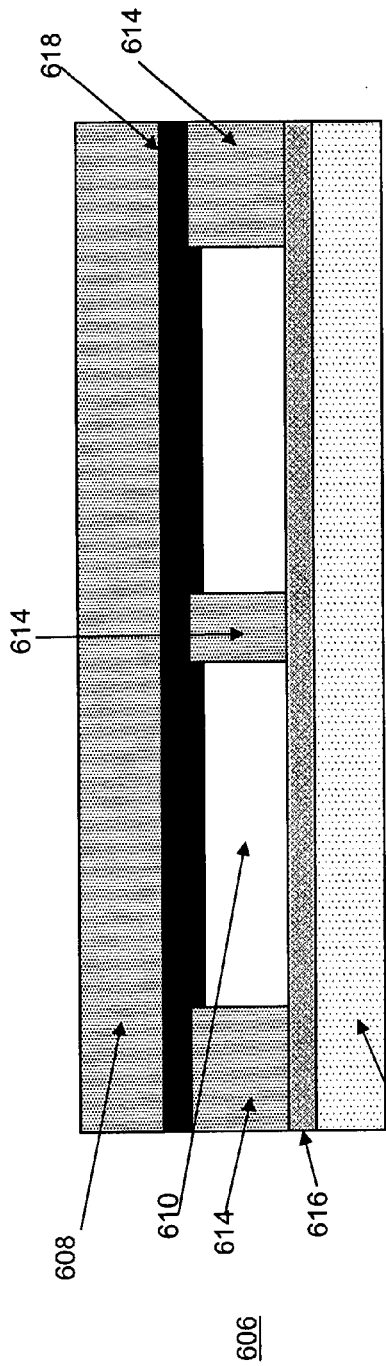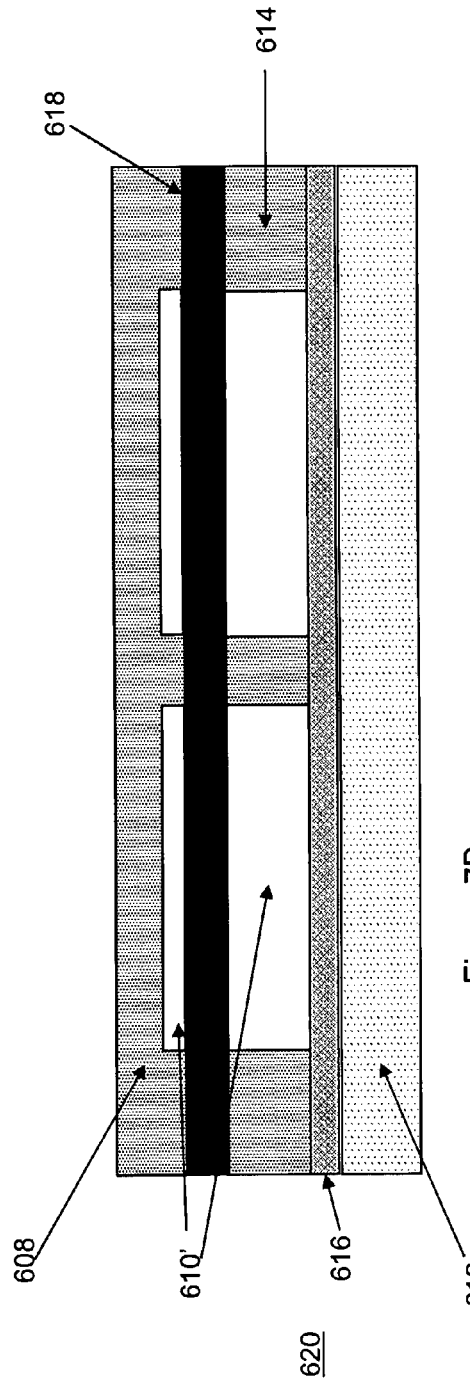
Figure 7A PRIOR ART
Figure 7B Prior Art

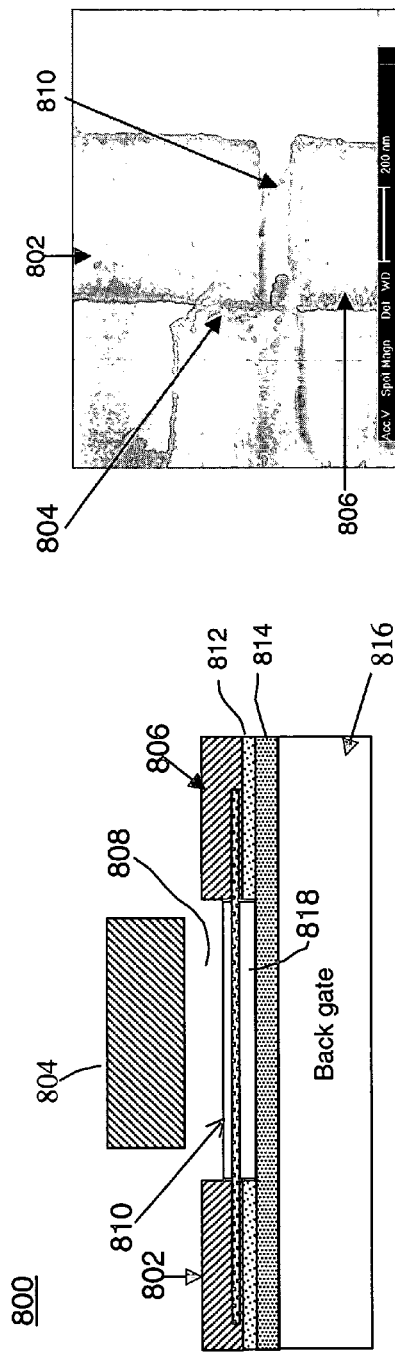
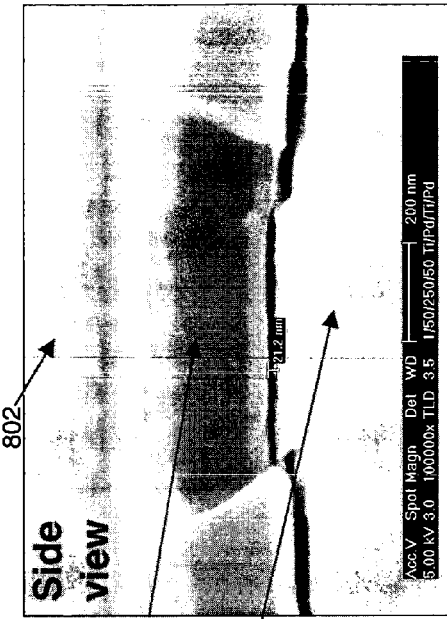
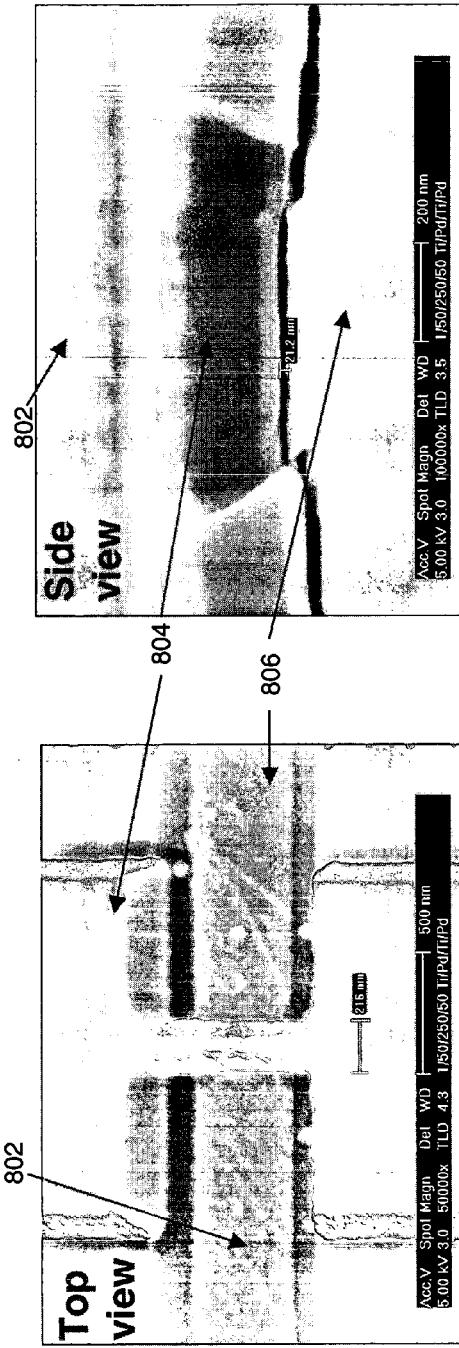
Fig 8A: Integrated SWNT Nanofabric with air dielectric; CNFET operation observed
Fig 8B: Top gate (break-away) view
Fig 8C: Plan (top) view
Fig 8D: Side view from drain contact side

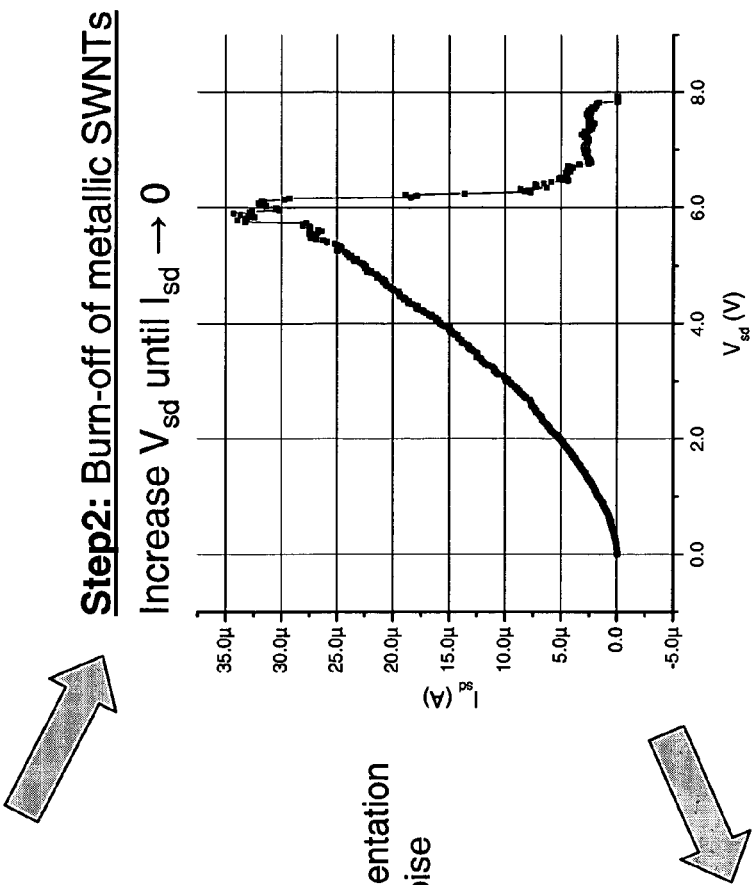

Step2: Burn-off of metallic SWNTs
Increase $V_{sd}$ until $I_{sd} \rightarrow 0$ Fig 9B: Burn-off of Metallic SWNTs: burn-off I-V characteristics

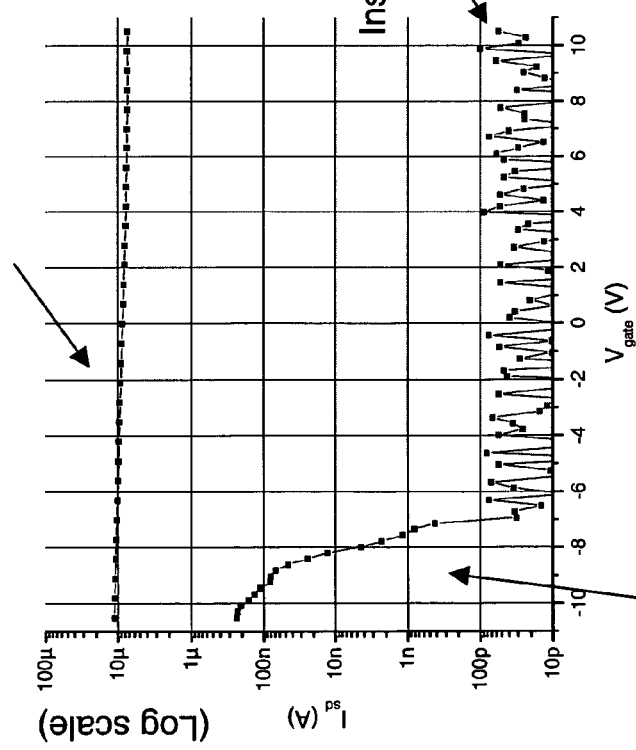

Step1: Before burn-off
Sweep bottom (back) gate, $I_{ON}/I_{OFF} \sim 1.5$
Metallic and semiconducting SWNTs

Step3: After burn-off: P-CNFET behavior
Sweep bottom (back) gate, $I_{ON}/I_{OFF} > 10^5$
Only semiconducting SWNTs remain Fig 9A: Burn-off of Metallic SWNTs: before and after burn-off

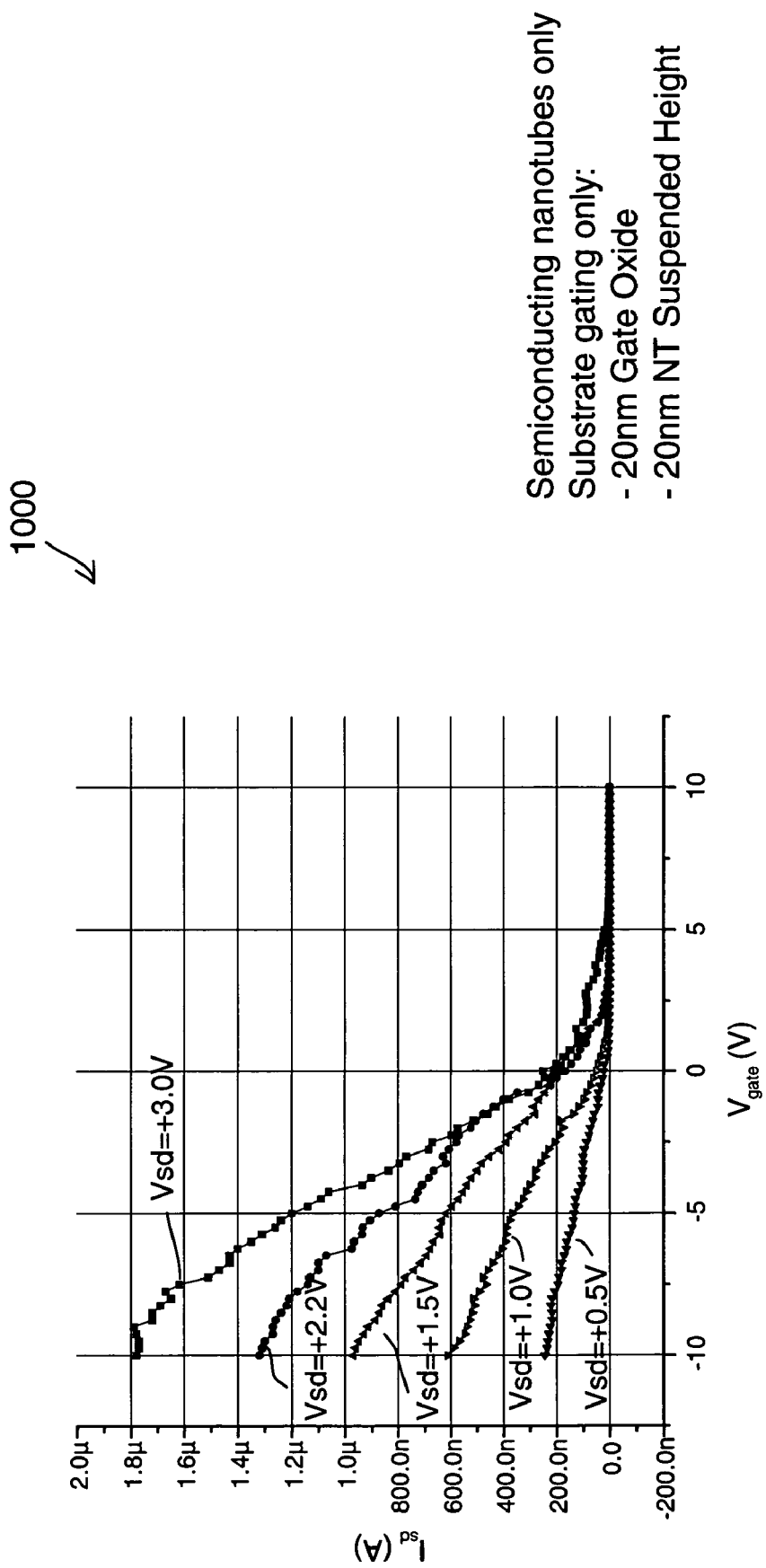
Figure 10A: Post Burn-off Integrated Patterned Semiconductor-only SWNT Nanofabric forms P- CNFETs normally ON at Vgate = 0 volts

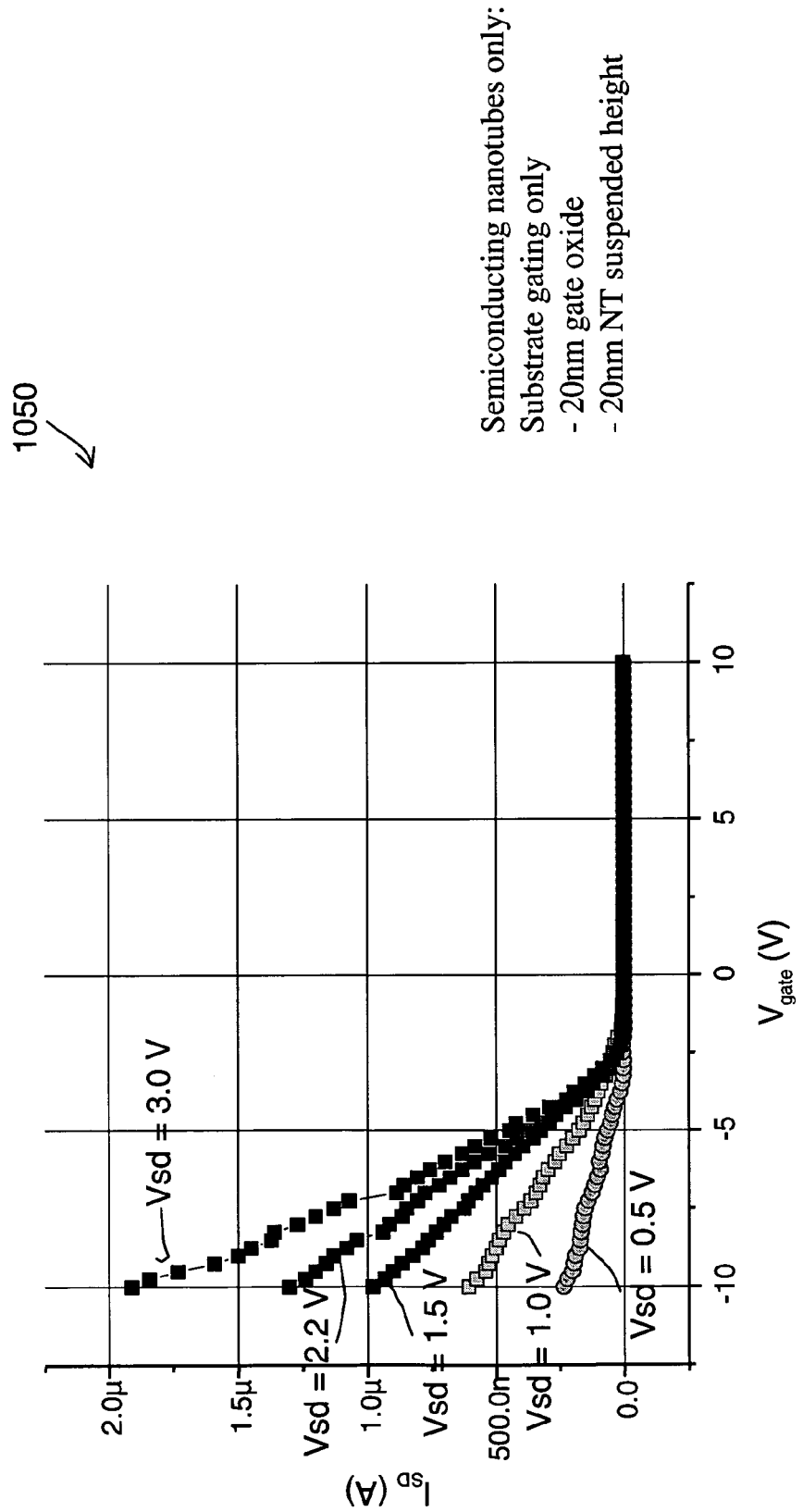
Figure 10B: Post Burn-off Integrated Patterned Semiconductor-only SWNT Nanofabric forms P- CNFETs normally OFF at Vgate = 0 volts

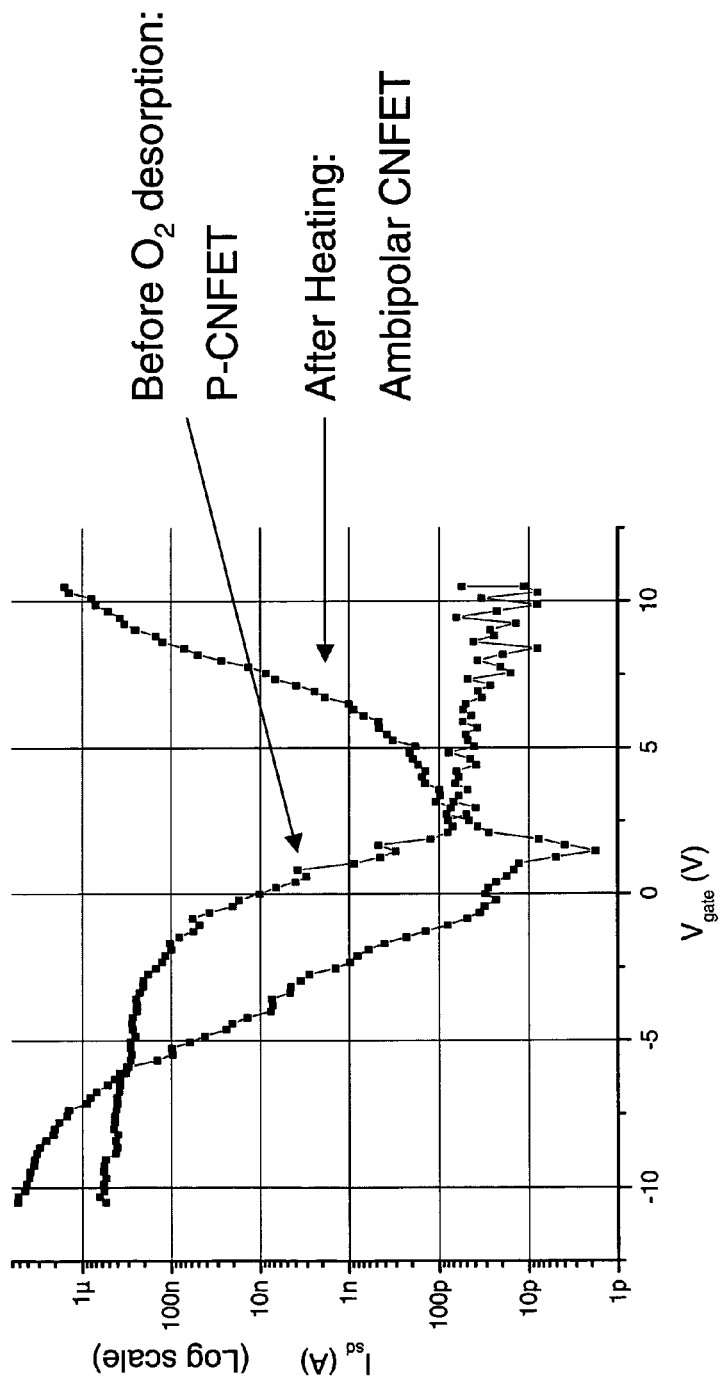
Figure 11A: Post Burn-off Integrated Patterned Semiconductor-only SWNT Nanofabric forms Ambipolar CNFETs after additional processing (heating)

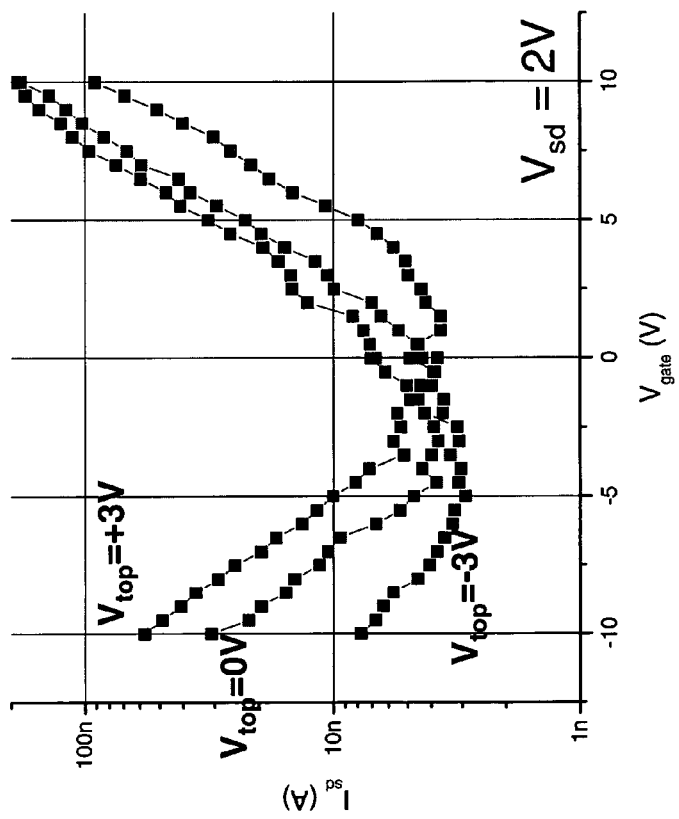
- Modulation of threshold voltage demonstrates top (upper) gate modulating the I-V characteristic
- Top-gate and bottom-gate can both be used to optimize device characteristics
Figure 11B: Post Burn-off Integrated Patterned Semiconductor-only SWNT Nanofabric Ambipolar CNFETs illustrating dual gate control

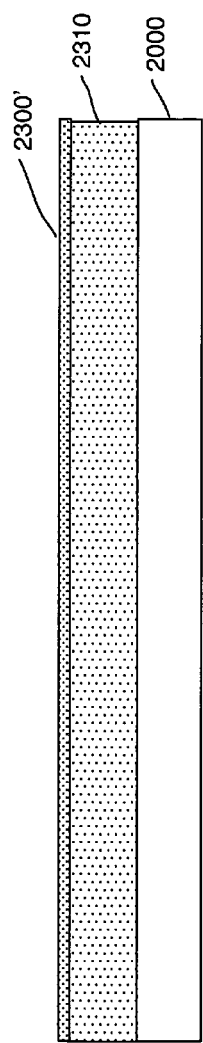
Figure 23A
Figure 23B
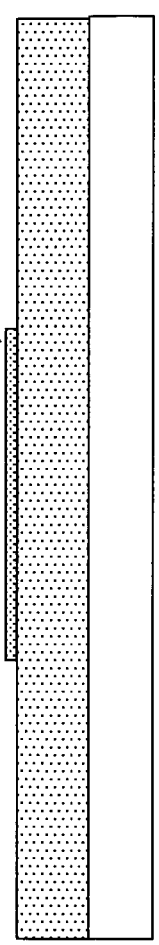
Figure 23C
Figure 23D
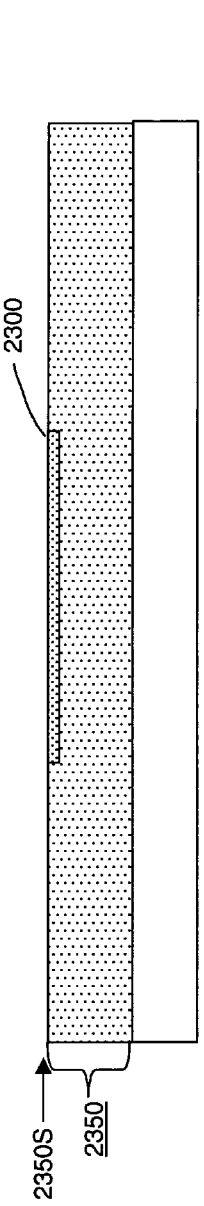

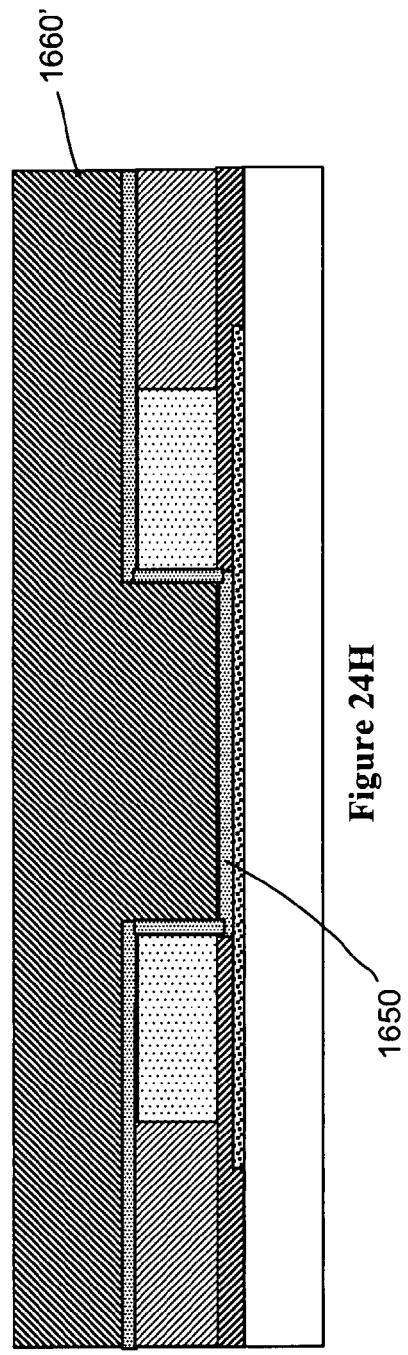
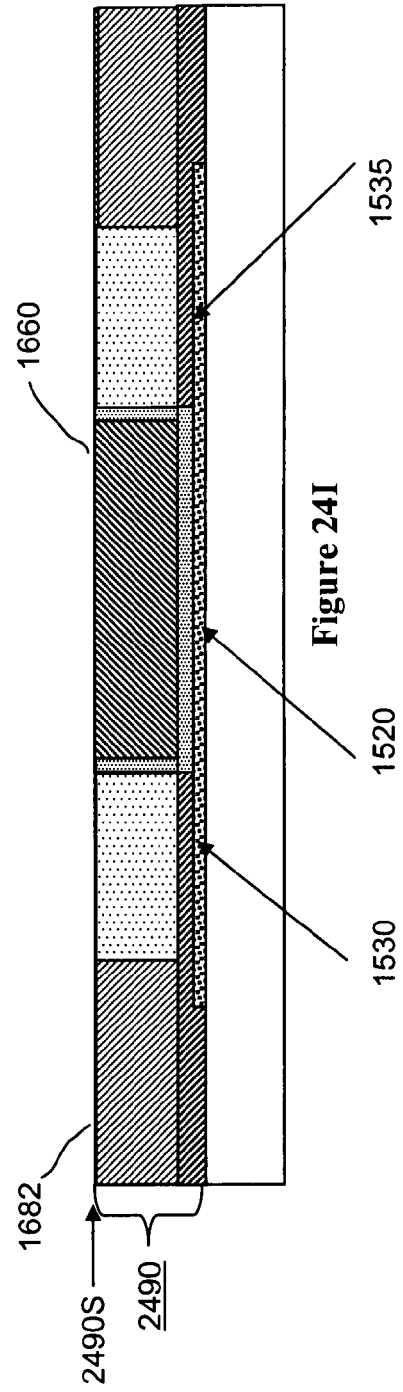
Figure 24H
Figure 24I

| Duty Cycle | Max. I/ 5 mil dia Probe (A) | Max. # cells/probe | # B-O Probes/ Chip | Total # Probes Chip | # Chips Under Burn-off | # Steppings/ Wafer |
|---|---|---|---|---|---|---|
| Steady State | 0.45 | 4,500 | 233 | 238 | 8 | 25 |
| 10% | 1.5 | 15,000 | 70 | 75 | 26 | 8 |
| 1% | 4.5 | 45,000 | 24 | 29 | 68 | 3 |

Figure 31

HYBRID CARBON NANOTUDE FET(CNFET)-FET STATIC RAM (SRAM) AND METHOD OF MAKING SAME

CROSS-REFERENCE OF RELATED CASES

This application claims the benefit under 35 U.S.C. §119 (e) of U.S. Provisional Patent Application No. 60/644,427, filed on Jan. 14, 2005, entitled *Field Effect Device Having a Channel of Carbon Nanofabric and Method of Making Same*, and U.S. Provisional Patent Application No. 60/644,641, filed on Jan. 18, 2005, entitled Hybrid Carbon Nanotubes FET (CNFET)-FET Static RAM (SRAM), the contents of which are hereby incorporated by reference in their entireties.

This application is related to U.S. patent application Ser. No. 11/332,529, filed on an even date herewith, entitled *Field Effect Device Having a Channel of Nanofabric and Methods of Making Same*, the contents of which is hereby incorporated by reference in its entirety.

BACKGROUND

1. Technical Field

This invention relates in to a field effect device having a channel of carbon nanofabric, a static random access memory (SRAM) made of such, and a method of making the same.

2. Discussion of Related Art

SRAM, both stand alone and embedded, requires increasingly dense cells with every technology generation, increased performance, and lower leakage currents. Six transistor SRAM cells may be designed for very low power operation including very low leakage currents. Six transistor SRAM cells may also be designed for high performance applications, such as cache memory, with higher leakage tolerance, but still requiring low leakage currents.

Six transistor SRAM cells comprise two NFET cell access transistors, as well as two NFET pull-down devices and two PFET pull-up (load) devices, all co-planar, and cross coupled to form a flip flop storage cell as is well known in the semiconductor industry. Stacking of load devices can reduce SRAM cell size (area) by 30 to 50%. Stacking of load devices has been used in earlier generations of SRAMs for density enhancement. For example, stacking of SRAM cell load devices using polysilicon resistors has been used to shrink cell size. However, stacked poly load resistors are no longer used in new SRAM products because of high leakage currents due to poor scalability, and because polyresistors always conduct current. Stacked thin film PFET devices were also tried in earlier SRAM generations, however, such stacked thin film PFETs are no longer used due to high leakage currents and poor scalability.

FIG. 1 illustrates a schematic of a prior art coplanar six device SRAM memory cell 100, including storage cell 110 and connections to word line WL, bit lit BL, and complimentary bit line Blb (bit line-bar). Inverter 120 comprising NFET pull-down device T2 and PFET pull-up (load) device T3, and inverter 130 comprising NFET pull-down devices T4 and P-FET pull-up device T5 are interconnected in the conventional manner ("cross coupled") to form a flip flop storage cell. Transfer devices T1 and T6 connect are connected to both inverters 120 and 130 to form memory cell 110, and also connected to array lines WL, BL and BLb, in the conventional manner. Basic SRAM cell and chip operation is described in K. Itoh, "VLSI Memory Chip Design," Springer Publishing, 2001, pp. 26-31.

SUMMARY

The invention provides hybrid carbon nanotube FET(CNFET)-FET Static RAM (SRAM) and method of making same.

Under one aspect of the invention, a static ram memory cell includes two semiconductor-type field effect transistors (FETs), and two nanotube FETs (NTFETs). Each FET has a semiconductor drain region and a semiconductor source region of a first type of semiconductor material, and each FET having a semiconductor channel region positioned between respective drain and source regions. The channel region are made of a second type of semiconductor material; each FET further has a gate node in proximity to a respective channel region so as to be able to modulate the conductivity of the channel by electrically stimulating the gate. The two semiconductor-type FETs are cross-coupled so that gate of one FET connects to the drain or source of the other. Each NTFET has a channel region made of at least one semiconductive nanotube, connected to a respective source and drain region of a corresponding NTFET. A first NTFET is connected to the drain or source of the first semiconductor-type FET and the second NTFET is connected to the drain or source of the second semiconductor-type FET.

Under another aspect of the invention, the two semiconductor-type FETs are formed in a substrate, and the two NTFETs are positioned above the two semiconductor-type FETs.

Under another aspect of the invention, the NTFETs are vertically aligned with a corresponding semiconductor-type FET.

Under another aspect of the invention, the semiconductor-type FETs is an N-type FET and the channel of the NTFET is formed of p-type nanotubes.

Under another aspect of the invention, the semiconductor-type FETs is an N-type FET and the channel of the NTFET is formed of ambipolar-type nanotubes.

Under another aspect of the invention, NTFETs also include a back control gate.

Under another aspect of the invention, an intermediate SRAM structure includes an organized and structured arrangement of SRAM cells. Each SRAM cell has two semiconductor-type field effect transistors (FETs). Each FET has a semiconductor drain region and a semiconductor source region of a first type of semiconductor material, and each FET has a semiconductor channel region positioned between respective drain and source regions. The channel region is made of a second type of semiconductor material. Each FET further has a gate node in proximity to a respective channel region so as to be able to modulate the conductivity of the channel by electrically stimulating the gate, wherein the two semiconductor-type FETs are cross-coupled so that gate of one FET connects to the drain or source of the other. The cells also include two nanotube FETs (NTFETs), each having a channel region made of nanotubes including nanotubes of semiconductive and metallic type, connected to a respective source and drain region of a corresponding NTFET. A first NTFET is connected to the drain or source of the first semiconductor-type FET and the second NTFET is connected to the drain or source of the second semiconductor-type FET. The intermediate SRAM structure further includes burn-off circuitry to electrically stimulate the channel regions of the NTFETs to fail nanotubes of metallic type while leaving at least one nanotube of semiconductor type.

Under another aspect of the invention, a method of electrically connecting two conductive or semiconductive entities vertically displaced relative to each other includes forming a void to create a pathway between the two entities, in which an upper opening of the void is in proximity to the first entity and a bottom of the void abuts the second entity. A conformal fabric of nanotubes is deposited to adhere to a top surface next to the upper opening of the void to contact the first entity, and to adhere conformally to the vertical surface of the void, and to adhere to the bottom surface of the void to contact the second entity.

BRIEF DESCRIPTION OF THE DRAWINGS

In the Drawing,

FIGS. 3A and 3A1 illustrate a cross section of a prior art PMOS FET (PFET) and I-V characteristic of a prior art NMOS FET, respectively;

FIGS. 4A, 4A1, 4B, 4B1, 4C, and 4C1 illustrate cross sections of prior art NMOS FET (NFET) and associated I-V characteristics, respectively;

FIG. 5 is a flow chart describing steps in a basic method of fabricating preferred embodiments of the invention;

FIG. 6A illustrates a single layer of spun-on nanotubes;

FIG. 6B illustrates a patterned nanofabric layer according to one aspect of the invention;

FIG. 6C illustrates highly conformal nanofabric layers;

FIGS. 7A and 7B illustrate prior art architectures;

FIG. 8A illustrates a cross section of a device according to one aspect of the invention;

FIGS. 8B, 8C, and 8D are micrographs of devices according to aspects of the invention;

FIGS. 9A and 9B illustrate I-V characteristics of devices according to aspects of the invention;

FIGS. 10A and 10B illustrate I-V characteristics of structures according to certain aspects of the invention;

FIGS. 11A and 11B illustrate I-V characteristics of structures according to certain aspects of the invention;

FIGS. 23A-D illustrate cross sectional views of structures according to aspects of the invention;

FIGS. 24A-I illustrate cross sectional views of structures according to aspects of the invention;

FIG. 31 has a table showing the current carrying capability of a probe of 5 mil tip diameter as function of duty cycle at steady state (DC).

DETAILED DESCRIPTION

Stackable, scalable, low leakage SRAM cell load devices are needed for new SRAM generations. Carbon nanotube FET (CNFET) transistors, more specifically, P-Type CNFET transistors (P-CNFETs) make excellent stackable load devices. P-CNFETs do not require a silicon substrate, are scalable, and have very low leakage currents. Research has demonstrated that a single (one) SWNT fiber spanning the distance between source and drain device regions exhibits 10× greater mobility than a PFET device, is scalable to sub-20 nm source-to-drain channel lengths, and has low OFF state leakage current. See Durkorp et al., "Extraordinary Mobility in Semiconducting Carbon Nanotubes," Nano Lett. 2004, Vol. 4 No. 135-39. In spite of high single SWNT fiber current density carrying capability, replacing PFET load devices requires multiple SWNTs spanning the distance between source and drain regions to carry the total ON state load current. Also, these multiple SWNT P-CNFET devices must be made compatible and integrated with CMOS technology used in SRAM fabrication. This includes multiple SWNT deposition, patterning at desired locations, and interconnecting with NFET devices in the SRAM cell. Since SWNTs may be semiconducting or metallic, under certain embodiments metallic SWNTs in the P-CNFET channel region spanning the distance between source and drain must be burned-off. Finally, the electrical characteristics of the CNFET devices must be optimized for operation in the voltage range required for product design.

Preferred embodiments of the present invention provide fabrication solutions and corresponding structures for the controlled placement, patterning, and integration of stacked P-CNFET devices with CMOS technology to enable the design of scalable, dense, high performance and very low power hybrid CNFET-FET SRAM memory products. Preferred embodiments of the present invention provide P-CNFETs with multiple SWNTs spanning the distance between source and drain to form the channel region of the P-CNFETs. Preferred embodiments of the present invention optimize the electrical characteristics of these P-CNFETs for high performance and low leakage. Preferred embodiments of the present invention provide a means of burning-off metallic SWNTs in the P-CNFET channel region such that only semiconducting SWNTs spanning the region between source and drain remain in the channel region. Preferred embodiments of the present invention optimize the electrical characteristics of the combined P-CNFET and FET devices and ensure operation in the voltage range required SRAM memory products, both stand alone and embedded.

Overview of SRAM Memory Cells

Figure 2A:
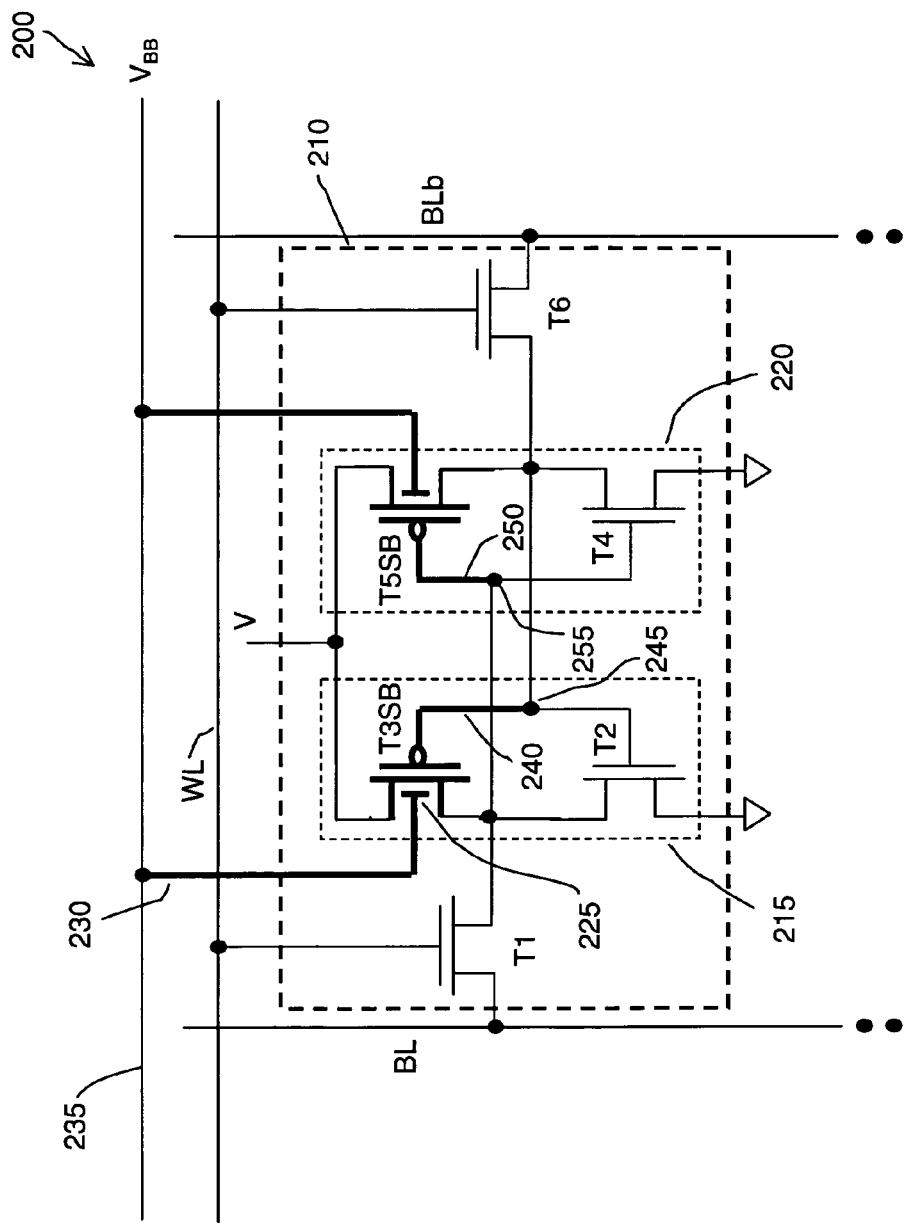
FIGS. 2A and 2B illustrate schematic drawings of memory cells according to aspects of the invention.

FIG. 2A illustrates a schematic of memory cell 200, including storage cell 210 with stacked P-CNFET load devices and connections to array lines WL, BL, and BLb. Inverter 215 in storage cell 210 replaces coplanar PFET load device T3 with stacked P-CNFET device T3SB. Inverter 220 in storage cell 210 replaces coplanar PFET load device T5 with stacked P-CNFET load device T5SB. Connections between inverters 215 and 220 with transfer devices T1 and T6, NFET pull-down devices T2 and T4, and array lines WL, BL, BLb remain the same. P-CNFET load devices T3SB and T5SB each have a back (bottom) gate 225 that electrostatically couples to the SWNTs spanning the distance between device source and drain electrodes. Back (bottom) gates 225 are connected by connection 230 to back bias connection 235, which is connected to voltage source $V_{BB}$. The gate of transistor T3SB is connected to node 245 by connection 240, which may be a NT fabric (nanofabric) connection, as explained further below. The gate of transistor T5SB is connected to node 255 by connection 250, which may be a nanofabric connection as explained further below.

Figure 2B:
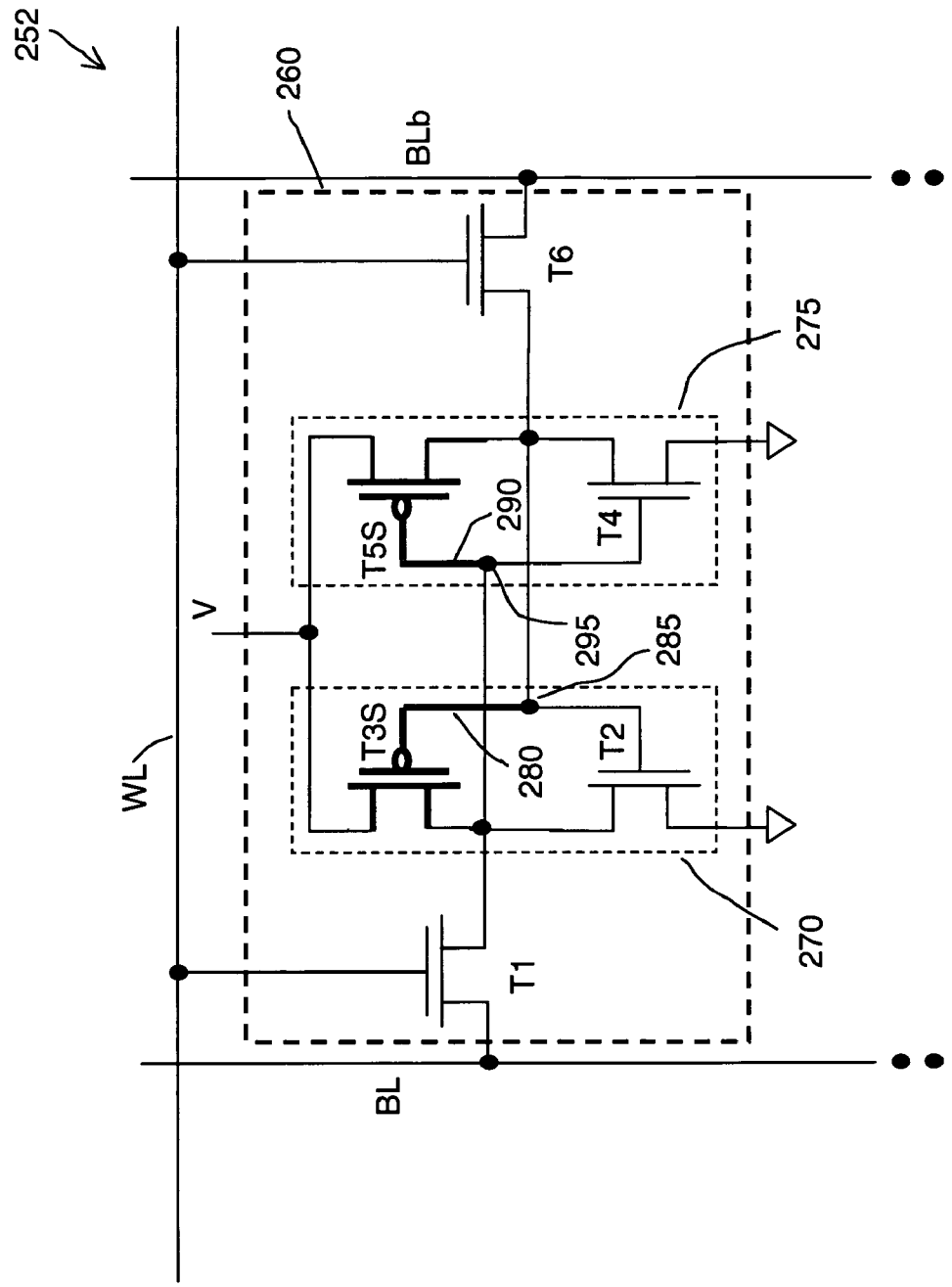

FIG. 2B illustrates a schematic of memory cell 252, including storage cell 260 with stacked P-CNFET load devices and connections to array lines WL, BL, and BLb. Inverter 270 in storage cell 260 replaces coplanar PFET load device T3 with stacked P-CNFET device T3S. Inverter 275 in storage cell 260 replaces coplanar PFET load device T5 with stacked P-CNFET load device T5S. Connections between inverters 270 and 275 with transfer devices T1 and T6, NFET pull-down devices T2 and array lines WL, BL, BLb remain the same. P-CNFET load devices T3S and T5S do not have a back (bottom) gate 225 that electrostatically couples to the SWNTs spanning the distance between device source and drain electrodes, therefore the electrical characteristics of P-CNFET devices T3S and T5S are determined by chemical means (doping, annealing, and other methods). Further description of memory cell 252 is found further below. The gate of transistor T3S is connected to node 285 by connection 280, which may be a NT fabric (nanofabric) connection, as explained further below. The gate of transistor T5S is connected to node 295 by connection 290, which may be a nanofabric connection as explained further below.

Prior Art Single-Gate and Dual-Gate FET Device Operation and Characteristics

Historically, the electrical properties of FETs, NFETs and PFETs, have been controlled by chemical means only (doping concentrations, annealing steps, and other means), or by chemical and electrostatic means, using charge coupling between the semiconductor substrate and the FET device channel region, to set threshold voltage and optimize device electrical (I-V) characteristics. Similarly, the electrical properties of CNFETs, including P-CNFETs, can also be controlled by chemical means, or by chemical and electrostatic means. Illustrations of P-CNFET devices and structures accommodating both chemical and electrostatic means of optimizing electrical characteristics are illustrated further below. Illustrations of P-CNFET devices and structures with electrical characteristics optimized by chemical means only are also illustrated below. In all cases, burn-off means are incorporated in the device structure to eliminate metallic SWNTs in the P-CNFET device channel region between source and drain as illustrated further below.

Figure 1:
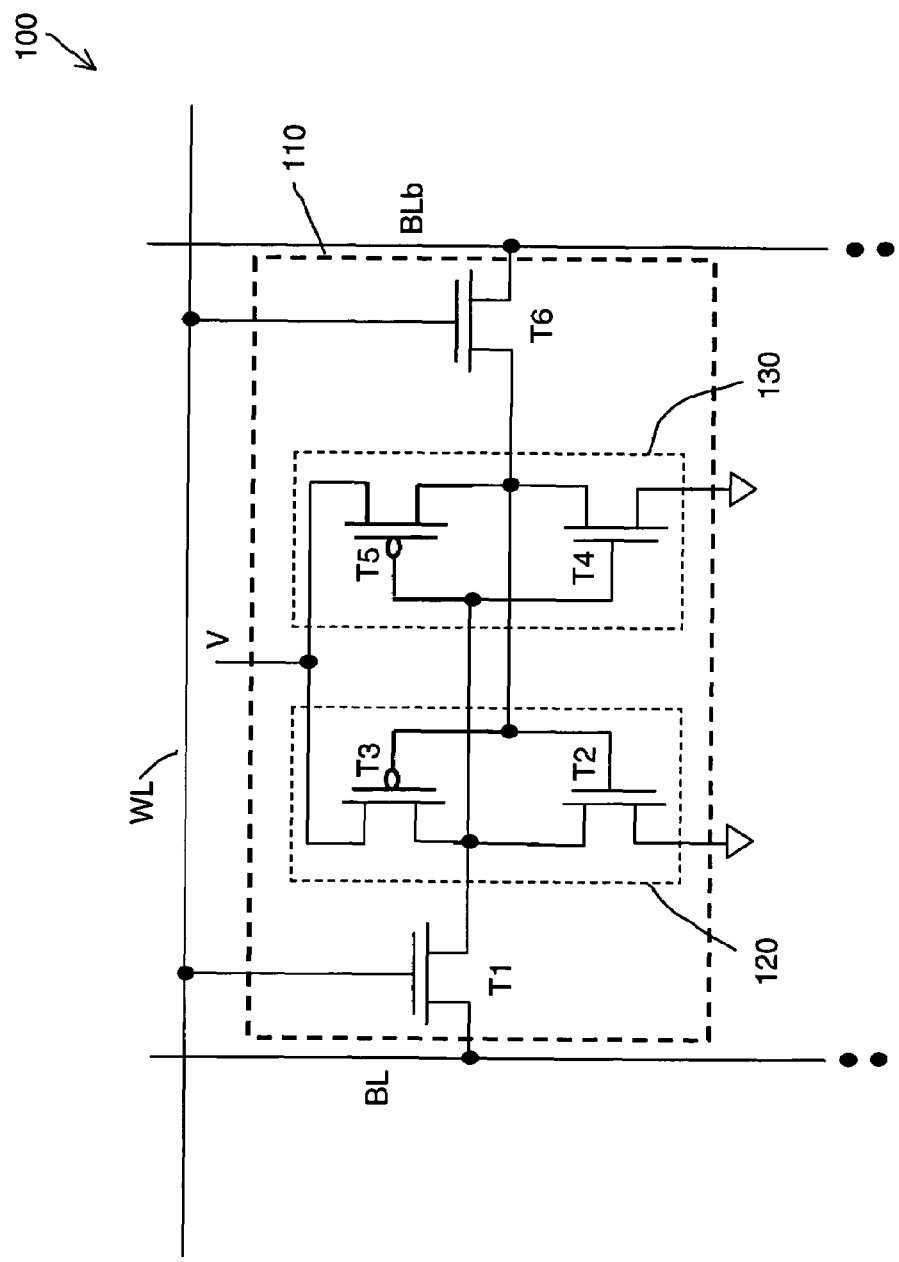
FIG. 1 illustrates a schematic of a prior art device.

In the mid to late 1960's, PMOS-based products with non-self-aligned aluminum gates became available. PMOS had the advantage that when fabricated the devices were in the normally OFF state, with no channel between the P+ source—drain regions. PMOS devices had negative threshold voltages and operated between ground and minus $V_{DD}$ ($-V_{DD}$). Threshold voltages were high, $-5$ volts for example, and $V_{DD}$ applied voltages were in the $-12$ to $-20$ V range. Also, the mobility was 2.5 to 3× lower than NMOS mobility. Threshold voltages were reduced with PMOS device scaling. The difference in mobility between PMOS and NMOS devices remain due to the relative mobility of p-type and n-type carriers in the FET channel region. Prior art PMOS device 300 is illustrated in FIG. 3A. Device 300 is an example of a PMOS device having an N substrate 308 (or N well) a depletion region 310, source 302, gate 304 and drain 306. FIG. 3A1 is a typical Early NMOS device characteristic I-V curve.

There was strong interest in using N-type FETs because of much lower NMOS channel resistance for the same geometries due to the superior electron mobility, 2.5 to 3× higher than PFET hole mobility. Bipolar circuits (TTL) were operating at positive 5 volts power supply so there was strong interest in FET products operating with positive 5 volt power supply for ease of mixing new FET-based products with the existing bipolar technology. A major problem was that NMOS devices were in the ON state as fabricated. Positive ions both fixed and mobile, combined with the work function of the aluminum gate and p-substrate doping, plus defects in the Si/SiO$_2$ interface made it impossible to find a fabrication-only solution to the fabricated normally-ON NMOS problem (it took well over 10 years to find a fabrication-only solution). Products designers needed a way to use normally-ON NMOS FETs or remain with an inferior P-type FET technology. The NFET problem of these prior art devices is described in the text book by J. Millman & C. Halkias, "Integrated Electronics: Analog and Digital Circuits and Systems," McGraw-Hill Book Company, 1972, pages 322-328.

Prior art FIG. 4A illustrates an early NMOS structure 400 having a P substrate 408 (or P well) a depletion region 410, source 402, gate 404, drain 406 and inverted channel 412. Prior art FIG. 4A shows the cross section of early NMOS devices normally ON as fabricated and associated I-V characteristics in FIG. 4A1, with the NMOS having a negative threshold voltage. Prior art FIG. 4B illustrates an early NMOS structure 414 having a P substrate 408, an N channel 418 and a depletion region 416. Prior art FIG. 4B cross section and associated FIG. 4B1 show the operation of the device using a signal VSIG applied between source S and gate G. (Undesirable operating range 409 is as shown in FIG. 4B1) The gate to source voltage must be negative to modulate the channel region by creating a depletion region between the channel and the surface (Si—SiO$_2$ interface). This method of operation could not meet the requirement of operating voltages in the zero to $V_{DD}$ range, with a positive threshold voltage. FIG. 4C illustrates prior art structure 420 having a P substrate 408, depletion region 416 and N Channel 422. Prior art FIG. 4C cross section and associated FIG. 4C1 I-V characteristics shows the effect of introducing a substrate bias voltage $V_{BIAS}$ that is used to electrostatically alter the electrical properties of the channel region 422. Using the substrate as common back-gate biased negative with respect to NFET source diffusions, the normally-ON FET channel resulting from process-only fabrication techniques was turned OFF and NFET threshold voltage was set using electrostatic coupling in the depletion region between the substrate region and the channel region. The electrical I-V characteristic of FIG. 4B1 was translated to the electrical characteristic shown in FIG. 4C1 using $V_{BIAS}$ (desirable operating region 424 as illustrated). The NFET gate 404 voltage operating range for NFET product design was in the 0 to 5 volt range (5 volt power supply compatible), achieved using a combination of process (chemical) means and electrostatic (electrical) means as illustrated in prior art FIG. 4C.

While illustrated using NFET device characteristics, electrostatic channel region control applies to both NFET and PFET device types. These same principles are applied to P-CNFETs in this invention.

Integrating SWNTs and CMOS Processes

FIG. 5 describes a basic method 500 of fabricating preferred embodiments of the invention. The following paragraphs describe methods with respect to fabricating certain exemplary carbon nanotube FET (CNFET) device structures where semiconducting SWNTs form a channel region for CNFET devices, replacing silicon substrates used for conventional FET devices.

In general, preferred methods form 510 pre-nanotube integration structures created using known techniques and thus is not described here. Under preferred embodiments, pre-NT integration structures contain all CMOS devices, including NFET memory cell devices, and a subset of local interconnections required to build an SRAM product as illustrated further below. A surface layer is prepared for deposition of a non-woven matted carbon nanotubes referred to as a nanofabric layer as illustrated further below. The surface layer planarity is not critical because the nanofabric layer is conformal.

Next, preferred methods 520 form a layer (monolayer) of matted carbon nanotubes 600 illustrated in FIG. 6A referred to as a nanofabric layer. This may be done with spin-on technique or other appropriate technique as described in U.S. Pat. Nos. 6,574,130, 6,643,165, 6,706,402, 6,784,028, 6,835,591, 6,911,682, 6,919,592, 6,924,538 and 6,942,921; and U.S. patent application Ser. Nos. 10/341,005, 10/341,054, 10/341,055, 10/341,130, 10/774,682, 10/776,059, 10/860,334, 10/860,433, 10/864,186, 11/007,752, 11/010,491 and 11/304,315, the contents of which are hereby incorporated by reference in their entireties (hereinafter and hereinbefore, the "incorporated patent references"). FIG. 6A illustrates a single layer of spun-on nanotubes.

Multiple layers of nanotubes may be spun-on. Nanofabric layer thickness is typically in the range of 0.5 to 5 nm for SWNT layers, and 5 to 20 nm thick for MWNT layers. The resistivity of the spun-on nanotubes may be controlled in the range of 500 to 10,000 ohms per square, for example, as measured by four-point probe measurements. The nanotube layer consists of non-woven metallic and semiconducting SWNT fibers as described in the above references. Burn-off measurements of deposited fibers described further below indicate a typical mix of 2 semiconducting SWNTs for every 1 metallic SWNT. For CNFET devices of preferred embodiments, metallic SWNTs are burned-off in the channel region as described further below. Such burn-off techniques while suitable for the devices described herein may be obviated through a variety of other means, primarily through the use of solely semiconducting SWNTs. The inventors have foreseen that purified semiconducting SWNTs as well as purified metallic nanotubes may be available for bulk usage and would become a preferred embodiment for a CNFET. Such semiconducting SWNTs would make the process of doping to generate n- or p-type semiconducting SWNTs substantively more facile as can be seen by those skilled in the art.

At this point in the process, a metallic contact layer may be deposited on the nanotube fabric layer. The contact layer may be patterned and act as a masking layer for etching the nanotube nanofabric layer. This method is described in U.S. patent application Ser. No. 10/864,186 entitled, "Non-volatile Electromechanical Field Effect Devices and Circuits using same and Methods of Forming Same." Alternatively, the nanotube layer may be patterned first as illustrated in method 500, FIG. 5, followed by contacts to the patterned nanotube layer.

Next, preferred methods 530 apply a photo or e-beam sensitive resist layer, for example, using well known industry techniques.

Next, preferred methods 540 expose and develop the resist layer in a desired pattern using a masking layer and optical exposure, or direct-write e-beam, or other suitable means following standard industry practices.

Next, preferred methods 550 etch the nanofabric layer defining the desired pattern using industry standard techniques. Ashing may be used, for example.

Next, preferred methods 560 strip (remove) the resist using an industry standard solvent. The resulting patterned nanofabric layer 602 is illustrated in FIG. 6B. The nanofabric layer illustrated in FIG. 6B is planar and is used to define planar CNFET devices as shown further below. However, nanofabric layers 604 are highly conformal, as illustrated in FIG. 6C, display excellent edge coverage, and may be used for interconnections as well as devices. Although not shown in this invention, the conformal properties of nanofabrics may be used to fabricate CNFET devices with a vertical orientation, with channel lengths defined by the insulator step 605 illustrated in FIG. 6C, for example.

Next, preferred methods 570 complete the integration of the device as explained further below.

Nanofabric Metallic SWNT Burn-Off and Resulting CNFET Electrical Characteristics U.S. Pat. No. 6,141,245, U.S. Pat. No. 6,219,215, and U.S. Pat. No. 6,243,283 by C. Bertin et al. illustrate conductor burn-off in selected portions of a patterned conductive layer. A gap is introduced below a portion of the patterned conductive layer as illustrated by structure 606 in prior art FIG. 7A, or below and above a portion of the patterned conductive layer as illustrated by structure 620 in prior art FIG. 7B. The gap substantially reduces thermal flow between the patterned conductor layer and a thermal sink such a silicon substrate layer, a portion of the conductor in the gap region is vaporized when current is passed through the patterned conducting layer, and the conducting path is interrupted as explained in U.S. Pat. Nos. 6,141,245, 6,219,215, and 6,243,283.

FIG. 7A illustrates prior art structure 606 having a first insulating layer 608, gap regions 610, a silicon substrate 612, a second insulator region 614, a third insulator region 616 and a conducting metal layer 618. FIG. 7B illustrates prior art structure 620 having a first insulating layer 608, gap regions 610', a silicon substrate 612, a second insulator region 614, a third insulator region 616 and a conducting metal layer 618. Gap region 610' may be above and below conductor 618 for additional thermal isolation.

The prior art technique illustrated in FIGS. 7A-B may be adapted to eliminate metallic SWNTs in the channel region of a CNFET device formed using the patterned nanofabric illustrated in FIG. 6B. This was confirmed experimentally as described further below. Nanofabric width $W_{NT-LAYER}$ may vary from 200 to 300 nm to dimensions as small as less than 20 nm, for example. Nanofabric line-to-line spacing $W_{NT-NT\ SPACING}$ may vary from 200 to 300 nm to dimensions as small as less than 20 nm, for example. SWNTs in the channel region span the region between source and drain regions, which may be separated by a spacing in the range of 200 to 300 nm, to a spacing smaller than 20 nm, for example. Source and drain regions are formed when a conductor such as palladium, titanium, tungsten, or other conductor material, contact individual SWNTs as illustrated further below.

FIGS. 8A-D illustrates a structure 800 having integrated SWNT nanofabric with air dielectric; structure 800 having a source contact 802, a front (top) gate 804, a drain contact 806, a gap 808, a nanotube channel 810, a first insulator 814 and a second insulator 812, a bottom (back) gate 816 and a second gap 818. (FIGS. 8B-D are micrographs of exemplary devices fabricated using semiconductor processing steps, including a semiconductor process-compatible patterned nanofabric layer; configurations other than those illustrated in the micrographs are contemplated by the inventors.) FIGS. 8A-D illustrate a structure fabricated on a silicon substrate used as a bottom(back) gate, with insulator 814 of about 20 nm thickness, and a gap between insulator 814 and the NT channel of approximately 20 nm. Source and drain contacts to the SWNTs forming the NT channel region may be formed using Ti, Pd, W, combinations of these and other metals such as aluminum, copper, and other conductors. The NT channel suspended length may be in the range of 200 to 300 nm, for example. SWNT fibers in the patterned nanofabric layer of FIGS. 6A and 6B are typically in the range of 1 to 4 um in length, for example. Thus, the conductive layer between source and drain contacts consists of suspended semiconducting and metallic SWNTs. More specifically, experiments were carried out with fully suspended and partially suspended semiconducting and metallic SWNTs between source and drain contacts. In the case of fully suspended SWNTs, semiconducting and metallic SWNTs were only in contact with the source and drain electrodes. In the case of partially suspended SWNTs semiconducting and metallic SWNTs were in contact with source and drain electrodes, with SWNTs suspended in the vicinity of source and drain regions, but in physical contact with a portion of an underlying dielectric layer. Both types of devices exhibited similar electrical characteristics. The structure illustrated in FIG. 8A also has a front (top) gate 804 separated from the NT channel by a gap in the range of 30 to 60 nm. Structures similar to those illustrated in FIG. 8A are described in more detail in U.S. patent application Ser. No. 10/864,186 entitled, "Non-volatile Electromechanical Field Effect Devices and Circuits using same and Methods of Forming Same" and 60/543,497 entitled "EEPROMS using Carbon Nanotubes," both of which are incorporated by reference in their entireties and are commonly assigned to the assignee of the present invention. There is a gap region above and below the metallic SWNTs as illustrated in prior art FIG. 7B.

FIGS. 9A-B illustrate burn-off of the metallic SWNTs. First, the semiconducting SWNTs are turned off using the bottom (back) gate silicon substrate. These SWNTs are p-type because exposure of SWNTs to oxygen results in the adsorption of oxygen atoms on the surface of the nanotubes. The prior art concept of using a back gate electrostatic coupling to turn OFF the semiconductor channel region (explained above with respect to FIGS. 3 and 4) is applied to the NT-channel region turning SWNTs OFF, such that only the metallic SWNTs conduct, forming a porous patterned SWNT conductor layer.

FIG. 9A, top curve, illustrates the conduction of the channel region as the voltage $V_{GATE}$ is swept from −10 to +10 volts with a drain to source voltage of 2 volts. The voltage range is relatively high because the oxide and gap thicknesses are relatively high. The voltages can be scaled to smaller values by scaling gap and oxide values. In the presence of both metallic and semiconducting SWNTs in parallel, the $I_{ON}/I_{OFF}$ current ratio is very small, approximately 1.5 times, for example. A back bias voltage is applied turning OFF the semiconducting SWNTs, and current is forced through the metallic SWNTs in the channel region. FIG. 9B illustrates current flow to nearly 35 uA, at which point nanotubes fail (become open-circuited) and are eliminated from the conductive path. The source-drain voltage $V_{SD}$ increases to up to 8 volts before metallic SWNTs are open, with a maximum total current is approximately 35 uA. The maximum burn-off current per metallic SWNT is estimated as 10 to 20 uA. The current may be applied in steady state (DC) mode or may be a series of pulses. FIG. 9A, bottom curve, of $I_{SD}$ VS. $V_{GATE}$ illustrates P-CNFET behavior with an $I_{ON}/I_{OFF}$ ratio>$10^5$ times, confirming that only semiconducting SWNTs remain in the channel region. In other words, a non-woven SWNT nanofabric layer may be deposited (spun-on, for example), patterned, a CNFET device region defined, and metallic SWNTs burned-off, resulting in a P-CNFET device with a channel region formed by one or more semiconducting SWNTs spanning the space between source and drain regions.

Once metallic SWNT burn-off is complete, P-CNFET devices remain. These devices may be left as P-CNFETs, or may be converted by chemical processes to Ambipolar CNFETs and/or N-CNFETs. For this hybrid SRAM invention, stacked P-CNFETs are integrated into CMOS structures to form stacked low leakage P-CNFET load devices in SRAM cell regions as illustrated further below.

FIG. 11A illustrates the conversion of a P-CNFET shown in FIG. 8A to an Ambipolar-CNFET using the desorption of oxygen illustrating the role of oxygen adsorption in forming P-CNFET devices. Various I-V characteristics described above used bottom (back) gate electrostatic channel region modulation. FIG. 11B illustrates that the top gate, in addition to the back (bottom) gate, can also be used to control the I-V characteristic in the channel region. The top gate voltages are relatively large because of the large spacing and air "dielectric," however, scaling of geometries and introduction of dielectric layers during integration with CMOS will significantly reduce voltage levels to the 1 to 3 volts range of operation.

SRAM Cell Structures Using Stacked P-CNFET Load Devices with Back (Bottom) Gate Structures Stacked (non-coplanar) P-CNFET pull-up (load) devices are positioned in layers above NFET devices embedded in a semiconductor substrate. These devices may use a back (bottom) gate to turn off semiconductor SWNTs in the channel region during burn-off of metallic SWNTs. After metallic SWNT burn-off is complete, back gates may also be used to set (control) P-CNFET electrical properties of semiconductor SWNTs using electrostatic coupling to the channel region, while top (front) gates are connected to NFET devices to complete the SRAM storage cell configuration. Storage cell 210 in FIG. 2A shows a schematic diagram of stacked P-CNFET devices with bottom gates, NFET devices, and interconnections to form the SRAM cell.

Figure 12:
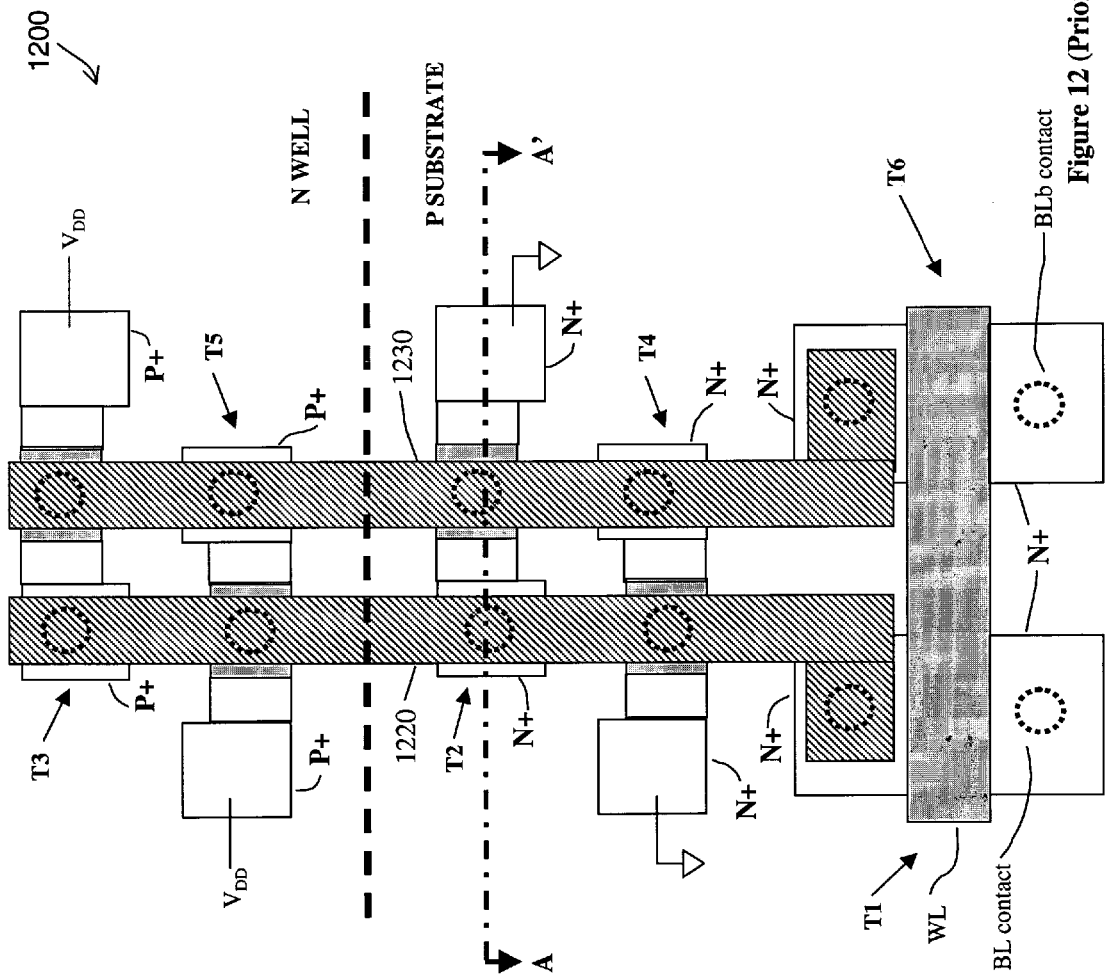
FIG. 12 illustrates a plan view of a prior art cell layout.

FIG. 12 illustrates a plan view 1200 of a prior art cell layout corresponding to prior art schematic 100 illustrated in FIG. 1. Coplanar transistors T1-T6 in plan view 1200 corresponds to transistors T1-T6 in schematic 100. Bit line connections to T1 and T6 are shown, but bit lines orthogonal to the word line WL are not shown so as to not increase plan view complexity. Local wiring 1220 interconnects FET T1 diffusion with the diffusions of FETs T2 and T3, and gates of FETs T4 and T5, corresponding to interconnections shown in schematic 100. Local wiring 1230 interconnects FET T6 diffusion with the diffusions of FETs T4 and T5, and the gates of FETs T2 and T3, corresponding to interconnections shown in schematic 100. Transistors T1 and T6 are transfer devices that write (set the memory to a "1" state or "0" state) or read the memory state of the cell. FETs T1 and T6 are typically 2.5× wider than NFETs T2 and T6 (assuming the same channel length for transistors T1, T2, T4, and T6) such that in the write mode, transistors T1 and T6 can force a change in the stored state held by the flip flop formed by "cross coupled" inverters 120 and 130. Plan view 1200 is one example of an SRAM memory cell configuration. Other cell memory layouts (plan views) may be used, however, FET devices and their interconnections all correspond to schematic 100.

The coplanar PFET load devices are placed in an NWELL region, and NFET devices are placed in a P substrate region. Layout ground rules require separation between the P+ diffusions of PFET devices and the P substrate region, and separation between the N+ diffusions of NFET devices and the NWELL region results in a larger cell area and complicates scaling of cell size as technology dimensions shrink. Substituting stacked P-CNFET load devices above the NFET devices in the cell region can reduce cell area by 30 to 50% by eliminating the coplanar PFET devices and the corresponding NWELL region.

Figure 13:
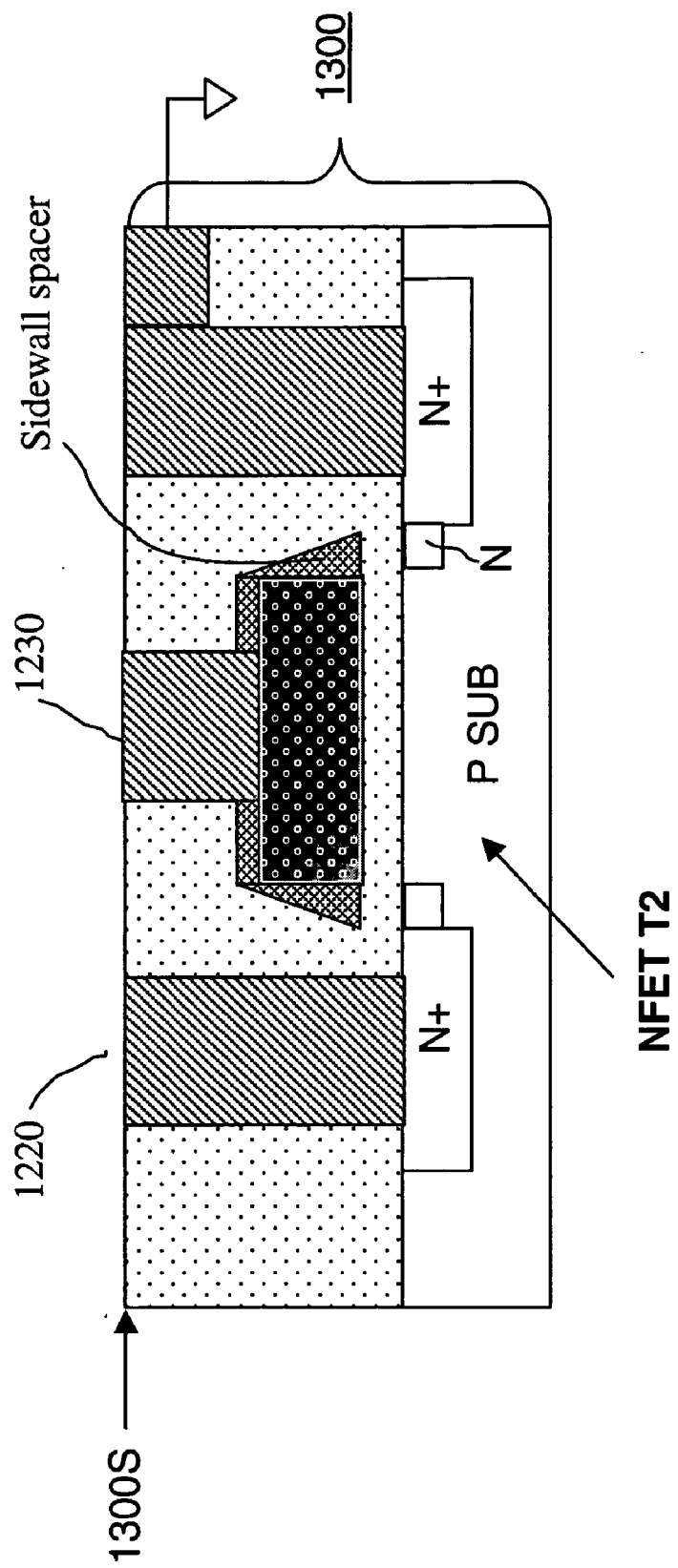
FIG. 13 illustrates cross section of a prior art structure.

FIG. 13 illustrates prior art bottom structure cross section 1300 with corresponding surface 1300S, where structure 1300 illustrates cross section AA' of structure 1200. Structure 1300 is fabricated using conventional semiconductor processing well known in the industry. Cross section 1300 shows gate, source, and drain regions of NFET device T2, along with cross sections of local interconnect wiring 1220 and 1230. The source of NFET T2 is grounded.

Burn-Off Back Gate Structures with Suspended SWNTs and Gap

Figure 14:
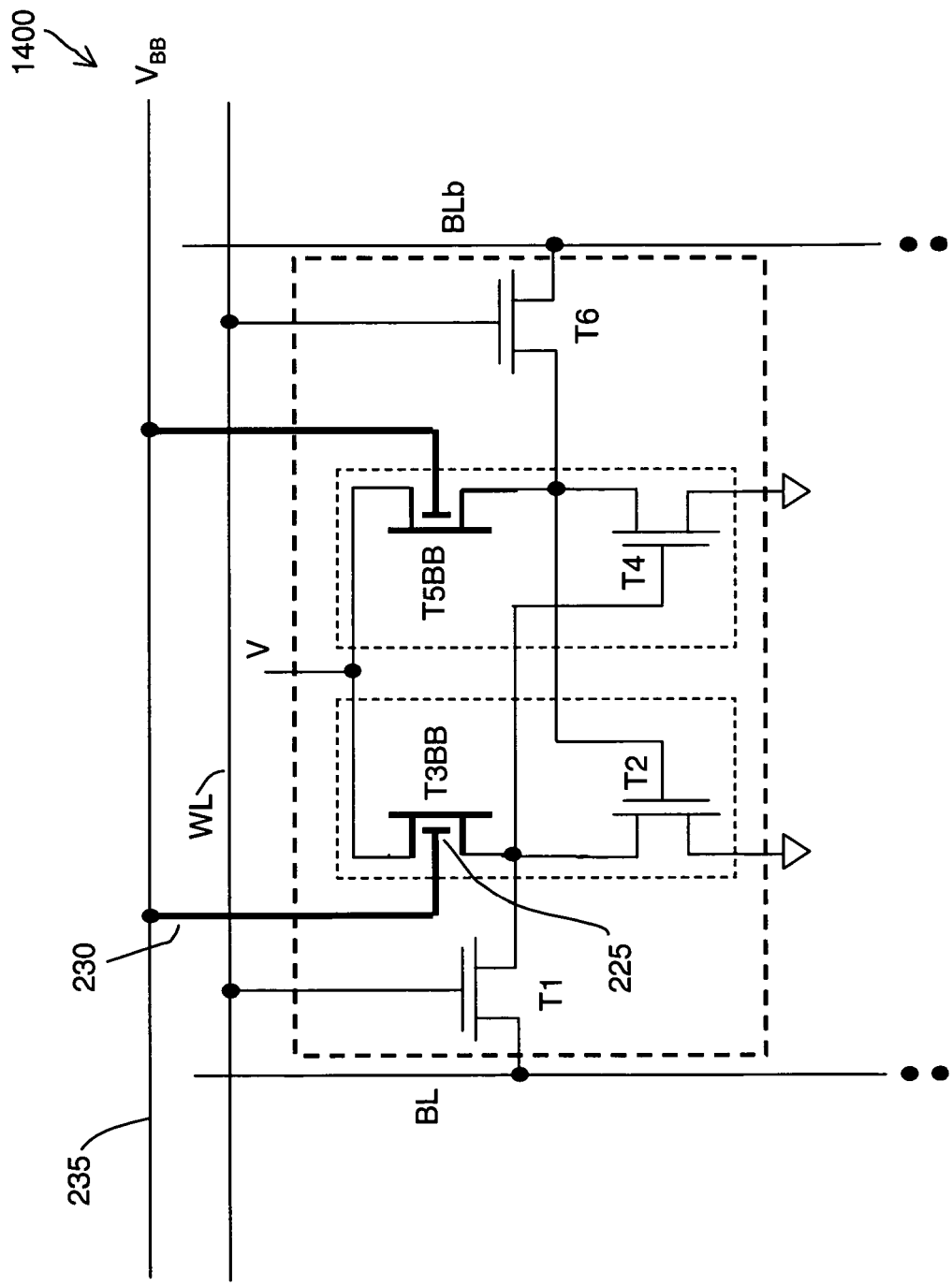
FIG. 14 illustrates a schematic diagram of a structure according to one aspect of the invention.

FIG. 14 is an illustration of schematic 1400 of a cell with fully integrated NFET devices, and partially fabricated stacked load devices T3BB and T5BB with back (bottom) gates 225. The channel regions of devices T3BB and T5BB contain both metallic and semiconducting SWNTs spanning the entire separation between source and drain regions. Gates 225 are wired to back bias control line 235 using connections 230 as described with respect to schematic 200 of FIG. 2A. T3BB front (top) gate and connection 240 to node 245, as well as T5BB front gate and connections 250 to node 255, are omitted and are added after metallic SWNT burn-off has been completed, as illustrated in FIG. 9.

Figure 15A:
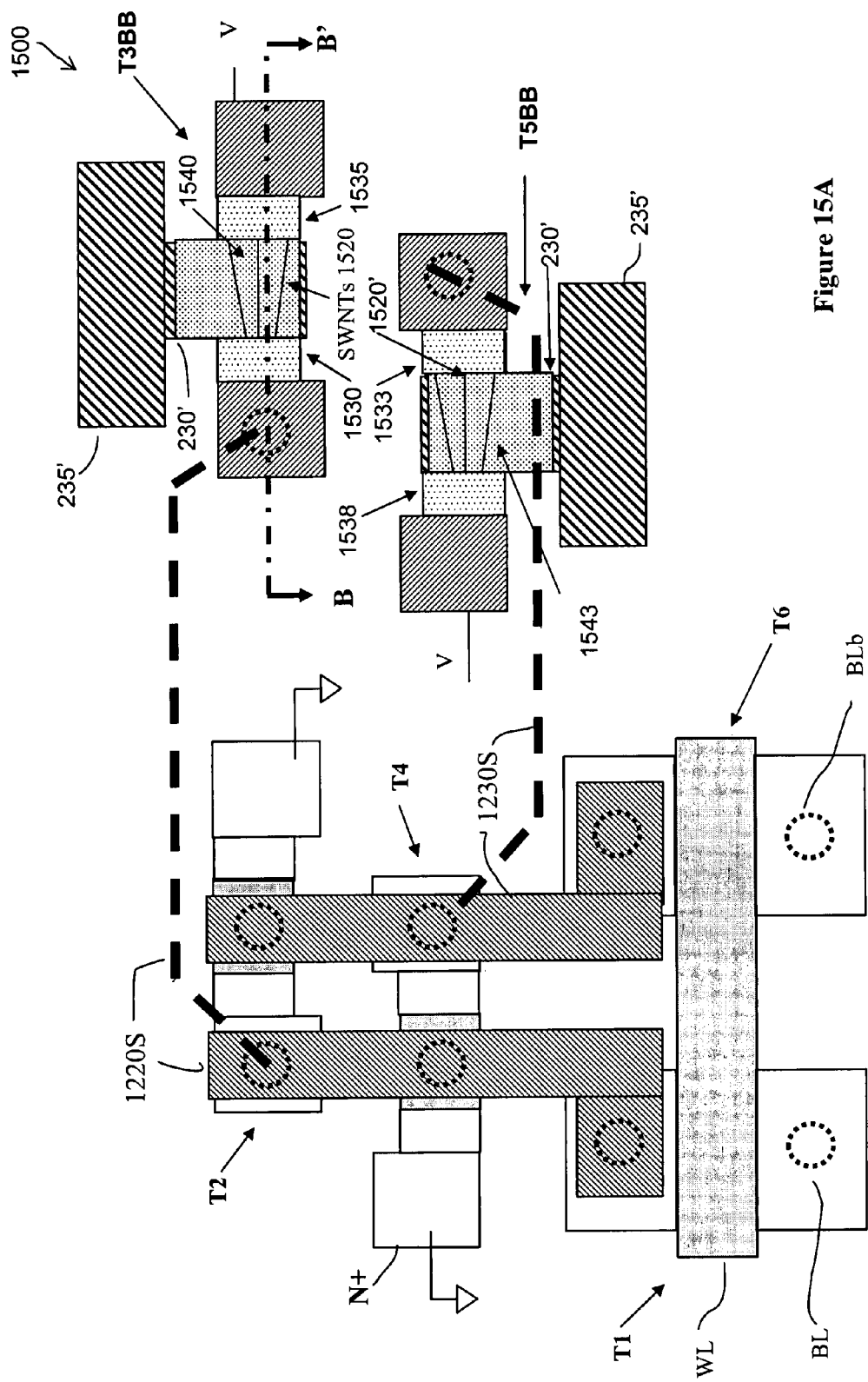
FIG. 15A illustrates a cell layout according to one aspect of the invention.
Figure 15B:
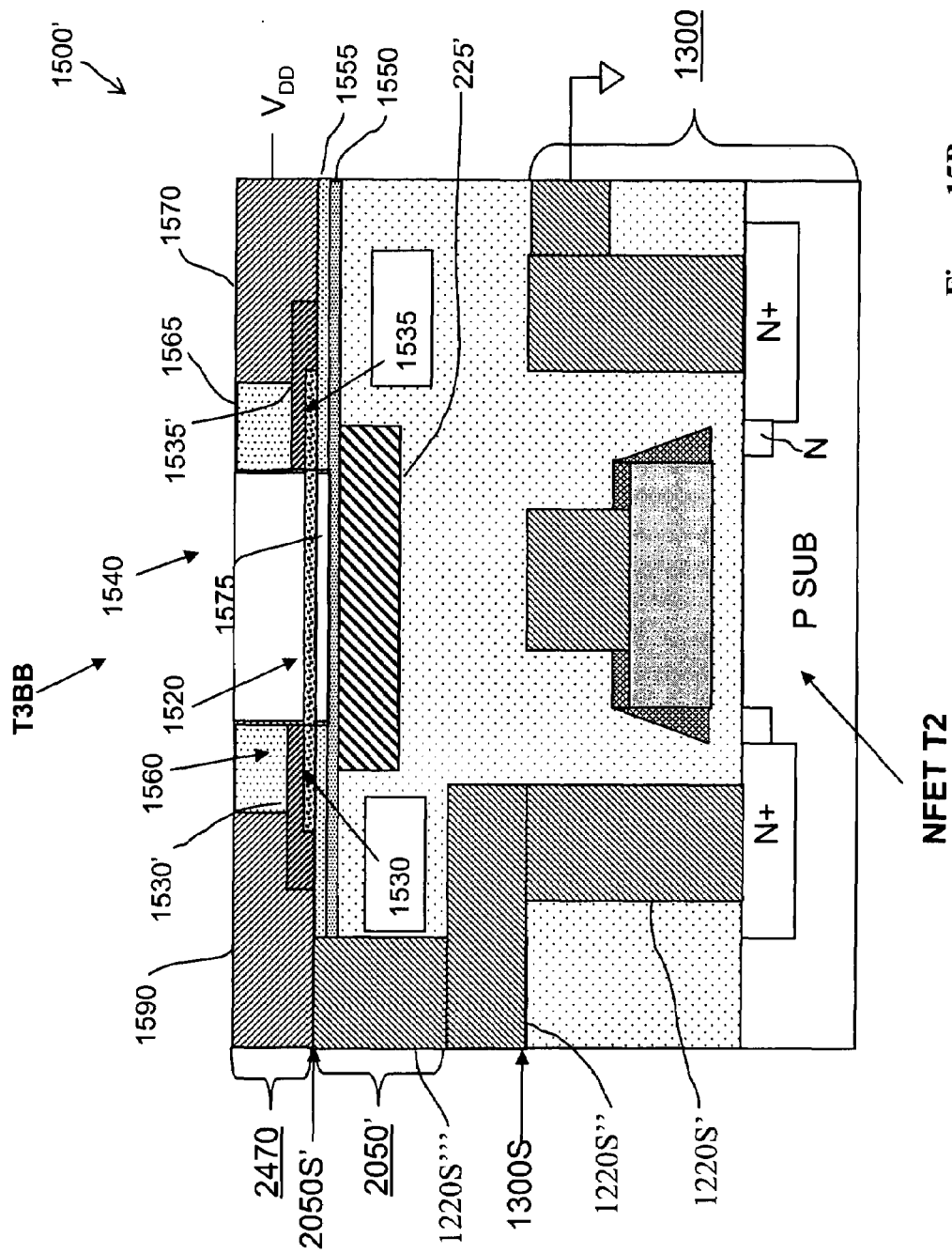
FIGS. 15B and 15C illustrate intermediate structures according to aspects of the invention.

FIG. 15A illustrates plan view 1500 of schematic 1400. FIG. 15B illustrates a cross section structure 1500' corresponding to cross section BB'. NFETs T1, T2, T4, and T6 are fully fabricated and interconnected with local wiring. Devices T3BB and T5BB are stacked over the NFETs as shown further below. T3BB includes channel region 1540 having a back gate 225' corresponding to back gate 225 in schematic 1400 with insulating and gap regions described further below, and a plurality of individual metallic and semiconducting SWNT fibers 1520 spanning the distance between source1535 and drain 1530. Back gate 225' is connected to back bias control line 235' (corresponds to line 235 in schematic 1400) by connection 230' (corresponds to line 230 in schematic 1400). The diffusion of transfer NFET T1 is connected to the drain of NFET T2, the gate of NFET T4, and the drain 1530 of stacked device T3BB by local wiring 1220S. Sources 1535 and 1538 are connected to power supply V. T5BB includes channel region 1543 having a back gate 225' corresponding to back gate 225 in schematic 1400 with insulating and gap regions described further below, and a plurality of individual metallic and semiconducting SWNT fibers 1520' spanning the distance between drain 1533 and source 1538. Back gate 225' is connected to back bias control line 235' (corresponds to line 235 in schematic 1400) by connection 230' (corresponds to line 230 in schematic 1400). The diffusion of transfer NFET T6 is connected to the drain of NFET T4, the gate of NFET T2, and the drain 1533 of stacked device T5BB by local wiring 1230S.

FIG. 15B illustrates a cross section structure 1500' corresponding to cross section BB' shown in plan view 1500, FIG. 15A. FIG. 15B includes bottom structure1300 formed using well known semiconductor fabrication techniques and shows NFET T2 in the cell region, but also includes other coplanar devices (not shown). Cross section structure 1500' also includes stacked device T3BB. Top cross section structure 2470 described further below includes channel region 1540 with suspended SWNTs 1520, source 1535, and drain region 1530. Top structure 2470 is supported by intermediate structure 2050' and contacts surface 2050S' discussed further below. Intermediate structure 2050' is a modification of structure 2050 described further below in reference to FIG. 20C. Conductor 1535' contacts SWNTs 1520 and forms source terminal 1535 of device T3BB. Conductor 1570 contacts conductor 1535' and is used for interconnections. Insulator 1565 separates conductor 1570 from the channel region such that a top gate shown further below has minimum capacitive coupling to conductor 1570. Conductor 1530' contacts SWNTs 1520 and forms drain terminal 1530. Conductor 1590 contacts conductor 1530' and is used as a segment of local wiring 1220S. Insulator 1560, described further below with respect to FIG. 24G, separates conductor 1590 from the channel region such that a top gate shown further below has minimum capacitive coupling to conductor 1590. Source 1538 and drain 1533 of device T5BB shown in FIG. 15A are also formed in the same way as those of device T3BB. Channel region 1540 includes a plurality of SWNTs 1520 spanning the distance between source 1535 and drain 1530 as illustrated in FIGS. 15A and 15B. A gap 1575 is formed in intermediate structure 2050', below the channel region formed by SWNTs 1520, as described further below. The SWNTs consist of metallic and semiconducting SWNTs exposed to an environment of air, oxygen, or other gas as needed. The semiconducting SWNTs are P-type as explained above. Back bias connection 235' is used to apply voltage to back (bottom) gate 225' using connection 230'. The back gate voltage 225' electrostatically couples to semiconducting SWNTs in the channel region and turns them OFF. Metallic SWNTs remain conducting. At this point, the metallic SWNTs have gap regions above and below (also side to side because of the porous nature of the SWNT region) and are structurally similar to prior art structure 620 in FIG. 7B. The thermal conduction between SWNTs and the silicon substrate is greatly reduced by gap 1575 facilitating metallic SWNT heating and burn-off. Wafer-level burn-off means described further below are used to pass current through the metallic SWNTs in the channel region of device T3BB and T5BB. Metallic SWNTs are burned-off as illustrated in FIG. 9 and only semiconducting SWNTs remain. At this point, structure 1500' is ready for further processing as illustrated further below.

Preferred methods are used to fabricate structure 1500' illustrated in FIG. 15B. The starting point is bottom structure 1300 fabricated using conventional semiconductor fabrication techniques.

Next, preferred methods deposit an insulating layer such as $SiO_2$ on surface 1300S of bottom structure 1300.

Next, preferred methods etch an interconnecting region in the $SiO_2$ layer reaching the top of interconnect segment 1220S". Then, preferred methods planarize the surface, forming interconnect segment 1220S" with top surface exposed, and an adjacent planar dielectric region.

At this point in the process, preferred methods form intermediate structure 2050' as described further below.

Next, intermediate structure 2050' is modified by using preferred methods to etch via hole to the top of interconnect segment 1220S" and fill via hole with metal completing the formation of local interconnect 1220S'" using well known semiconductor processing techniques.

Next, preferred methods form top structure 2470 as described further below. Top structure 2470 is in contact with top surface 2050S' of modified intermediate structure 2050'. A portion of local wiring 1220S composed of conductor segments1220S', 1220S", 1220S'", and 1590 interconnects the drain diffusion of NFET T2 with the drain 1530' of device T3BB.

Next, preferred methods etch gap region 1575 in insulator 1555 using insulator 1550 as an etch stop. The opening for etching gap region 1575 is defined by openings in the insulator illustrated by the vertical sides of insulators 1560 and 1565 ($SiO_2$ for example) and the vertical sides of SWNT contact conductors 1530' and 1535' defining the opening above the SWNT channel region. Insulator 1555 may be 1 to 10 nm of SiN, for example, and insulator 1550 may be 1 to 10 nm of $Al_2O_3$, for example. The etch must be selective to $SiO_2$ and conductors such as palladium, titanium, tungsten, and others, and also to $Al_2O_3$. Means of etching through a porous nanofabric layer uses methods described in described in more detail in U.S. patent application Ser. No. 10/864,186 entitled, "Non-volatile Electromechanical Field Effect Devices and Circuits using same and Methods of Forming Same" and 60/543,497 entitled "EEPROMS using Carbon Nanotubes."

Burn-Off Back Gate Structures with Non-Suspended SWNTs and Gap

Figure 15C:
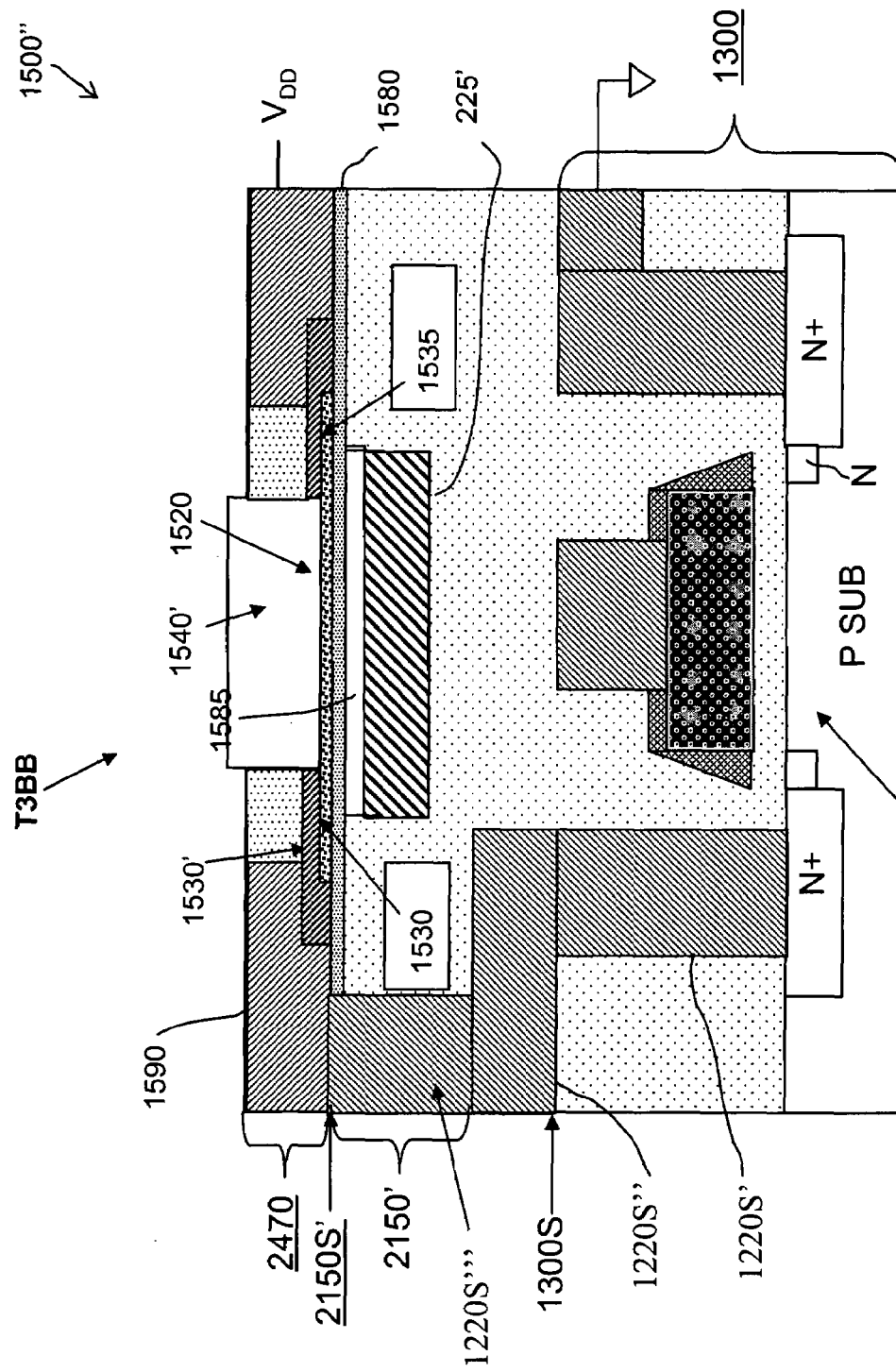

FIG. 15C illustrates a cross section structure 1500'" corresponding to cross section BB' shown in plan view 1500, FIG. 15A. FIG. 15C includes bottom structure 1300 formed using well known semiconductor fabrication techniques and shows NFET T2 in the cell region, but also includes other coplanar devices (not shown). Cross section structure 1500" also includes stacked device T3BB. Top cross section structure 2470 described further below with respect to FIG. 24G includes channel region 1540' with non-suspended SWNTs 1520, which differs from channel region 1540 because SWNTs 1520 are not suspended between source region 1535, and drain region 1530. Top structure 2470 is supported by intermediate structure 2150' and contacts surface 2150S' discussed further below. Intermediate structure 2150' is a modification of structure 2150 described further below With respect to FIG. 21B. Conductor 1535 details are as described above with respect to structure 1500'. Source and drain structures and interconnections for devices T3BB and T5BB in structure 1500" are the same as described above with respect to structure 1500'. Channel region 1540' includes a plurality of SWNTs 1520 deposited on insulator insulating layer 1580 spanning the distance between source 1535 and drain 1530 regions as illustrated in FIGS. 15A and 15C. Deposition of SWNTs 1520 on insulating layer 1580 facilitates deposition of a channel region insulator over the SWNTs 1520 later in the process, after metallic SWNTs have been burned-off, as described further below. A gap 1585 is formed in intermediate structure 2150', between insulator 1580 and back gate 225' by removing a portion of insulator 1550, as described further below. The SWNTs consist of metallic and semiconducting SWNTs exposed to an environment of air, oxygen, or other gas as needed. The semiconducting SWNTs are P-type as explained above. Back bias connection 235' is used to apply voltage to back (bottom) gate 225' using connection 230'. The back gate voltage 225' electrostatically couples to semiconducting SWNTs in the channel region and turns them OFF. Metallic SWNTs remain conducting. At this point, the heat flow to the silicon substrate from metallic SWNTs on insulator 1580 is blocked by gap 1585. The SWNT structure is a variation of prior art structure 606, FIG. 7A. The thermal conduction between SWNTs and the silicon substrate is greatly reduced by gap 1585 facilitating metallic SWNT heating and burn-off. Wafer-level burn-off means described further below are used to pass current through the metallic SWNTs in the channel region of device T3BB and T5BB. Metallic SWNTs are burned-off as illustrated in FIG. 9 and only semiconducting SWNTs remain. At this point, structure 1500" is ready for further processing as illustrated further below.

Preferred methods are used to fabricate structure 1500" illustrated in FIG. 15C. The starting point is bottom structure 1300 fabricated using conventional semiconductor fabrication techniques.

Next, preferred methods deposit an insulating layer such as $SiO_2$ on surface 1300S of bottom structure 1300.

Next, preferred methods etch an interconnecting region in the $SiO_2$ layer reaching the top of interconnect segment 1220S". Then, preferred methods planarize the surface, forming interconnect segment 1220S" with top surface exposed, and an adjacent planar dielectric region.

Figure 21A:
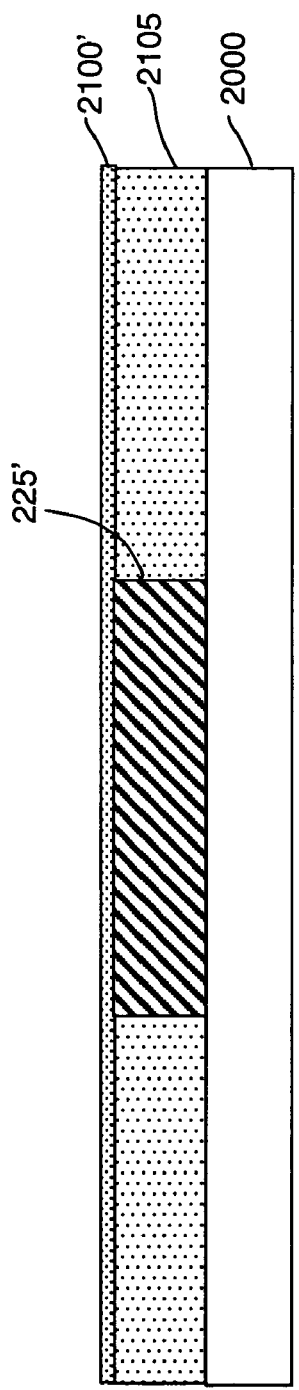
FIGS. 21A-B illustrate cross sectional views of structures according to aspects of the invention.
Figure 21B:
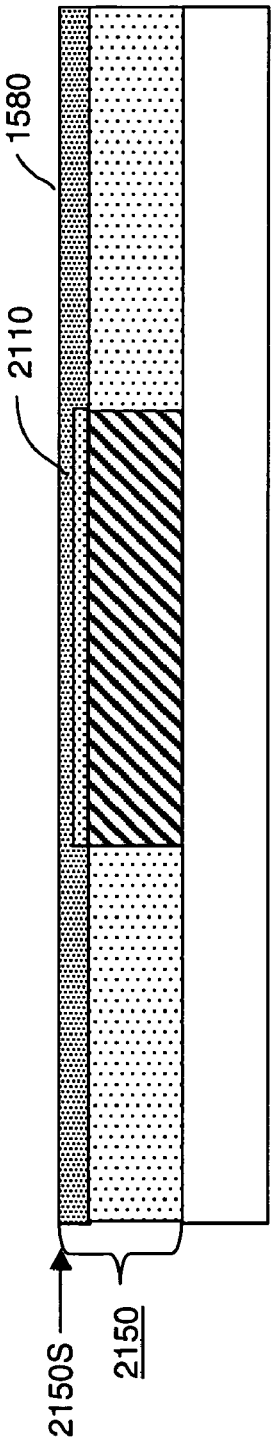

At this point in the process, preferred methods form intermediate structure 2150 as described further below with respect to FIG. 21B.

Next, intermediate structure 2150 is modified by using preferred methods to etch via hole to the top of interconnect segment 1220S" and fill via hole with metal completing the formation of local interconnect 1220S'" using well known semiconductor processing techniques. Local wiring 1230S is formed in the same way.

Next, preferred methods form top structure 2470 as described further below with respect to FIG. 24G. Top structure 2470 is in contact with top surface 2150S' of modified intermediate structure 2150'. A portion of local wiring 1220S composed of conductor segments 1220S', 1220S", 1220S'", and 1590 interconnects the drain diffusion of NFET T2 with the drain 1530' of device T3BB.

Next, preferred methods form gap region 1585 by removing (etching) sacrificial layer 2110 illustrated further below with respect to FIG. 21B, composed of silicon, for example, in intermediate structure 2150 by etching the sacrificial layer using fluidic means through an opening to the sacrificial layer (not shown) using methods described in more detail in U.S. patent application Ser. No. 10/864,186 entitled, "Non-volatile Electromechanical Field Effect Devices and Circuits using same and Methods of Forming Same" and Ser. No. 11/053,135 entitled "EEPROMS using Carbon Nanotubes," thus modifying intermediate structure 2150 to create intermediate structure 2150'. The dimensions of gap 1585 correspond to those of back gate 225', for example, as described further below.

Figure 16A:
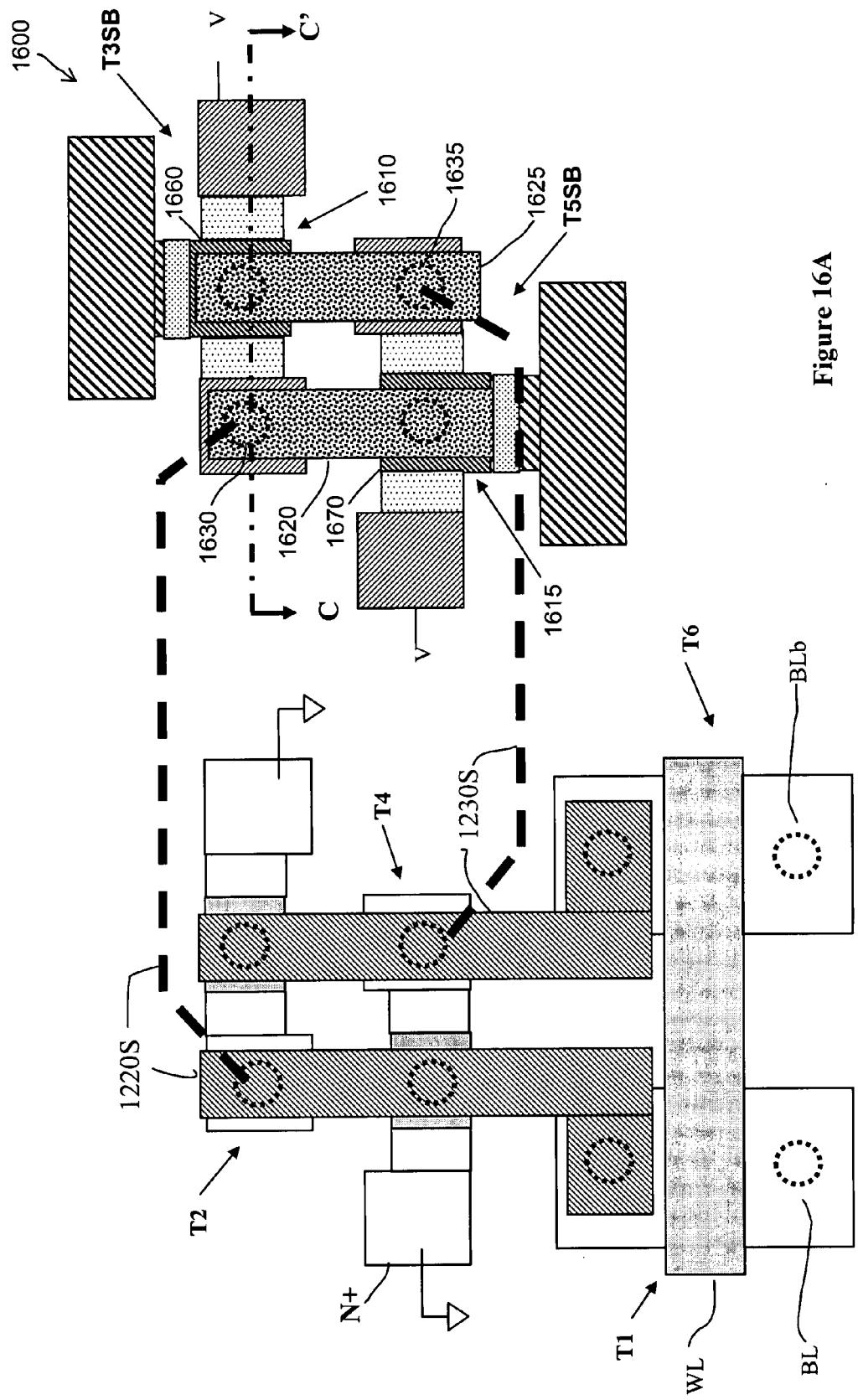
FIG. 16A illustrates a cell layout according to one aspect of the invention.
Figure 16B:
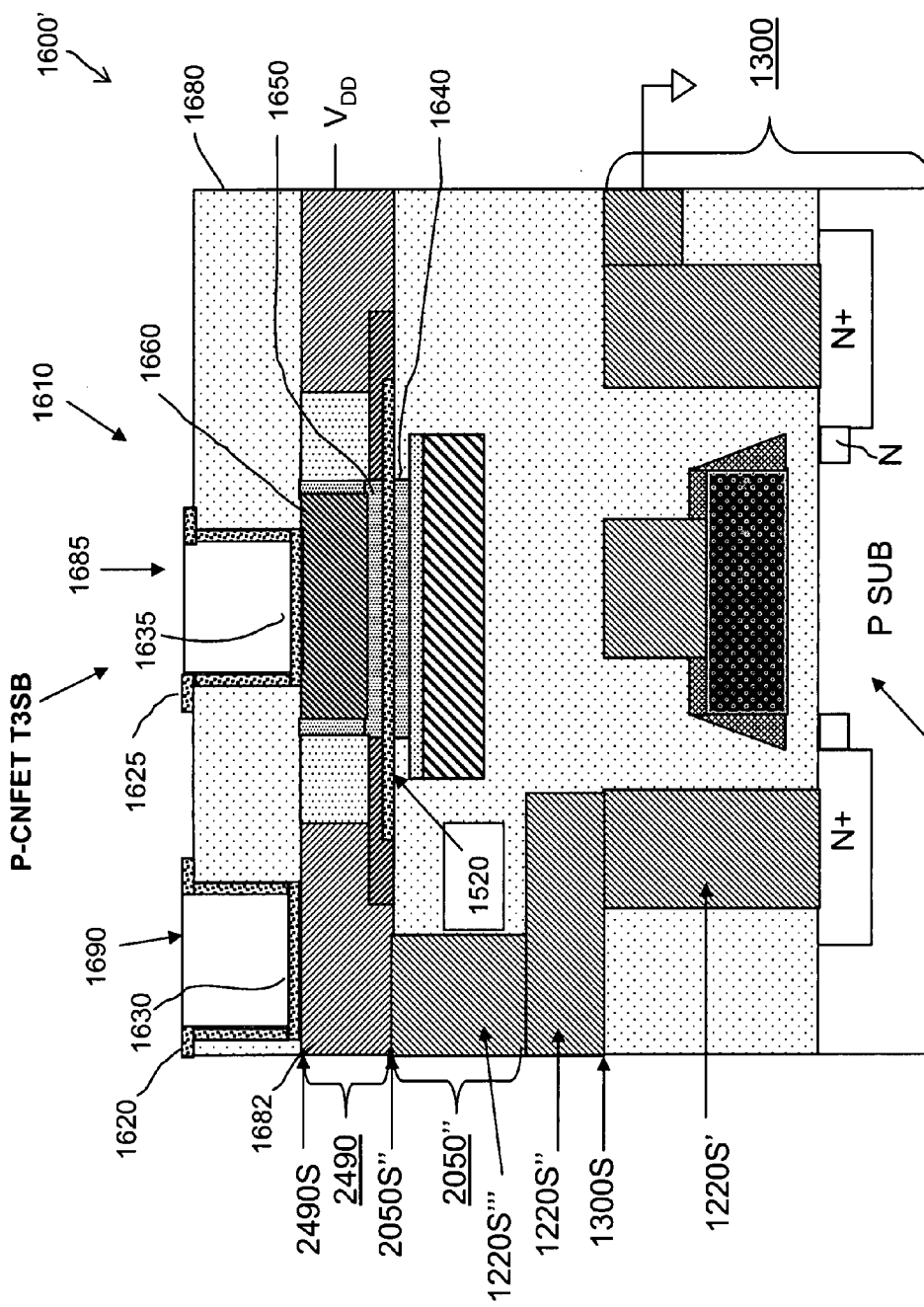
FIGS. 16B-16E illustrate intermediate structures according to aspects of the invention.

SRAM Cell Structure with Back Insulator Deposited through Porous SWNT Channel Region Prior to Gate Insulator Deposition FIG. 16A illustrates plan view 1600 of fully fabricated stacked P-CNFET devices referred to as T3SB and T5SB, integrated (interconnected) with corresponding NFETs T1, T2, T4, and T6 to form storage structure 210 as illustrated in schematic 200 shown in FIG. 2A. Interconnections between source and drain portions of partially fabricated stacked P-FET devices T3BB and T5BB and underlying NFETs remain as described above with respect to FIGS. 15A and 15B. Fabrication of the top gate region 1610 including gate 1660 on a post metallic SWNT burn-off T3BB device structure results in a completed P-CNFET device with a plurality of semiconducting SWNT fibers referred to as device T3SB as illustrated by combined top view 1600 and cross section structures 1600' in FIGS. 16A and 16B respectively. Combined top view 1600 and cross section structure 1600' and associated descriptions illustrate a first preferred embodiment of storage cell 210 illustrated schematically in FIG. 2A. Fabrication of the top gate region 1615 including gate 1670 on a post metallic SWNT burn-off T5BB device structure results in a complete P-CNFET device with a plurality of semiconducting SWNT fibers referred to as device T5SB as illustrated in FIGS. 16A and 16B. Local interconnect 1620 is deposited and patterned to connect the drain of T3SB, which is also connected to local wiring 1220S, at contact 1630 and top gate 1615 of T5SB thereby completing local wiring 1220S. Local interconnect 1625 is deposited and patterned to connect the drain of T5SB, which is also connected to local interconnect 1230S, at contact 1635 and top gate 1610 of T3SB thereby completing local wiring 1230S. Local interconnect 1620 and 1625 may use patterned nanofabric layers as described in more detail in U.S. patent application Ser. No. 10/936,119 entitled, "Patterning of Nanoscopic Articles" and related applications, all of which are incorporated by reference in their entireties and are commonly assigned to the assignee of the present invention.

FIG. 16B illustrates cross section structure 1600' corresponding to cross section CC' shown in plan view 1600, FIG. 16A. FIG. 16B includes structures 1500' illustrated in FIG. 15B plus additional structure added after metallic SWNT burn-off that in total form structure 1600' illustrated in FIG. 16B. Insulator 1640 deposited through the porous NT layer 1520, results in intermediate structure 2050" with surface 2050S". Insulator 1650 forms the top gate oxide between gate 1660 and semiconducting SWNTs 1520. Via hole 1685 in insulating layer 1680 exposes the top surface of top gate 1660, which is contacted at contact 1635 by local interconnect 1625. Via hole 1690 in insulating layer 1680 exposes the top surface 2490S of interconnect layer 1220S, which is contacted at contact 1630 by local wiring 1620. Plan layout structures 1600 and cross section structures 1600' illustrate the elements (structures) and the interconnections used to fabricate a first preferred embodiment of storage cell 210 illustrated schematically in FIG. 2A.

Preferred methods are used to fabricate structure 1600' illustrated in FIG. 16B. The starting point is structure 1500' illustrated in FIG. 15B.

Preferred methods fill the gap region below nanotube layer 1520 with an insulator through the porous (90% porous, for example) nanotube layer. The gap layer may be in the range of 1 nm to 20 nm. For shallow gap heights in the 1-3 nm range, for example, preferred methods deposit an insulator such SiO$_2$ using atomic layer deposition (ALD). For medium gap heights in the 3 to 20 nm range, for example, preferred methods deposit an insulator such as SiO$_2$ using chemical vapor deposition (CVD) techniques; those skilled in the art will understand such deposition techniques.

Next, preferred methods deposit gate insulator 1650 of thickness in the 2 to 10 nm range. The interface region between semiconductor SWNTs and insulators is not a critical factor in device operation as is the case for the Si/SiO$_2$ interface used for conventional FETs. Gate dielectrics such as SiO$_2$ or high-k insulators may be used.

Next, preferred methods deposit the gate conductor (or semiconductor), pattern, and planarize. The gate conductor may be tungsten, aluminum, copper, and titanium, alloys of metals, polysilicon, or silicides of silicon.

Next, preferred methods etch via holes in insulating layer 1680 and exposes the top surface of top gate 1660, which is contacted at contact 1635 by local interconnect1625. Also, via hole 1690 in insulating layer 1680 exposes the top surface 2490S of interconnect layer 2490, which is contacted at contact 1630 by local wiring 1620. Local interconnect wiring may use patterned nanofabric layers as described in more detail in U.S. Patent Appl. Ser. No. 10/936,119 entitled "Patterned Nanoscopic Articles and Methods of Making the Same," and related applications.

SRAM Cell Structure Gate Insulator Deposited on SWNTs with Back Insulator

Figure 16C:
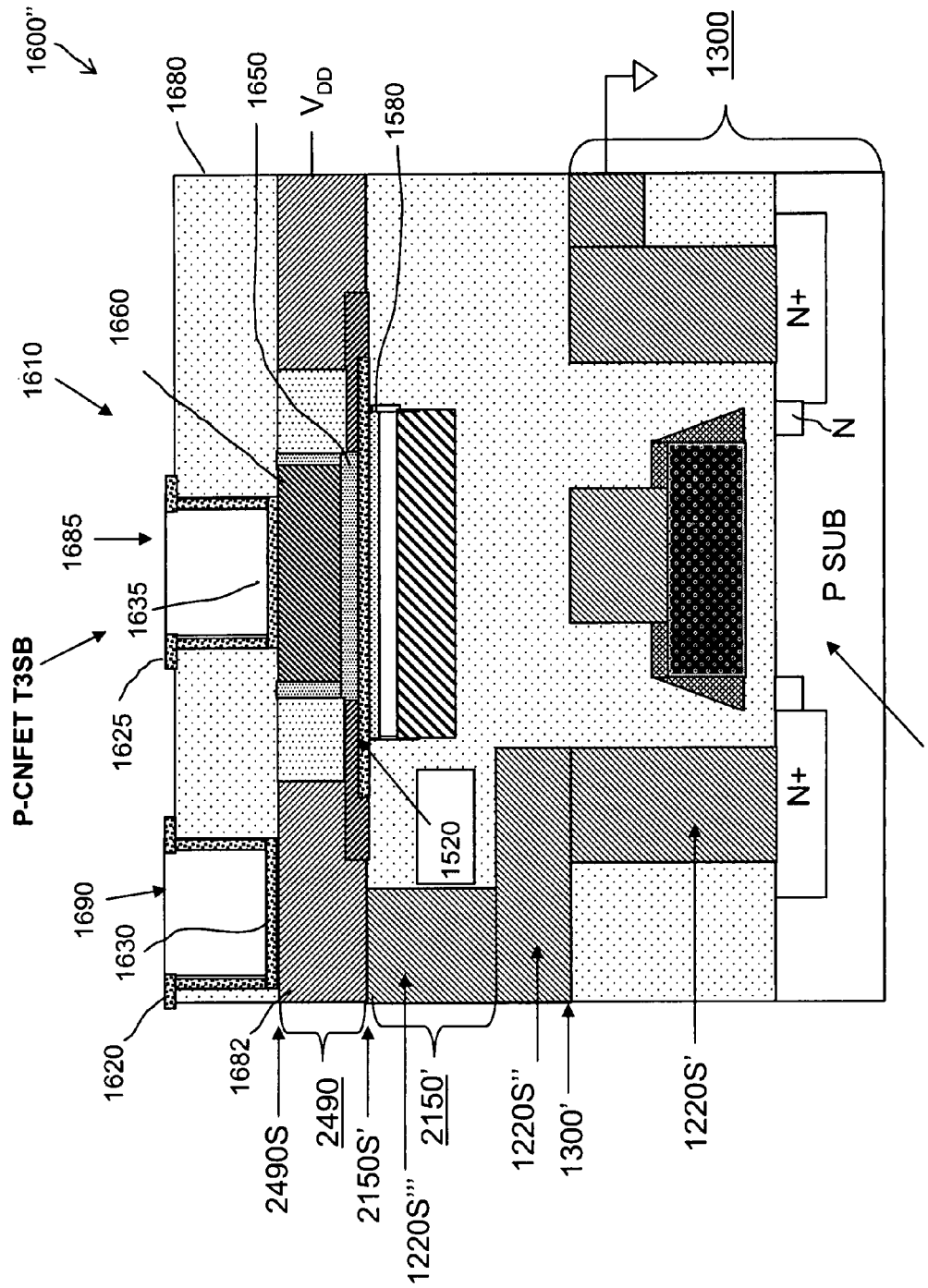

FIG. 16A illustrates plan view 1600 of fully fabricated stacked P-CNFET devices referred to as T3SB and T5SB, integrated (interconnected) with corresponding NFETs T1, T2, T4, and T6 to form storage structure 210 as illustrated in schematic 200 shown in FIG. 2A. Interconnections between source and drain portions of partially fabricated stacked P-FET devices T3BB and T5BB and underlying NFETs remain as described above with respect to FIGS. 15A and 15C. Fabrication of the top gate region 1610 including gate 1660 on a post metallic SWNT burn-off T3BB device structure results in a completed P-CNFET device with a plurality of semiconducting SWNT fibers referred to as device T3SB as illustrated by combined top view 1600 and cross section structures 1600" in FIGS. 16A and 16C respectively. Combined top view 1600 and cross section structures 1600" and associated descriptions illustrate a second preferred embodiment of storage cell 210 illustrated schematically in FIG. 2A. Fabrication of the top gate region 1615 including gate 1670 on a post metallic SWNT burn-off T5BB device structure results in a complete P-CNFET device with a plurality of semiconducting SWNT fibers referred to as device T5SB as illustrated in FIGS. 16A and 16C. Local interconnect 1620 is deposited and patterned to connect the drain of T3SB, which is also connected to local wiring 1220S, at contact 1630 and top gate 1615 of T5SB thereby completing local wiring 1220S. Local interconnect 1625 is deposited and patterned to connect the drain of T5SB, which is also connected to local interconnect 1230S, at contact 1635 and top gate 1610 of T3SB thereby completing local wiring 1230S.

FIG. 16C illustrates cross section structure 1600" corresponding to cross section CC' shown in plan view 1600, FIG. 16A. FIG. 16C includes structures 1500" illustrated in FIG. 15C plus additional structure added after metallic SWNT burn-off that in total form structure 1600" illustrated in FIG. 16C. Insulator 1650 deposited on semiconductor SWNTs after burn-off forms the top gate oxide between gate 1660 and semiconducting SWNTs 1520. Via hole 1685 in insulating layer 1680 exposes the top surface of top gate 1660, which is contacted at contact 1635 by local interconnect 1625. Via hole 1690 in insulating layer 1680 exposes the top surface 2490A of interconnect layer 2490, which is contacted at contact 1630 by local wiring 1620. Plan layout structures 1600 and cross section structures 1600" illustrate the elements (structures) and the interconnections used to fabricate a second preferred embodiment of storage cell 210 illustrated schematically in FIG. 2A.

Preferred methods are used to fabricate structure 1600" illustrated in FIG. 16C. The starting point is structure 1500" illustrated in FIG. 15C.

Next, preferred methods deposit gate insulator 1650 of thickness in the 2 to 10 nm range. The interface region between semiconductor SWNTs and insulators is not a critical factor in device operation as is the case for the Si/SiO$_2$ interface used for conventional FETs. Gate dielectrics such as SiO$_2$ or high-k insulators may be used.

Next, preferred methods deposit the gate conductor (or semiconductor), pattern, and planarize.

Next, preferred methods etch via holes in insulating layer 1680 and exposes the top surface of top gate 1660, which is contacted at contact 1635 by local interconnect 1625. Also, via hole 1690 in insulating layer 1680 exposes the top surface 2490S of interconnect layer 2490S, which is contacted at contact 1630 by local wiring 1620. Local interconnect wiring may use patterned nanofabric layers as described in more detail in U.S. patent application Ser. No. 10/936,119 entitled "Patterned Nanoscopic Articles and Methods of Making the Same," and related applications.

SRAM Cell Structure Using Top and Bottom Gates and Gap Prior to Burn-Off

Figure 16D:
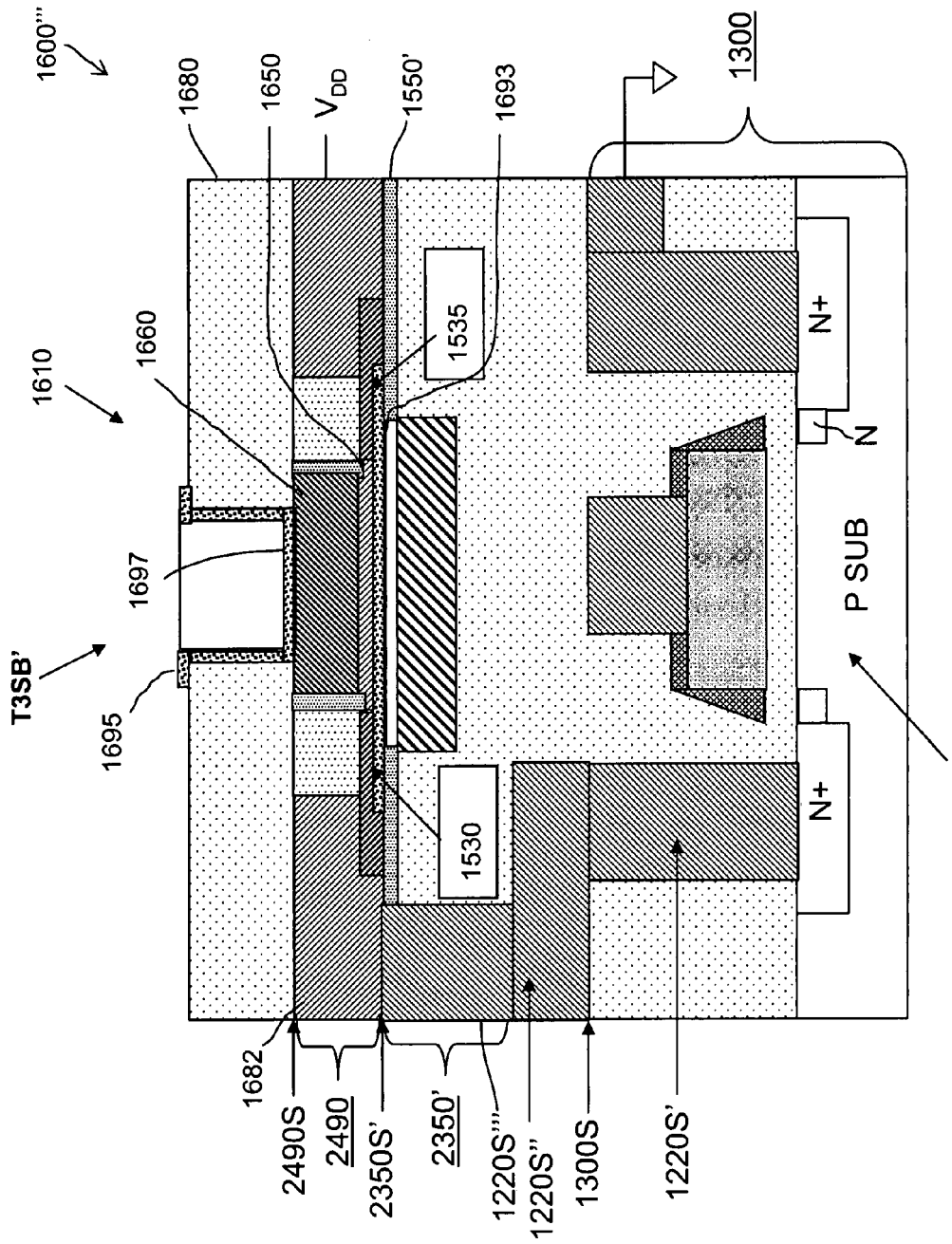

FIG. 16D illustrates cross section structure 1600''' in which, unlike first and second embodiments described above, a third embodiment is described in which a gate region 1610 is formed prior to metallic SWNT burn-off with a gap between SWNTs 1520 and back gate 225'. FIG. 16D includes bottom structure 1300 formed using well known semiconductor fabrication techniques and shows NFET T2 in the cell region, but also includes other coplanar devices (not shown). Cross section structure 1600''' also includes stacked device T3SB' in which the channel region includes both metallic and semiconducting SWNTs. Top cross section structure 2490 described further below includes channel region 1540 (FIGS. 15B, 15C), source region 1535, and drain region 1530. Top structure 2490 is supported by intermediate structure 2350' and contacts surface 2350S' discussed further below. Intermediate structure 2350' is a modification of structure 2350 described further below with respect to FIG. 23D. Channel region 1540 includes a plurality of SWNTs 1520 deposited on sacrificial layer 2300 of structure 2350 illustrated further below with SWNTs 1520 spanning the distance between source and drain regions. Gap 1693 is formed in intermediate structure 2350' between SWNTs 1520 and back gate 225' as described further below. Fluid (or vapor) communication paths are formed from the surface to the sacrificial gap material 2300 and sacrificial layer material, silicon for example, is removed as explained in U.S. patent application Ser. No. 10/864,186 entitled, "Non-volatile Electromechanical Field Effect Devices and Circuits using same and Methods of Forming Same" and 60/543,497 entitled "EEPROMS using Carbon Nanotubes." The SWNTs in structure 1600''' consist of metallic and semiconducting SWNTs because the top gate structure was formed prior to metallic SWNT burn-off. Fluid (or vapor) communications paths are left open during wafer-level burn-off and SWNTs 1520 are exposed to an environment of air, oxygen, or other gas as needed. The voltage applied to back gate 225', or to top gate 1660 by temporary interconnection 1695 contacting gate 1660 at contact 1697, or to both back and front gates electrostatically couples to semiconducting SWNTs in the channel region and turns them OFF. Metallic SWNTs remain conducting. At this point, the heat flow to the silicon substrate from metallic SWNTs is blocked by gap 1693. The SWNT structure is similar to prior art structure 606, FIG. 7A. The thermal conduction between SWNTs and the silicon substrate is greatly reduced by gap 1693 facilitating metallic SWNT heating and burn-off. Wafer-level burn-off means described further below are used to pass current through the metallic SWNTs in the channel region of device T3SB' and T5SB'. Metallic SWNTs are burned-off as illustrated in FIG. 9 and only semiconducting SWNTs remain.

Preferred methods are used to fabricate structure 1600''' illustrated in FIG. 16D. The starting point is bottom structure 1300 fabricated using conventional semiconductor fabrication techniques.

Next, preferred methods deposit an insulating layer such as SiO$_2$ on surface 1300S of bottom structure 1300.

Next, preferred methods etch an interconnecting region in the SiO$_2$ layer reaching the top of interconnect segment 1220S''. Then, preferred methods planarize the surface, forming interconnect segment 1220S'' with top surface exposed, and an adjacent planar dielectric region.

At this point in the process, preferred methods form intermediate structure 2350 as described further below. Intermediate structure 2350 includes sacrificial layer 2300, silicon for example, upon which SWNTs 1520 are deposited. Sacrificial layer 2300 is removed after fabrication of the gate structure, modifying intermediate structure 2350 to include gap 1693, resulting in intermediate structure 2350' as described further below.

Next, preferred methods form top structure 2490 as described further below. Top structure 2490 is in contact with top surface 2350S' of modified intermediate structure 2350'. A portion of local wiring 1220S composed of conductor segments 1220S', 1220S'', 1220S''', and 1682 interconnects the drain diffusion of NFET T2 with the drain 1530 of device T3SB.

Next, preferred methods etch fluid (or vapor) communication paths from the surface to the sacrificial gap material 2300 and sacrificial layer material, silicon for example, is removed as explained in U.S. patent application Ser. No. 10/864,186 entitled, "Non-volatile Electromechanical Field Effect Devices and Circuits using same and Methods of Forming Same" and U.S. patent application Ser. No. 11/053,135 entitled "EEPROMS using Carbon Nanotubes." The SWNTs in structure 1800' consist of metallic and semiconducting SWNTs because the top gate structure was formed prior to metallic SWNT burn-off. Fluid (or vapor) communications paths are left open during wafer-level burn-off and SWNTs 1520 are exposed to an environment of air, oxygen, or other gas as needed.

Figure 16E:
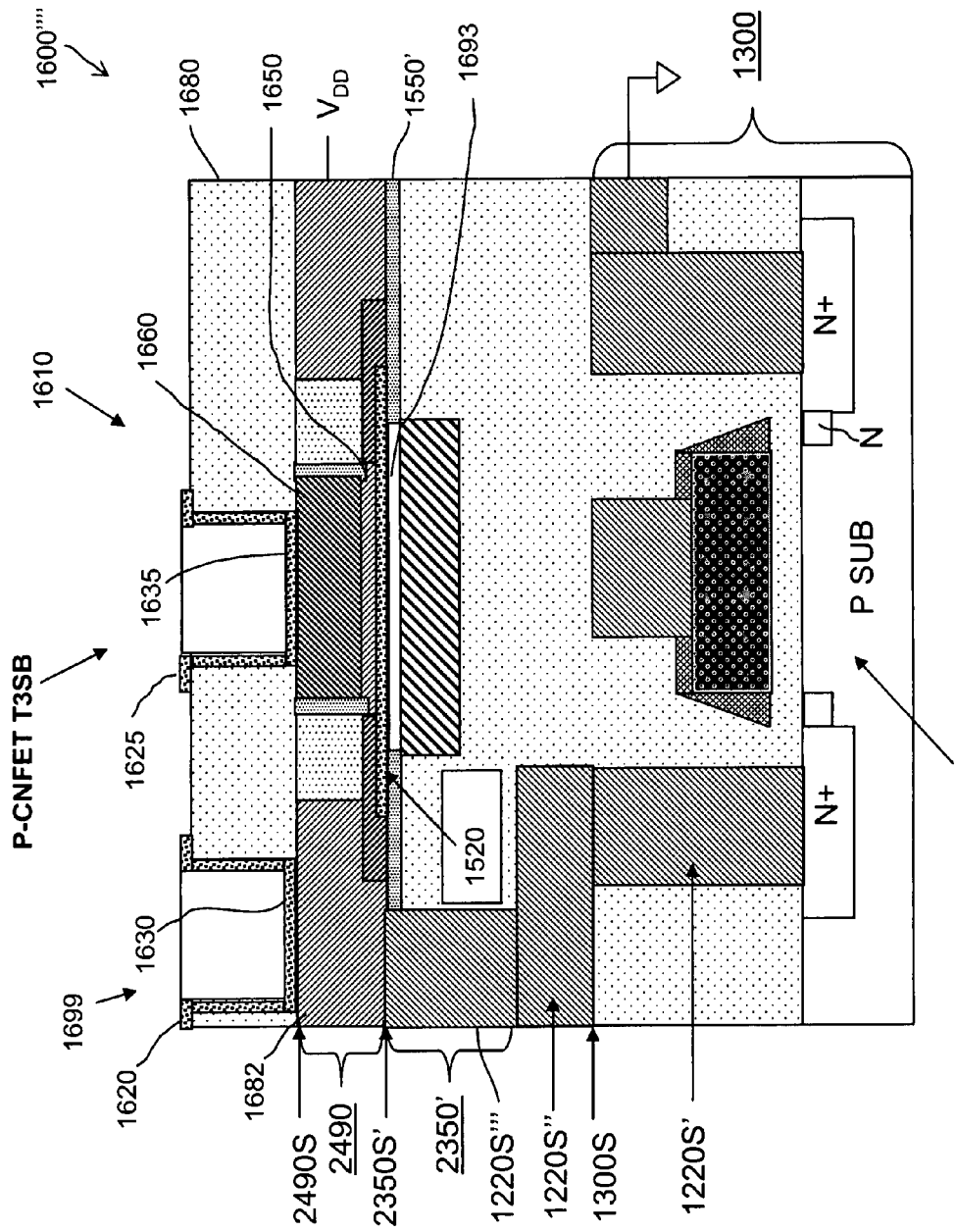

SRAM Cell Structure Using Top and Bottom Gates and Gap After Burn-Off and Wired for SRAM Cell Operation FIG. 16E illustrates cross section structure 1600'''' corresponding to cross section CC' shown in plan view 1600 of FIG. 16A. FIG. 16E includes structure 1600''' illustrated in FIG. 16D with modified local wiring to complete local interconnections required to complete SRAM storage structure 210 as illustrated schematically in FIG. 2A. Local wiring layer 1695 is removed, a second opening 1699 is formed, and new local wiring 1625 contacting gate 1660 at contact 1635, and local wiring 1620 contacting local wiring segment 1680 at contact 1630 is deposited and patterned to complete SRAM storage structure 210. Local interconnections 1620 and 1625 may use patterned nanofabric layers as described in more detail in U.S. patent application Ser. No. 10/936,119 entitled "Patterned Nanoscopic Articles and Methods of Making the Same," and related applications.

Preferred methods are used to fabricate structure 1600'''' illustrated in FIG. 16E. The starting point is structure 1600''' illustrated in FIG. 16D.

Preferred methods remove local wiring layer 1695.

Next, preferred methods etch a hole 1699 reaching local interconnect segment 2490 using conventional methods.

Next, preferred methods deposit a conductive layer. The conductive layer is patterned to form local interconnect segments 1620 and 1625. Local interconnect segments 1620 and 1625 may use patterned nanofabric layers as described in more detail in U.S. patent application Ser. No. 10/936,119 entitled "Patterned Nanoscopic Articles and Methods of Making the Same," and related applications.

Burn-Off with Top Gate Structures with Suspended SWNTs and Gap (No Back Gates)

Figure 17:
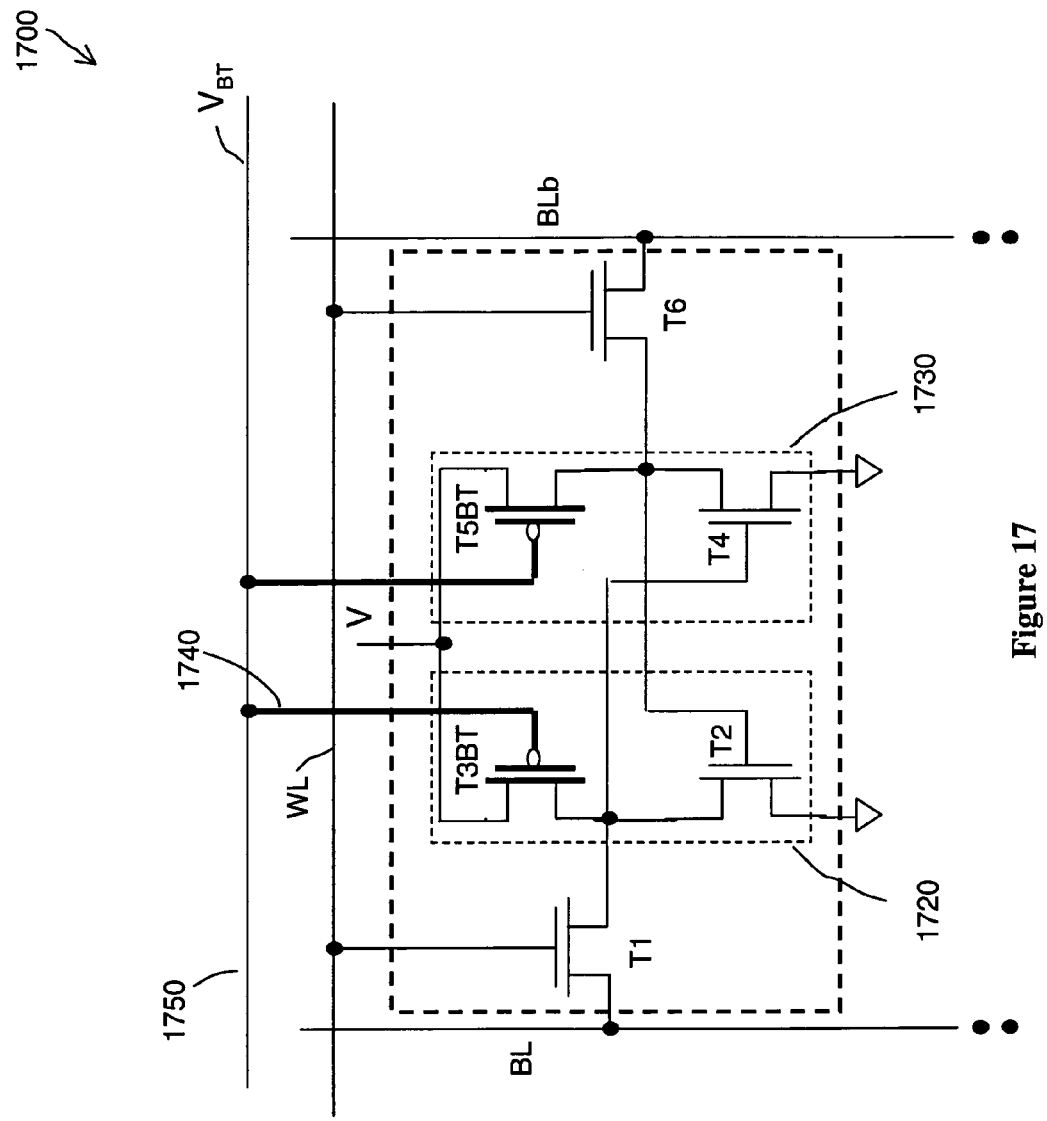
FIG. 17 illustrates a schematic diagram of a structure according to one aspect of the invention.

FIG. 17 is an illustration of schematic 1700 of a cell with fully integrated NFET devices and fully fabricated pre-burn-off top gate stacked devices T3BT and T5BT with channel region SWNTs 1520 having both semiconducting and metallic SWNTs. No back gate is used. Electrical characteristics of devices T3BT and T5BT are controlled by chemical means only, so there is no need for a back gate to electrostatically set the operating point of the devices after burn-off. FIG. 10B illustrates a P-CNFET device with post-burn-off electrical characteristics such that the P-CNFET device is normally OFF when gate-to-source voltage is zero. Schematic 1700 shows all devices interconnected as the storage cell 260 schematic shown in FIG. 2B, except that the stacked devices T3BT and T5BT of interconnected inverters 1720 and 1730 are connected to burn-off control line 1750 by connections 1740.

Figure 18A:
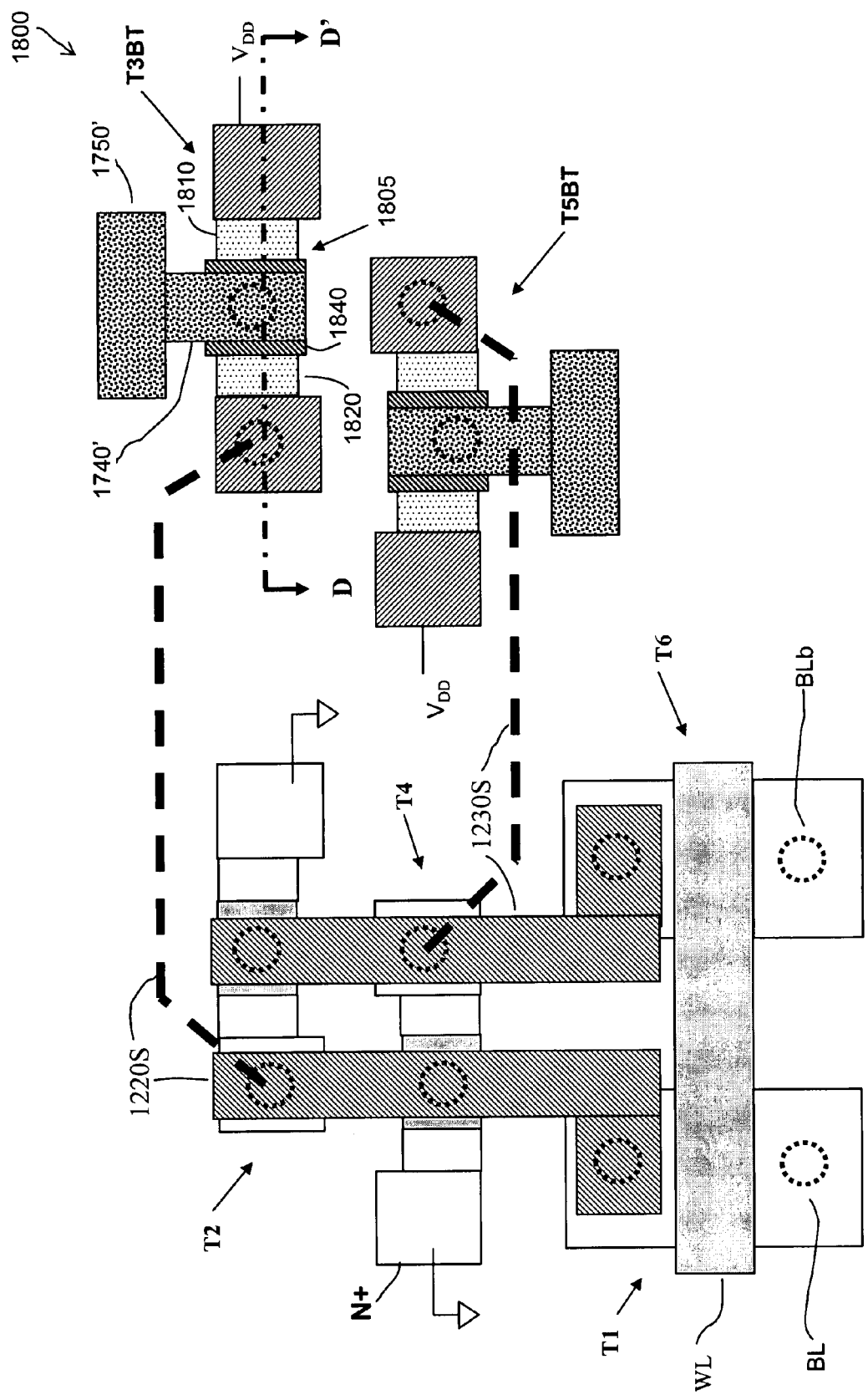
FIG. 18A illustrates a cell layout according to one aspect of the invention.
Figure 18B:
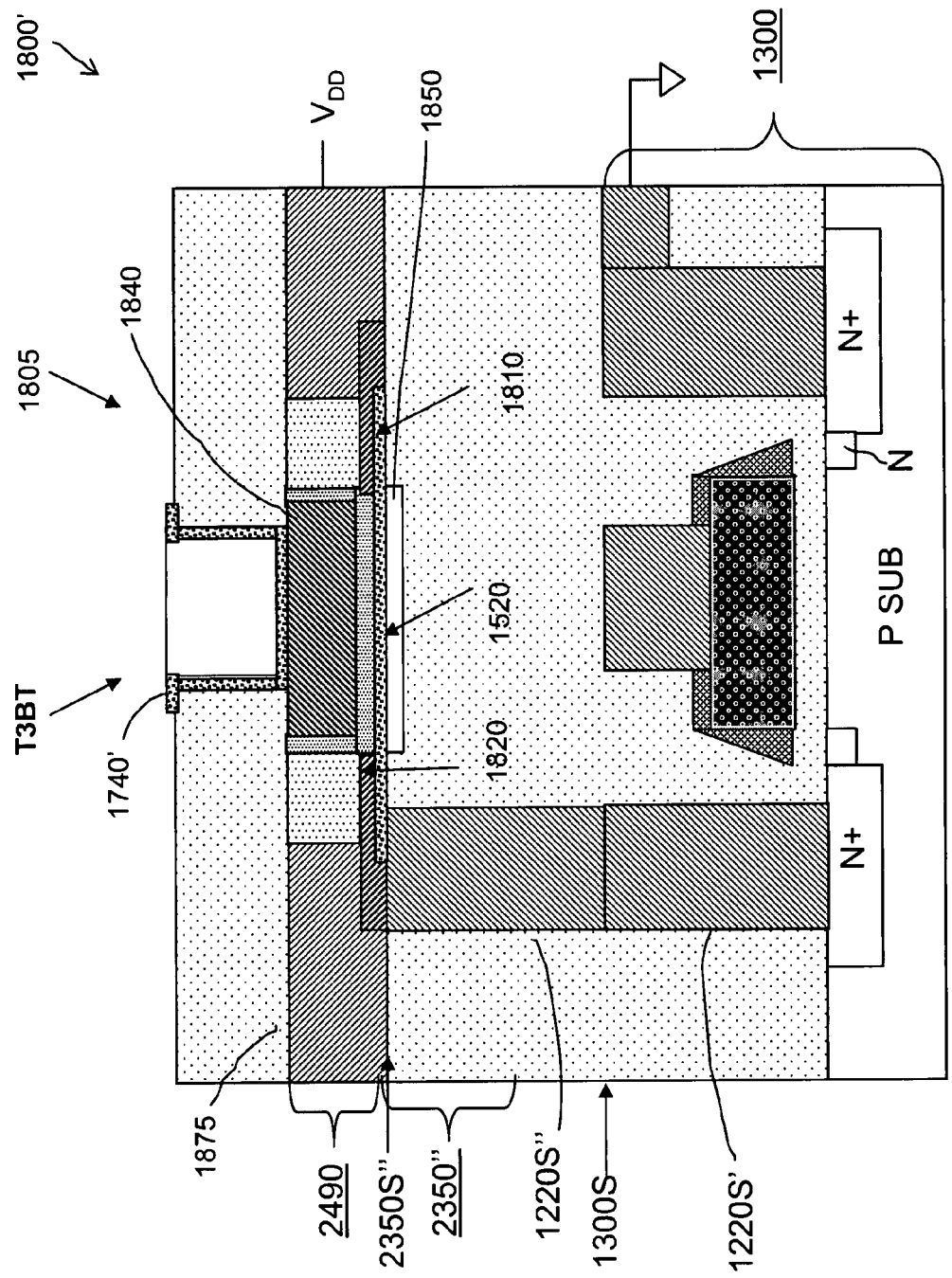
FIG. 18B illustrates a structure according to one aspect of the invention.

FIG. 18A illustrates plan view 1800 of the circuit of schematic 1700. FIG. 18B illustrates a cross section structure 1800' corresponding to cross section DD'. FIG. 18B illustrates cross section structure 1800' in which, unlike first, second, and third embodiments described above, a fourth embodiment is described in which a gate region 1805 is formed prior to metallic SWNT burn-off with a gap 1850 below SWNTs 1520. FIG. 18B includes bottom structure 1300 formed using well known semiconductor fabrication techniques and shows NFET T2 in the cell region, but also includes other coplanar devices (not shown). Cross section structure 1800' also includes stacked device T3BT in which the channel region includes both metallic and semiconducting SWNTs 1520, source 1810, and drain 1820. Top structure 2490 is supported by intermediate structure 2350' and contacts surface 2350S'' discussed further below. Intermediate structure 2350'' is a modification of structure 2350 described further below. The channel region is formed by a plurality of SWNTs 1520 deposited on sacrificial layer 2300 of structure 2350 illustrated further below with respect to FIG. 23D and with SWNTs 1520 spanning the distance between source 1810 and drain 1820 electrodes. Gap 1850 is formed in intermediate structure 2350'' below SWNTs 1520 as described further below. Fluid (or vapor) communication paths are formed from the surface to the sacrificial gap material 2300 and sacrificial layer material, silicon for example, is removed as explained in U.S. patent application Ser. No. 10/864,186 entitled, "Non-volatile Electromechanical Field Effect Devices and Circuits using same and Methods of Forming Same" and U.S. patent application Ser. No. 11/053,135 entitled "EEPROMS using Carbon Nanotubes." The SWNTs in structure 1800' consist of metallic and semiconducting SWNTs because the top gate structure was formed prior to metallic SWNT burn-off. Fluid (or vapor) communications paths are left open during wafer-level burn-off and SWNTs 1520 are exposed to an environment of air, oxygen, or other gas as needed. Voltage top gate 1840 is used to turn semiconducting SWNTs OFF. The voltage applied to top gate 1840 by temporary connection 1740' contacting burn-off control line 1750'. Top gate 1840 electrostatically couples to semiconducting SWNTs in the channel region and turns them OFF. Metallic SWNTs remain conducting. At this point, the heat flow to the silicon substrate from metallic SWNTs is blocked by gap 1850. The SWNT structure is similar to prior art structure 606, FIG. 7A. The thermal conduction between SWNTs and the silicon substrate is greatly reduced by gap 1850 facilitating metallic SWNT heating and burn-off. Wafer-level burn-off means described further below are used to pass current through the metallic SWNTs in the channel region of device T3SB' and T5SB'. Metallic SWNTs are burned-off as illustrated in FIG. 9 and only semiconducting SWNTs remain.

Preferred methods are used to fabricate structure 1800' illustrated in FIG. 18B. The starting point is bottom structure 1300 fabricated using conventional semiconductor fabrication techniques.

Next, preferred methods deposit an insulating layer such as $SiO_2$ on surface 1300S of bottom structure 1300.

Next, preferred methods etch a via hole in the $SiO_2$ layer reaching the top of interconnect segment 1220S'. Then, fill the via hole with a conducting layer and planarize the surface, forming interconnect segment 1220S'' with top surface exposed, and an adjacent planar dielectric region.

At this point in the process, preferred methods form intermediate structure 2350 as described further below. Intermediate structure 2350 includes sacrificial layer 2300, silicon for example, upon which SWNTs 1520 are deposited. Sacrificial layer 2300 is removed after fabrication of the gate structure, modifying intermediate structure 2350 to include gap 1850, resulting in intermediate structure 2350'' as described further below.

Next, preferred methods form top structure 2490 as described further below. Top structure 2490 is in contact with top surface 2350S'' of modified intermediate structure 2350''. A portion of local wiring 1220S composed of conductor segments 1220S' and 1220S'' interconnects the drain diffusion of NFET T2 with the drain 1820 of device T3SB.

Next, preferred methods etch fluid (or vapor) communication paths from the surface to the sacrificial gap material 2300 and sacrificial layer material, silicon for example, is removed as explained in U.S. patent application Ser. No. 10/864,186 entitled, "Non-volatile Electromechanical Field Effect Devices and Circuits using same and Methods of Forming Same" and U.S. patent application Ser. No. 11/053,135 entitled "EEPROMS using Carbon Nanotubes." The SWNTs in structure 1800' consist of metallic and semiconducting SWNTs because the top gate structure was formed prior to metallic SWNT burn-off. Fluid (or vapor) communications paths are left open during wafer-level burn-off and SWNTs 1520 are exposed to an environment of air, oxygen, or other gas as needed.

Figure 19A:
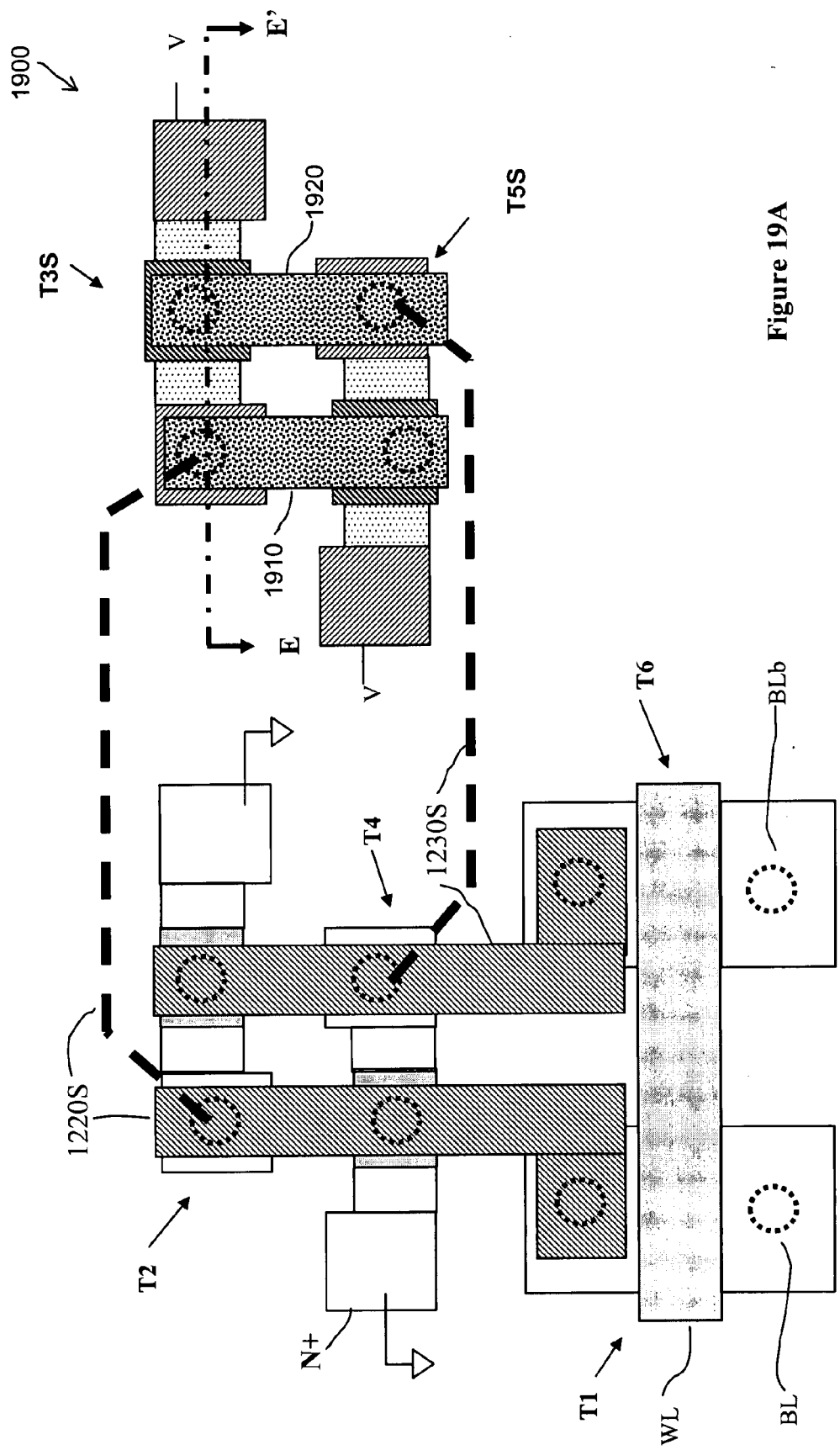
FIG. 19A illustrates a cell layout according to one aspect of the invention.
Figure 19B:
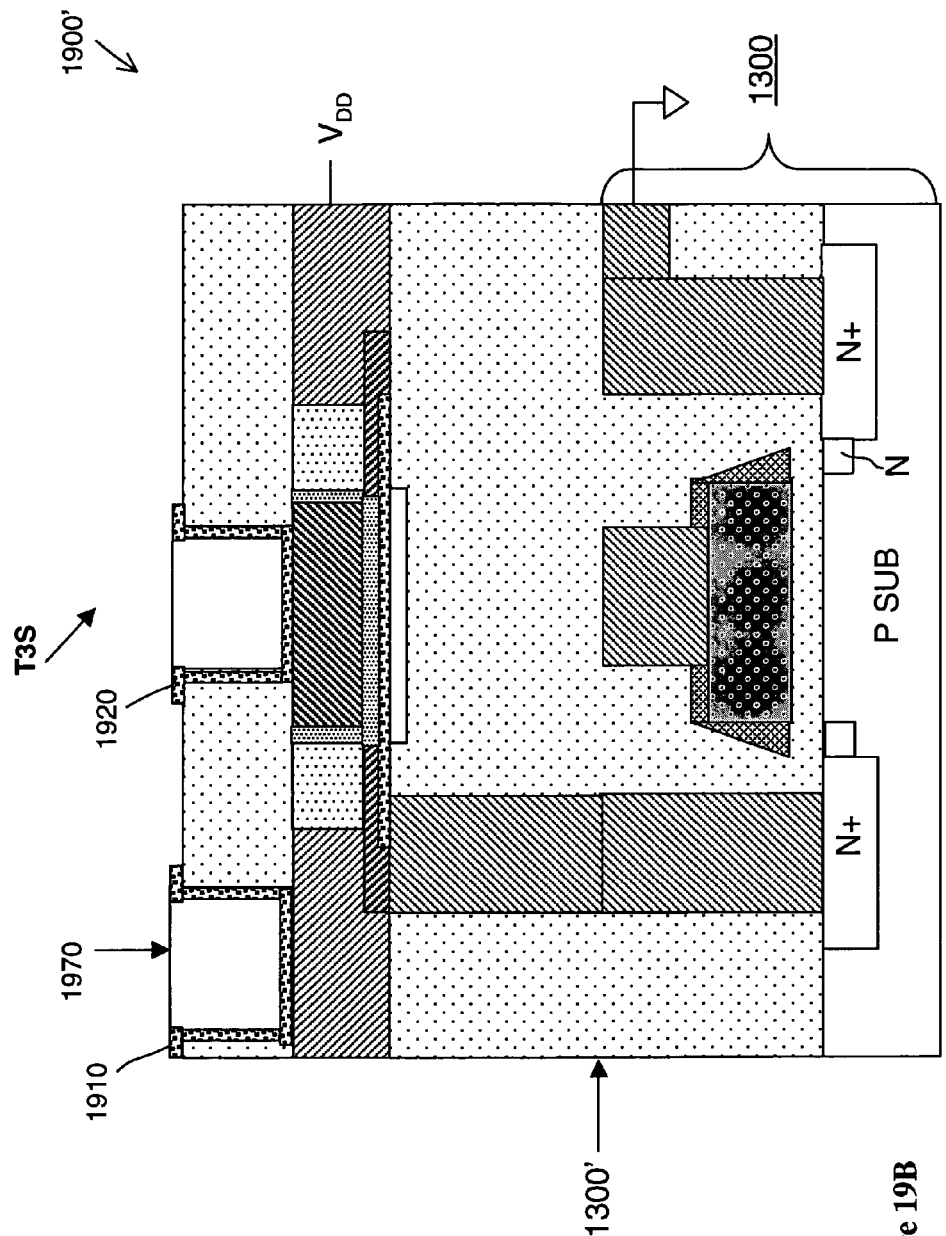
FIG. 19B illustrates a structure according to one aspect of the invention.

FIG. 19B illustrates cross section structure 1900' corresponding to cross section EE' shown in plan view 1900 of FIG. 19A. FIG. 19B includes structure 1800' illustrated in FIG. 18B with modified local wiring to complete local interconnections required to complete SRAM storage structure 260 as illustrated schematically in FIG. 2B. Local wiring layer 1740' is removed, a second opening 1970 is formed, and new local wiring 1910 and local wiring 1920 are patterned from a deposited conducting layer to complete SRAM storage structure 260. Local interconnections 1910 and 1920 may use patterned nanofabric layers as described in U.S. patent application Ser. No. 10/936,119 entitled "Patterned Nanoscopic Articles and Methods of Making the Same," and related applications.

Preferred methods are used to fabricate structure 1900' illustrated in FIG. 19B. The starting point is structure 1800' illustrated in FIG. 18B.

Preferred methods remove local wiring layer 1740'.

Next, preferred methods etch a hole 1970 reaching local interconnect segment 2490 using conventional methods.

Next, preferred methods deposit a conductive layer. The conductive layer is patterned to form local interconnect segments 1910 and 1920. Local interconnect segments 1910 and 1920 may use patterned nanofabric layers as described in more detail in U.S. patent application Ser. No. 10/936,119 entitled "Patterned Nanoscopic Articles and Methods of Making the Same," and related applications.

Fabrication of Structure 2050

Figure 20A:
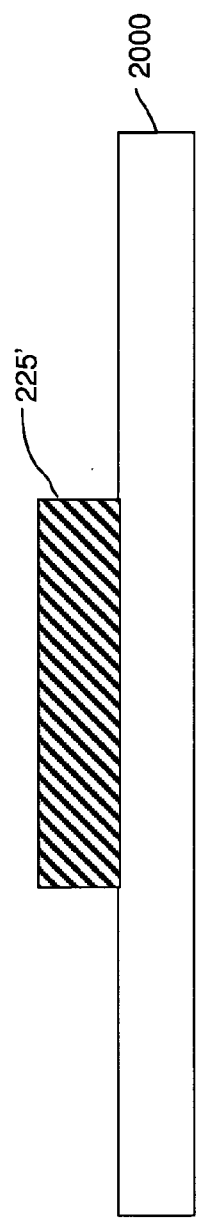
FIGS. 20A-C illustrate cross sectional views of structures according to aspects of the invention.

Preferred methods deposit and pattern a conductor 225' using well known industry techniques, that may be used as a back gate electrode, on substrate 2000 as illustrated in FIG. 20A. Conductor 225' may be 20 to 200 nm thick, for example, fabricated using tungsten, titanium, aluminum, copper, a metal alloy, a semiconductor, and a silicided semiconductor. Substrate 2000 may contain other structures such as structure 1300.

Figure 20B:
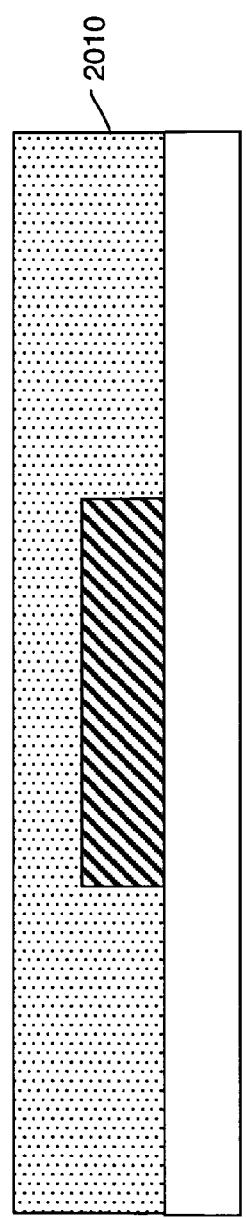

Next, preferred methods deposit insulator 2010 as illustrated in FIG. 20B, $SiO_2$ for example.

Figure 20C:
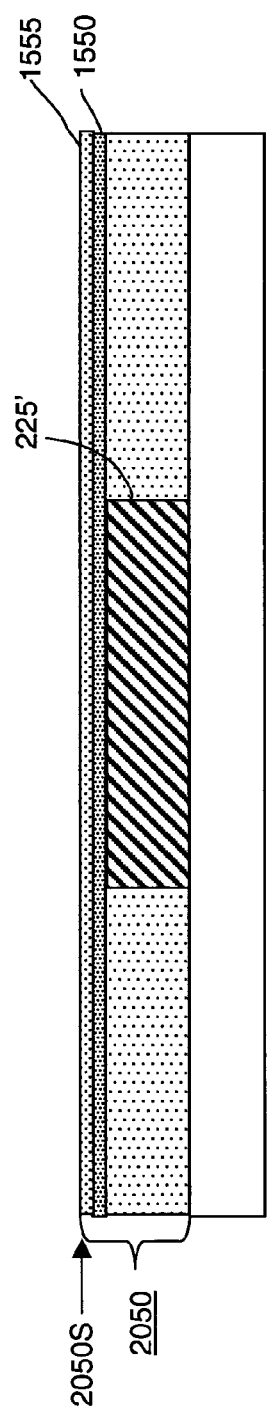

Next, preferred methods directionally etch and planarize insulator 2010 until the surface of conductor 225' is exposed. Then, preferred methods deposit insulating layer 1550, $Al_2O_3$, for example, 2 to 50 nm thick, for example. Then, preferred methods deposit insulating layer 1555, SiN for example, 2 to 50 nm thick, for example completing the fabrication of structure 2050 with surface 2050S as illustrated in FIG. 20C.

Fabrication of Structure 2150

Preferred methods deposit a sacrificial layer 2100', silicon of thickness 2 to 50 nm, for example, on a planar surface including insulator 2105, SiO2 for example, and a conductor 225'. Conductor 225' may be 20 to 200 nm thick, for example, fabricated using tungsten, titanium, aluminum, copper, a metal alloy, a semiconductor, or a silicided semiconductor as illustrated in FIG. 21A.

Preferred methods pattern sacrificial layer 2100' forming sacrificial structure 2110. Then, preferred methods deposit an insulator layer 1580, SiO2 for example, 2 to 50 nm, for example, forming structure 2150 with surface 2150S illustrated in FIG. 21B.

Fabrication of Structure 2250

Figure 22A:
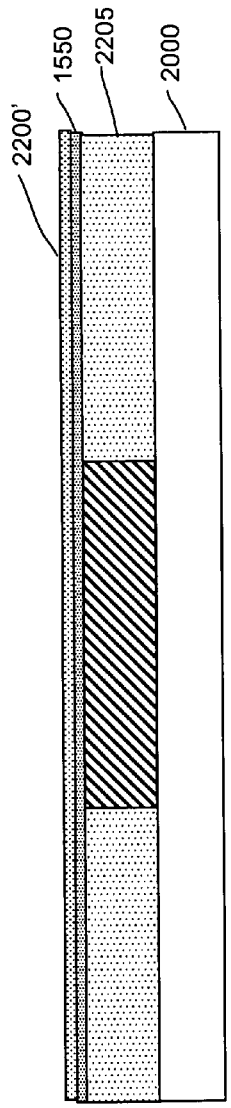
FIGS. 22A-D illustrate cross sectional views of structures according to aspects of the invention.

Preferred methods deposit insulating layer 1550, SiN for example, 2 to 50 nm thick, for example, using well known industry techniques on a planar surface including insulator 2205, SiO2 for example, and a conductor 225'. Conductor 225' may be 20 to 200 nm thick, for example, fabricated using tungsten, titanium, aluminum, copper, a metal alloy, a semiconductor, or a silicided semiconductor. Then, preferred methods deposit sacrificial layer 2200', silicon of thickness 2 to 50 nm, for example as illustrated in FIG. 22A.

Figure 22B:
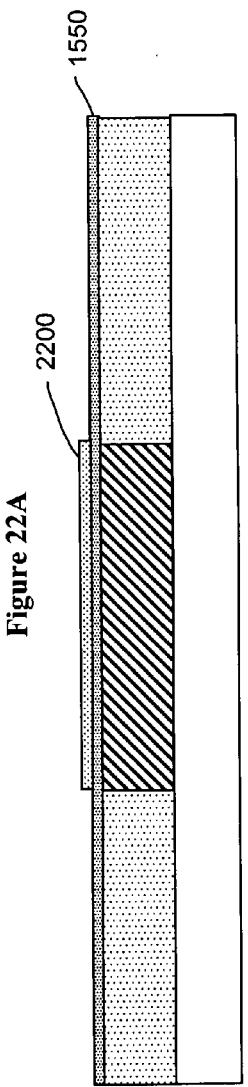

Next, preferred methods pattern sacrificial layer 2200' to form sacrificial structure 2200, as illustrated in FIG. 22B.

Figure 22C:
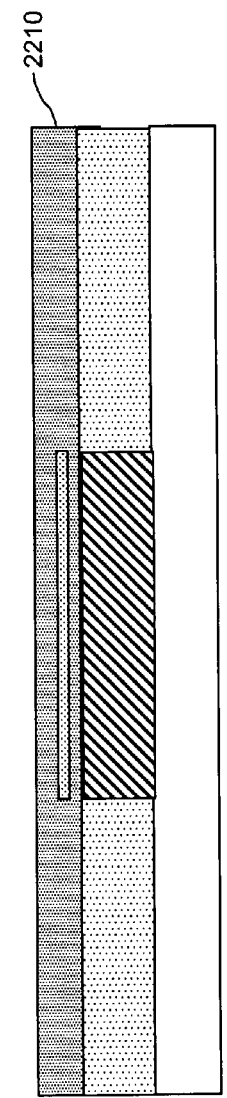

Next, preferred methods deposit insulating layer 2210, SiO2, for example, of thickness 2 to 50 nm, for example as illustrated in FIG. 22C.

Figure 22D:
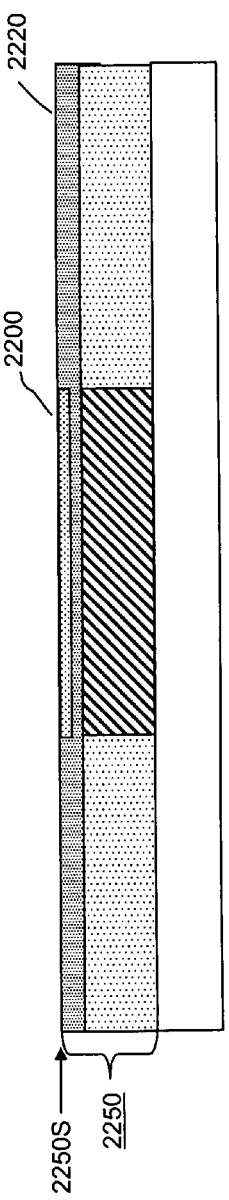

Next, preferred methods planarize insulator 2210 using well known industry techniques to produce structure 2250 with surface 2250S illustrated in FIG. 22D.

Fabrication of Structure 2350

Preferred methods deposit sacrificial layer 2300', silicon, for example, of thickness 2 to 50 nm, for example, on a planar surface of insulator 2310, $SiO_2$ for example, as illustrated in FIG. 23A.

Next, preferred methods pattern sacrificial layer 2300' to form sacrificial structure 2300 as illustrated in FIG. 23B.

Next, preferred methods deposit insulating layer 2320, $SiO_2$, for example, as illustrated in FIG. 23C.

Next, preferred methods planarize the structure of FIG. 23C resulting in structure 2350 with surface 2350S as illustrated in FIG. 23D.

Fabrication of Structure 2470 and Structure 2490

Figure 24A:
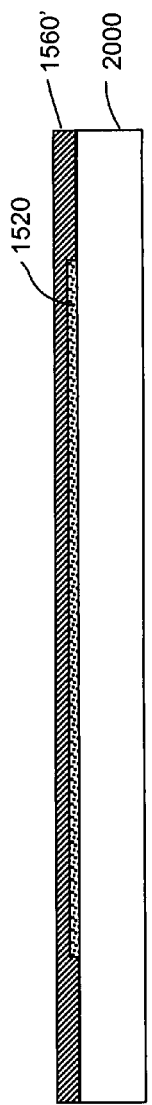

Preferred methods deposit a monolayer 0.5 to 5 um layer of non-woven nanofabric of SWNT on substrate 2000 using methods in U.S. Pat. Nos. 6,643,165, 6,574,130, 6,706,402, 6,784,028, 6,835,591, 6,911,682, 6,919,592 and 6,924,538 and U.S. patent application Ser. Nos. 10/341,005, 10/341,055, 10/341,054, 10/341,130 and 10/776,059. Preferred methods pattern the nanotube fabric layer. Alternatively, conducting layer 1560' is deposited on nanofabric layer 1520. Conducting layer 1560' contacts SWNTs in nanofabric layer 1520 and forms source and drain of CNFET devices. Conducting layer1560' may be 2 to 50 nm thick, and may be titanium, palladium, tungsten, or other conductors that form contacts with desirable electrical characteristics with nanotubes, Ohmic for example, or Schottky with low barrier heights, for example, as illustrated in FIG. 24A.

Figure 24B:
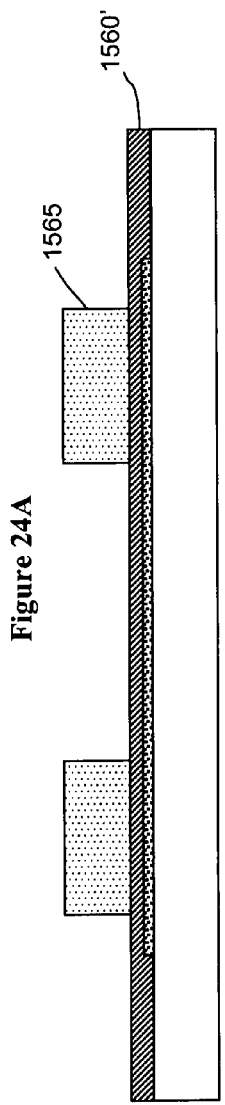

Next, preferred methods deposit an insulator layer 1565 and pattern as illustrated in FIG. 24B.

Figure 24C:
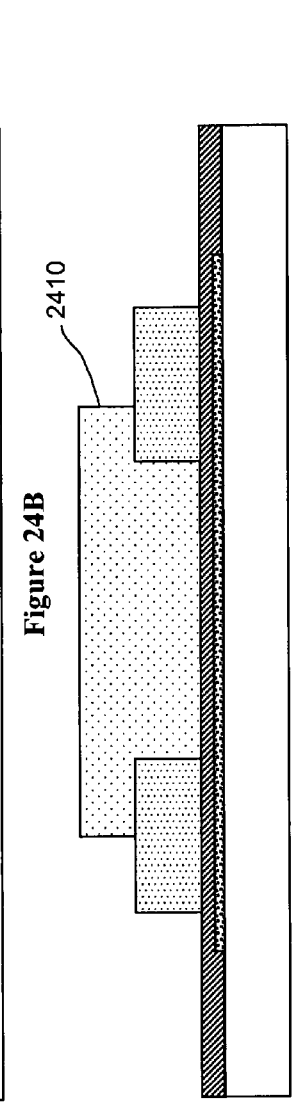

Next preferred methods deposit and pattern a sacrificial layer 2410, such as silicon, alumina, resist, or other suitable material as illustrated in FIG. 24C.

Figure 24D:
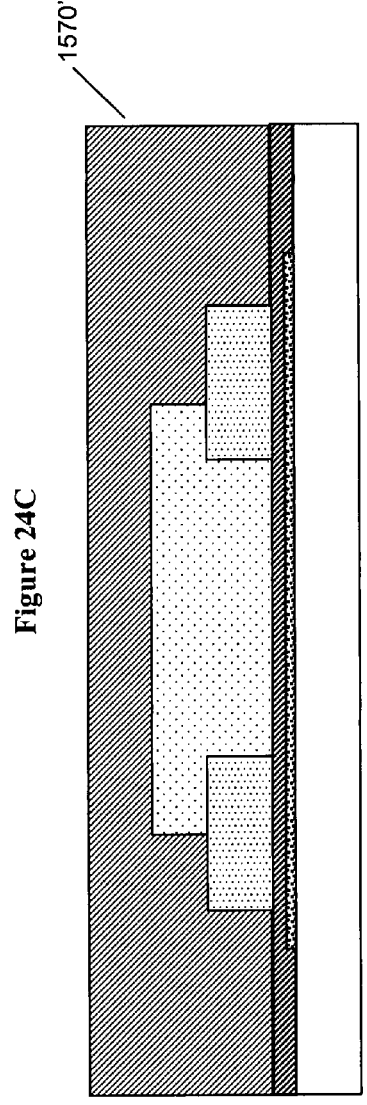

Next, preferred methods deposit conductor 1570' as illustrated in FIG. 24D.

Figure 24E:
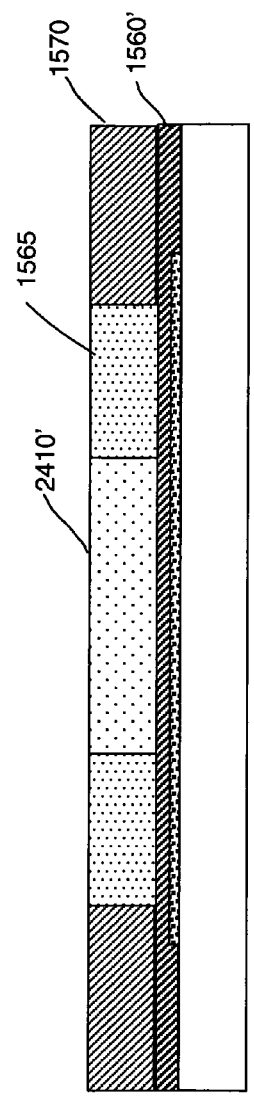

Next, preferred methods planarize the structure of FIG. 24D, with sacrificial region 2410' in the opening in insulator 1565, and conductor 1570 forming an interconnecting wiring layer in contact with conductor layer 1560' as illustrated in FIG. 24E.

Figure 24F:
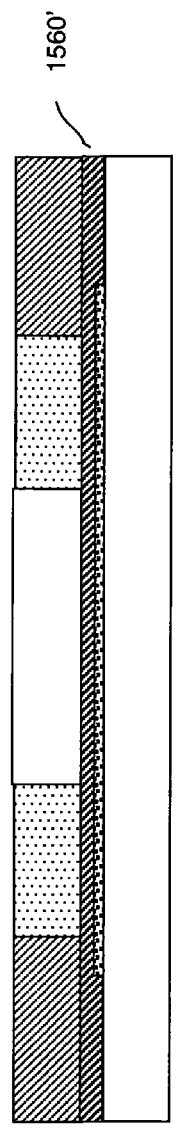

Next, preferred methods remove (etch) sacrificial region 2410' exposing SWNTs 1220 to expose a nanotube channel region containing metallic and semiconducting SWNTs as illustrated in FIG. 24F.

Figure 24G:
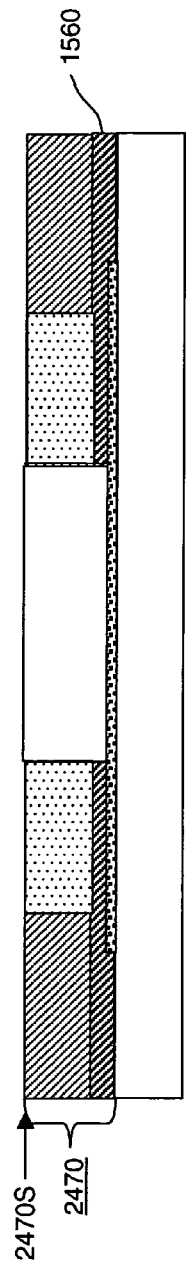

Next, preferred methods etch the exposed portion of conductor layer 1560' and forming conductor 1560, defining the region between source and drain regions and the channel region as illustrated in FIG. 24G.

Next, deposit gate insulator 1650 in the channel region. Insulator 1650 may be $SiO_2$, SiN, high-k dielectric. The insulator to SWNT interface is not critical for CNFET transistors, as is the interface between gate SiO2 and Si for NFET and PFET transistors. Then, deposit conductor 1660' as illustrated in FIG. 24H.

Next, planarize the structure illustrated in FIG. 24H to define the gate region 1660. Gate material 1660 may be a conductor such as aluminum, copper, titanium, palladium, tungsten, alloys of metals, silicon, silicides, and other conductor or semiconductor materials. FIG. 24 illustrates structure 2490 with surface 2490S.

Wafer-Level Burn-Off

Fabricated metallic SWNT burn-off structures for devices with gaps (effective dielectric constant of 1) using nanofabric are illustrated in FIG. 8. FIG. 9 illustrates burn-off conditions (current and voltage), and post-burn-off P-CNFET electrical characteristics are illustrated above in FIGS. 10A and 10B.

FIGS. 14-24 illustrate structures and preferred fabrication methods that may be used to integrate a large number (a megabit, for example) of denser hybrid stacked P-CNFET SRAM cells within a chip, with multiple chips per wafer. Gap regions exposed to an environment such as air, oxygen, or other during burn-off are illustrated for use during wafer-level burn-off. Post-burn-off structures with optimized P-CNFET devices having gate dielectrics such as SiO2 with $\epsilon_R$=3.9, SiN with $\epsilon_R$=7.5, and with high-k (high $\epsilon_R$) dielectrics such as tantalum pentoxide ($TaO_5$) with $\epsilon_R$=20 are also illustrated.

Figure 25:
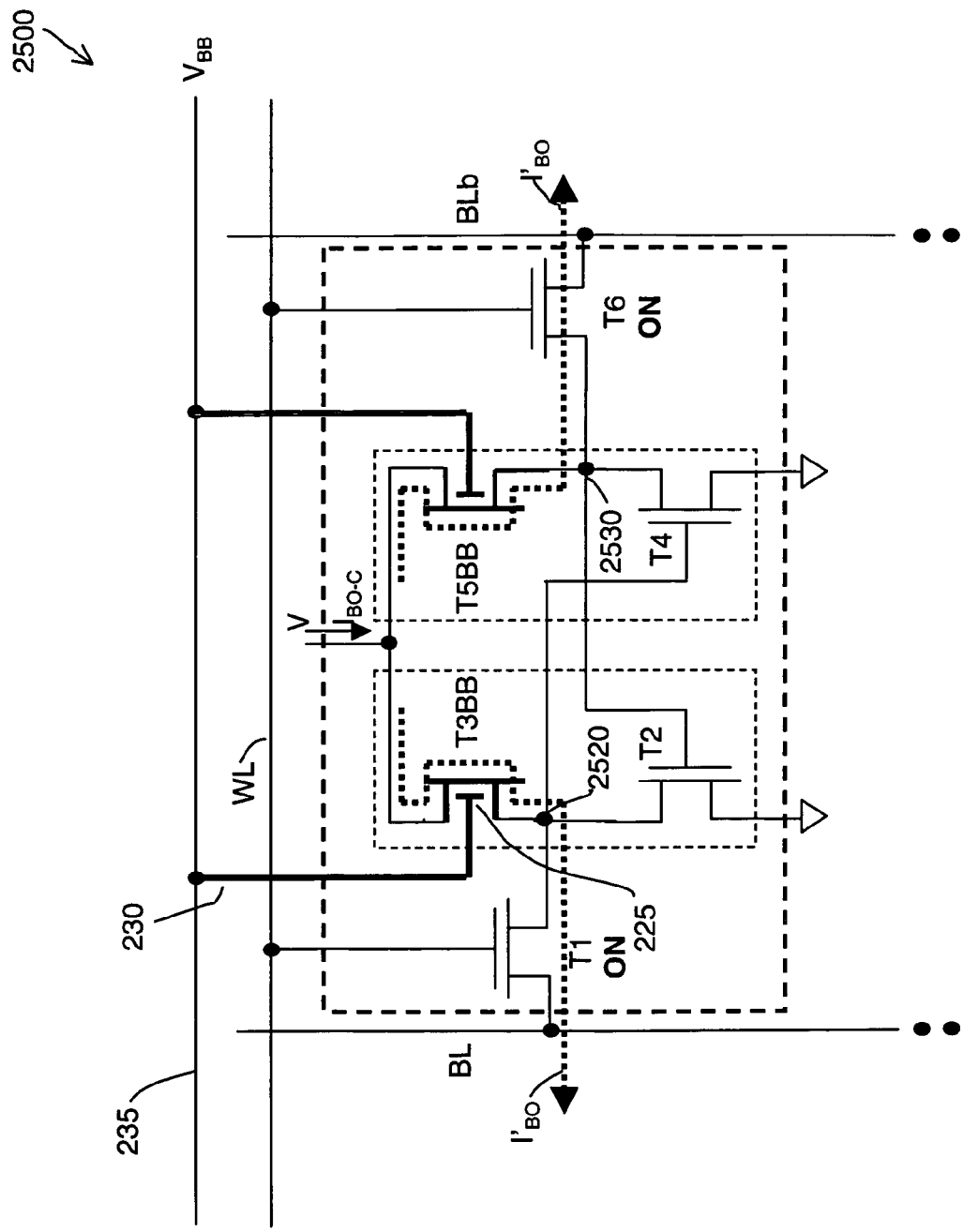
FIGS. 25-28 are schematic diagrams of structures according to aspects of the invention.

FIG. 25 illustrates schematic 2500, which is schematic 1400 with burn-off current paths illustrated, shows the use of integrated NFET transfer devices T1 and T6 to select pre-optimized integrated P-CNFET devices having a back control gate 225 connected to applied back bias voltage $V_{BB}$ power supply connection 235 by connector 230 to turn-off semiconducting SWNTs during metallic SWNT burn-off. From the burn-off results illustrated in FIG. 9, the per-cell burn-off current $I_{BO-C}$ is estimated as 100 uA, with $I'_{BO}$=50 uA for each half. NFET transfer devices T1 and T6 are capable of carrying such currents, including scaling, to at least the 45 nm node. Transfer NFETs T1 and T6 are typically 2.5 times the width of storage cell NFETs T2 and T4. Generations of FET scaling have indicated that the current carrying capability of scaled NFET devices is in the range of 700 to 900 uA/um. Assuming a current carrying capability based on 700 uA/um, the burn-off current carrying capability of transfer NFET devices T1 and T6 as a function of technology node may be summarized as follows:

180 nm technology node: $I'_{BO-MAX}$=315 uA;
130 nm technology node: $I'_{BO-MAX}$=227 uA;
90 nm technology node: $I'_{BO-MAX}$=157 uA;
65 nm technology node: $I'_{BO-MAX}$=113 uA; and
45 nm technology node: $I'_{BO-MAX}$=78 uA.

The ratio of semiconducting SWNTs to metallic SWNTs for CNFET devices is expected to increase over time, and perhaps eventually eliminate the need for burn-off, so the technique is expected to scale for even smaller technology nodes than 45 nm.

The burn-off requirements are that T1 and T6 devices are turned to the ON state. NFET channel resistance is expected to be much lower (10×, for example) than the resistance of the metallic SWNTs to be burned-off, the voltage at nodes 2520 and 2530 is expected to remain quite low with NFET devices T2 and T4 remaining in the OFF state. However, if the voltage on nodes 2520 and 2530 exceed T2 and T4 threshold voltages, these devices will provide an additional path for burn-off current, but too small a burn-off current to provide a significant increase in current carrying capability. Metallic SWNTs in multiple cells in parallel are burned-off increasing the total burn-off current to be supplied during wafer-level burn-off as discussed further below.

Figure 26:
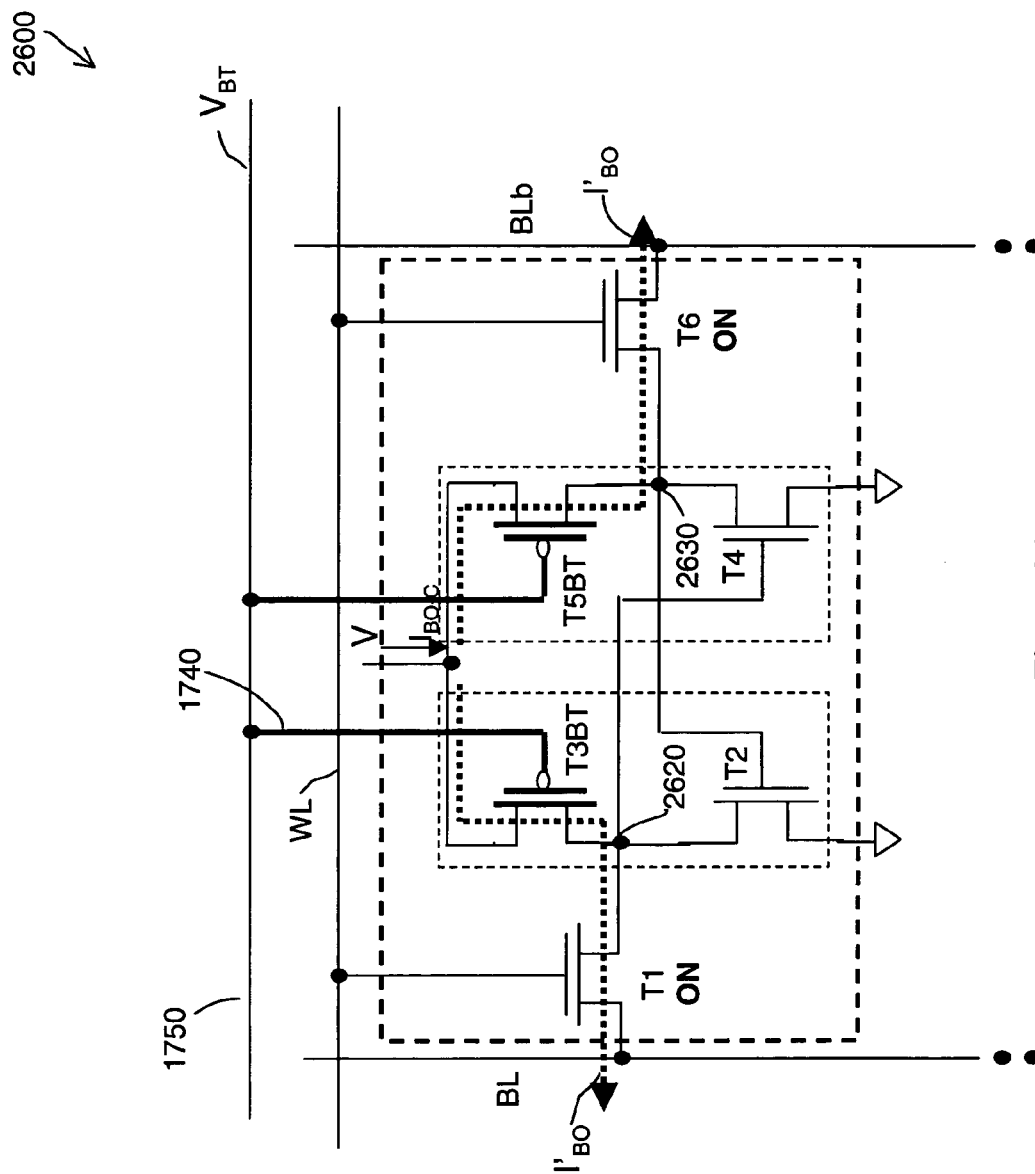

FIG. 26 illustrates schematic 2600, which is schematic 1400 with burn-off current paths illustrated, shows the use of integrated NFET transfer devices T1 and T6 to select near-optimized integrated P-CNFET devices having a front gate control to turn-off semiconducting SWNTs during metallic SWNT burn-off, with front gate connected to burn-off voltage connection 1750 by connector 1740, supplying gate voltage $V_{BT}$. Burn-off currents and cell operation during burn-off are the same as described with respect to schematic 2500, FIG. 25 above.

Figure 27:
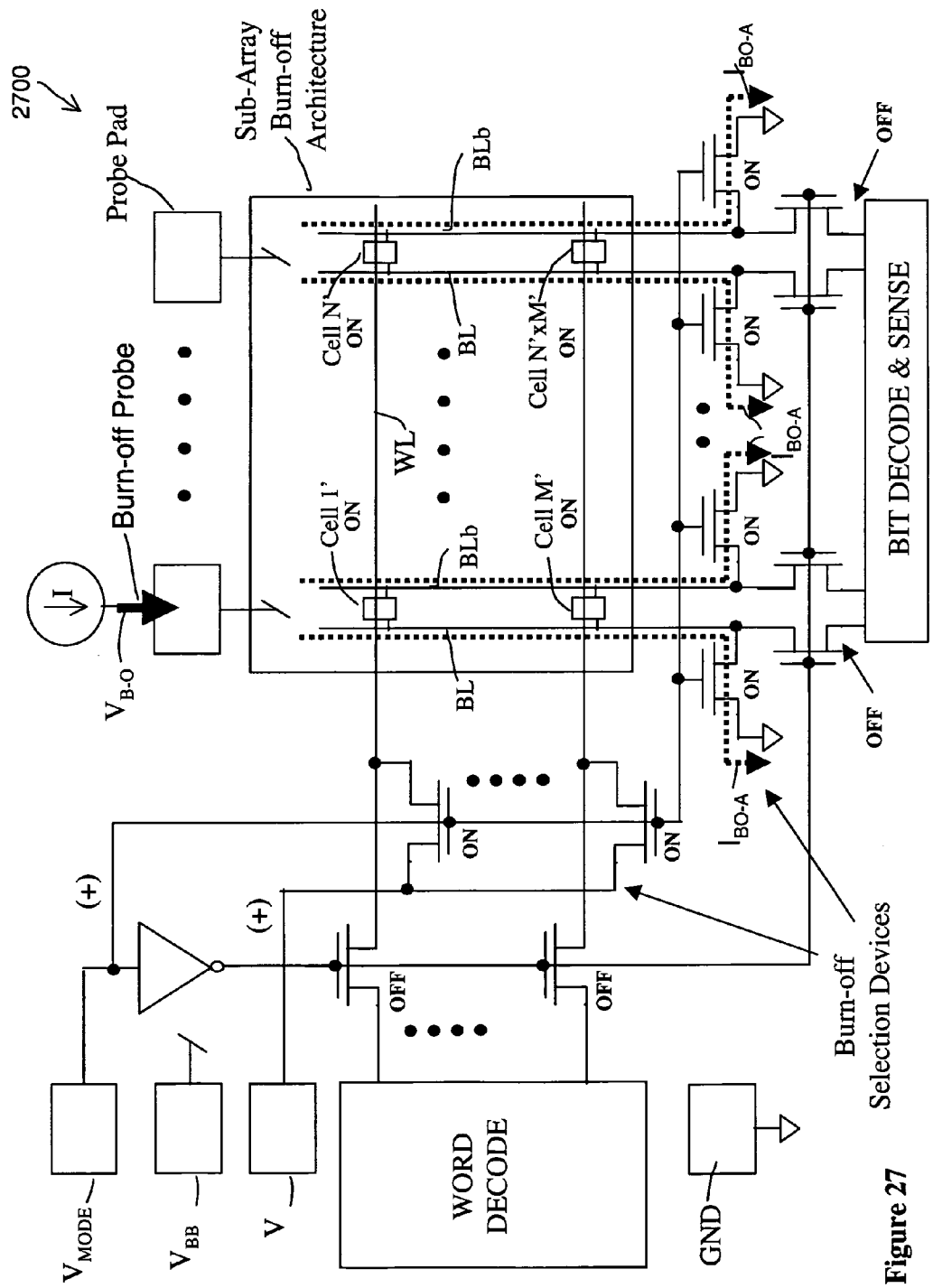

FIG. 27 illustrates a sub-array burn-off architecture using cells 1'–cell N'×M'. These cells may be the same as illustrated in schematic 2500 or as illustrated in cell 2600. Some differences in cell current value $I_{BO-C}$ may occur as a function of the corresponding structures, however, for purpose of illustrating wafer level burn-off, $I_{BO-C}$=100 um will be used. The SRAM product circuits such as word decode, bit decode and sense amplifier, timing circuits, etc. are not fully wired at this point and are not powered. In addition to wafer-level burn-off, it is desirable to monitor post burn-off currents to ensure complete burn-off of metallic SWNTs. Since only cell regions are powered, significant cell currents after burn-off are only caused by incomplete burn-off of metallic SWNTs, and additional burn-off cycles may be used to complete the wafer-level burn-off operation. Only burn-off select devices and simple select pads and circuits are operational at this point in the fabrication cycle as illustrated in FIG. 27. The burn-off current flow IBO-A is the cumulative current flow at the sub-array level as illustrated in FIG. 27.

Wafer-level burn-off current to multiple chips in parallel is supplied at the wafer level. The number of parallel burn-off cells allowed depends on the current carrying capability of the wafer probe. Wafer probing of pads is discussed in detail by G. Das et al., "Wafer-Level Test," Chapter 3, or reference book "Area Array Interconnections Handbook," Editors K. Puttlitz and P. Totta, Kluwer Academic Publishers, 2001. A more recent application note by Otto Weeden, "Probe Card Tutorial," Keithly Instruments, Inc., at www.keithley.com/servlet/Data? Id=13263, 2004 pp. 19-20 gives current carrying capability of probes as a function of probe material and probe diameter as a function of application conditions such as duty cycle. Current carrying capability, in this case for purposes of burn-off of parallel cells, of a probe of 5 mil tip diameter as function of duty cycle at steady state (DC), 10%, and 1% duty cycle is shown in the table of FIG. 31. The same 5 mil diameter probe can carry 10× the current at 1% duty cycle as it can carry in steady state (DC) operation. A burn-off tester is a simple in-line wafer-level tester connected to wafer-level probes, with individual probe current carrying capabilities as shown in table 1. Based on 100 um burn-off current per cell, the maximum number of parallel cells per probe may be calculated. The number of probes per chip required to supply the burn-off current for a million cells (or more accurately, $2^{20}$=1,048,576) is then calculated and 5 additional pads are added for common ground, mode selection, burn-off, timing, etc. A common ground may be used by powering burning-off one subsection of memory at a time to ensure that the ground probe does not exceed the per probe maximum current carrying requirement. Note that the number of additional bits to satisfy redundancy requirements for yield is typically very small, and may be ignored in terms of contribution to total burn-off current. The number of devices that may be simultaneously burned-off is then calculated. Assuming 200 chips per wafer, the number of stepping per wafer is then calculated, all as a function of duty cycle, all shown in table 1. Duty cycle is a major factor in the number of stepping operations, a reduction from 25 multi-chip probing operations for steady state conditions to 3 stepping operations for a 1% duty cycle. Optimum burn-off conditions will vary for the various cell structures described above.

Figure 28:
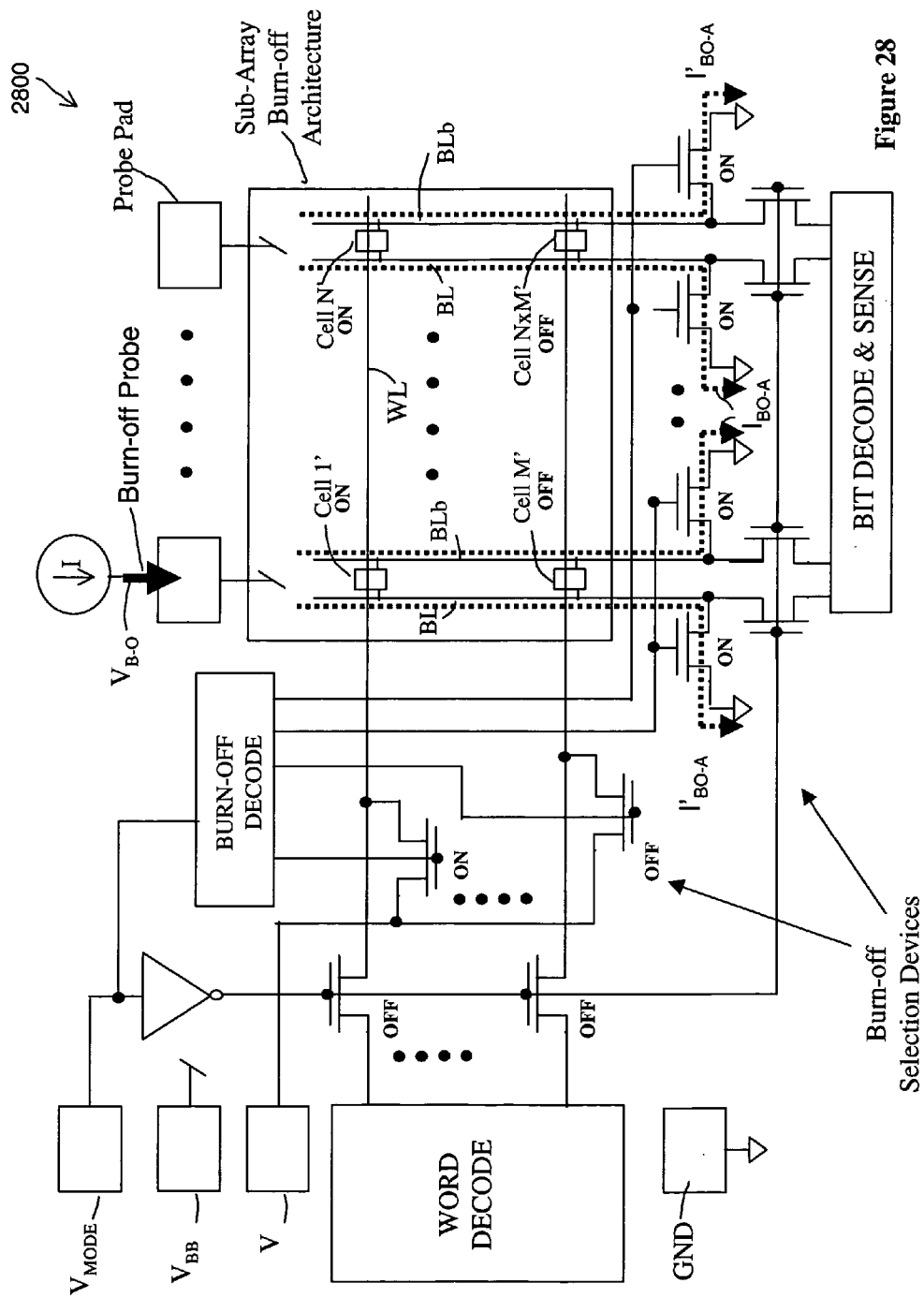

FIG. 28 illustrates that a simple burn-off decode structure may be added to control the number of cells that are ON and OFF along a bit line segment, for example. More sophisticated methods such as the use of burn-in self-test (BIST) engines (not shown) may also be introduced for each chip. Use of BIST engines for wafer-level test and burn-in (or in this case adapted for burn-off) are described in U.S. Pat. No. 6,426,904 where C. Bertin is a co-inventor. The BIST engine controls a level sensitive (LSSD) protocol. The use of BIST may require more interconnections than those for the methods described above, and may be more effectively used for burn-off of near-optimized cells such as illustrated in schematic 2600, FIG. 26. The advantage of BIST is that the wafer-level tester requirements are greatly reduced, that the number of probes per chip is reduced to 10, 5 for the BIST engine, and 5 for power supply, ground, etc. The on-chip circuits switch individual cell blocks sequentially and enable the use of only one burn-off probe by limiting the number of metallic SWNTs burned in parallel. With 10 pads per chip, 200 chips on a wafer may be simultaneously burned-off and tested with a 2000 Terminal wafer-level probe. Full-wafer probing techniques are discussed by C. Bertin et al, "Known Good Die (KDG)," Chapter 4, of reference book "Area Array Interconnection Handbook," editors K. Puttlitz and P. Totta, Kluwer Academic publishers, 2001.

Figure 29:
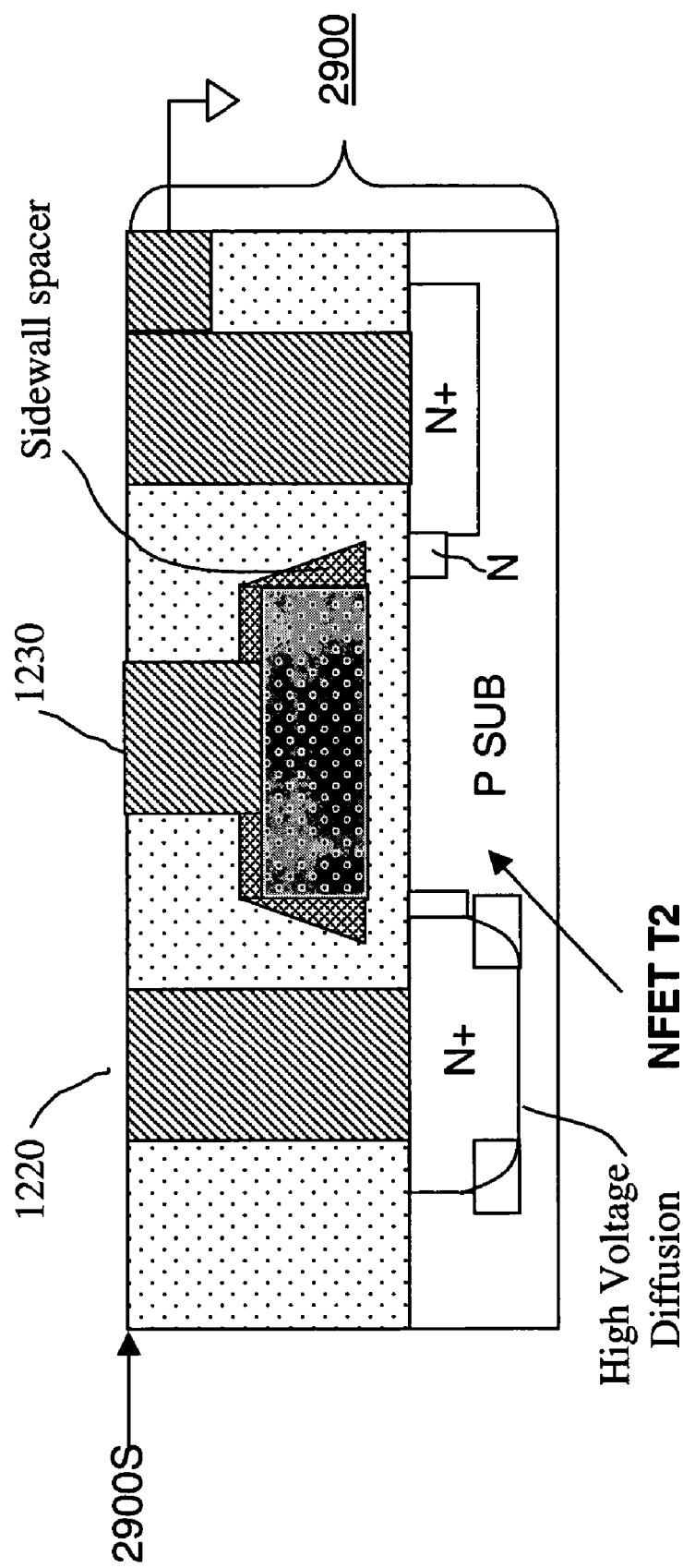
FIG. 29 illustrates a cross section of a prior art device.

Burn-off methods that use on-chip electronic selection may expose the cell NFET devices to relatively high voltage if transfer device NFETs T1 and T6 are turned OFF without also removing the burn-off voltage from the cells, as is done for burn-off architecture described with respect to FIG. 27. One option is to increase the breakdown voltage of all cell NFET devices with modified diffused N+ junctions. Some density gain due to stacking of P-CNFET devices may be lost; however, cell stability is increased because of additional node capacitance. The bit line capacitance is unchanged because the increased junction capacitance is not on bit-line connection side of transfer devices T1 and T6. FIG. 29 gives an example of a modified cross section for NFET device T2. A similar change for devices T4, T1 and T6 would also occur. The high-voltage diffusion is designed to tolerate the relatively high voltage of 8 volts that can occur during metallic SWNT burn-off by using a deeper and more rounded doping profile, as is used to meet the high-voltage requirements of EEPROM devices described in the reference book K. Itoh, "VLSI Memory Chip Design," Springer Publisher, pp. 37-46, 2001. Structure 2900 with surface 2900S can be interchanged with structure 1300 and 1300S in all structures illustrated in all figures above.

Figure 30:
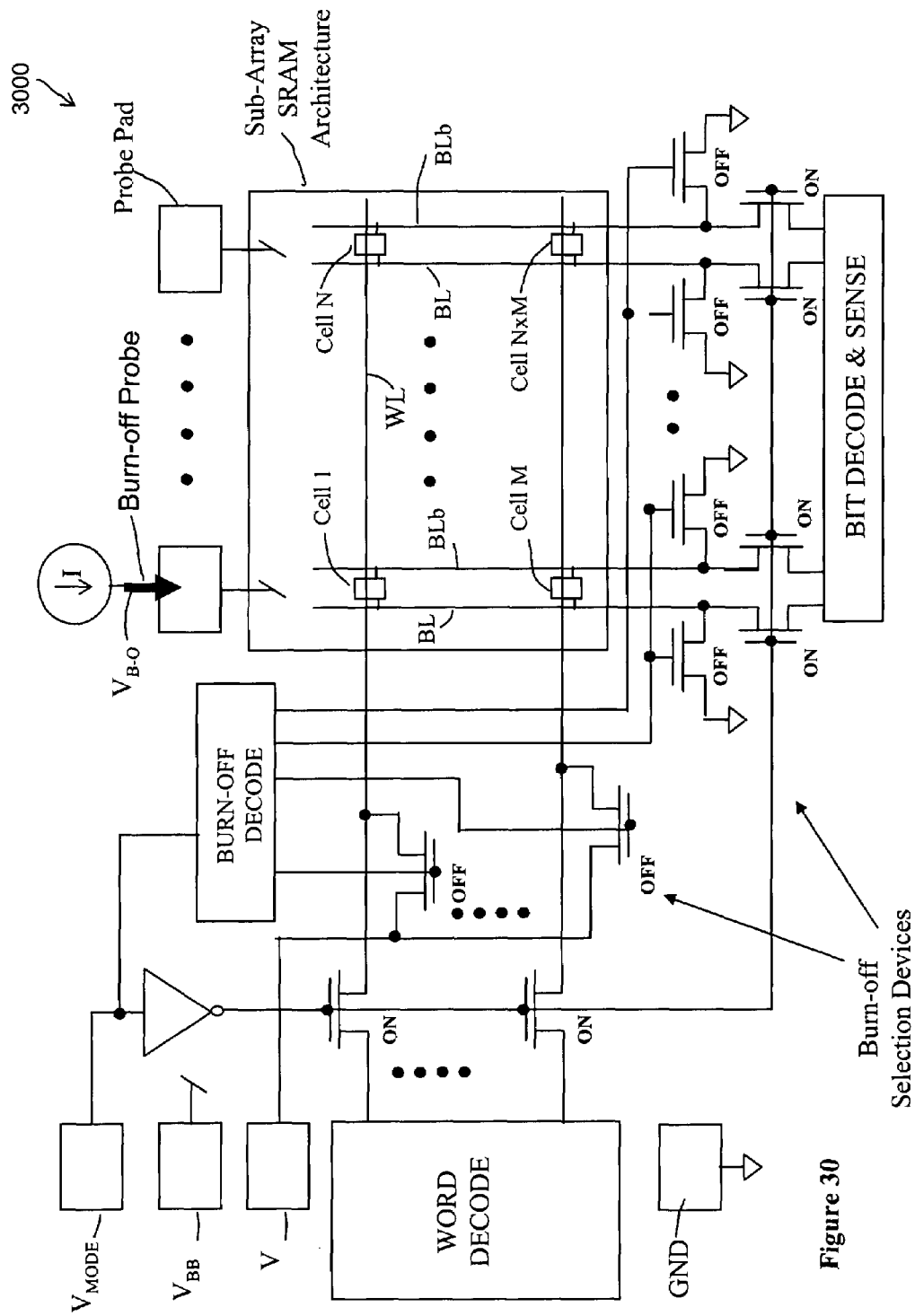
FIG. 30 is a schematic diagram of a structure according to one aspect of the invention.

FIG. 30 illustrates the architecture 3000, which is the same as the architecture 2800 of FIG. 28, except that burn-off select devices are in the OFF state for normal SRAM operation.

Preferred embodiments of the invention provide a process and design scheme that is manufacturable and that can yield a SRAM that has electrical characteristics that outperform the figures of merit of current and future state-of-the-art semiconductor-based devices.

While the embodiments above were illustrated with suspended fabrics to facilitate burn-off of metallic nanotubes, the inventors envision that burn-off may be achieved with partially suspended fabrics and non-suspended fabrics as well.

While all of the figures in the present application suggest that the nanotube fabric channel is horizontally oriented, other embodiments of the present invention utilize vertical or non-horizontally oriented nanofabric channels along with adjacent gates, arranged in appropriate geometries. Such non-horizontally oriented fabrics may be fabricated according to the methods described in U.S. Pat. No. 6,924,538, entitled, Electro-Mechanical Switches and Memory Cells Using Vertically-Disposed Nanofabric Articles and Methods of Making the Same, which is incorporated by reference in its entirety.

Other embodiments include a double-gated FET having multi-walled carbon nanotubes alone or in combination with SWNTs.

The gates need not be opposed vertically, but may be opposed horizontally. An alternate embodiment of the present invention therefore would include horizontally opposed gates surrounding the channel.

It will be further appreciated that the scope of the present invention is not limited to the above-described embodiments but rather is defined by the appended claims, and that these claims will encompass modifications and improvements to what has been described.

What is claimed is:

1. A static random access memory(SRAM), comprising:
   two semiconductor-type field effect transistors (FETs), each FET having a semiconductor drain region and a semiconductor source region of a first type of semiconductor material, and each FET having a semiconductor channel region positioned between respective drain and source regions, said channel region made of a second type of semiconductor material, each FET further having a gate node in proximity to a respective channel region so as to be able to modulate the conductivity of the channel by electrically stimulating the gate, wherein the two semiconductor-type FETs are cross-coupled so that gate of one FET connects to the drain or source of the other; and
   two nanotube FETs (NTFETs), each having a channel region made of non-woven nanotube fabric, connected to a respective source and drain region of a corresponding NTFET, a first NTFET connected to the drain or source of the first semiconductor-type FET and the second NTFET connected to the drain or source of the second semiconductor-type FET.

2. The SRAM cell of claim 1, wherein the two semiconductor-type FETs are formed in a substrate, and the two NTFETs are positioned above the two semiconductor-type FETs.

3. The SRAM cell of claim 2 wherein the NTFETs are vertically aligned with a corresponding semiconductor-type FET.

4. The SRAM cell of claim 1 wherein the semiconductor-type FETs is an N-type FET and the channel of the NTFET is formed of p-type nanotubes.

5. The SRAM cell of claim 1 wherein the semiconductor-type FETs is an N-type FET and the channel of the NTFET is formed of ambipolar-type nanotubes.

6. The SRAM cell of claim 1 wherein NTFETs also include a back control gate.

* * * * *

UNITED STATES PATENT AND TRADEMARK OFFICE
CERTIFICATE OF CORRECTION

PATENT NO. : 7,598,544 B2  Page 1 of 1
APPLICATION NO. : 11/332080
DATED : October 6, 2009
INVENTOR(S) : Claude L. Bertin et al.

It is certified that error appears in the above-identified patent and that said Letters Patent is hereby corrected as shown below:

On the title page item (54) and Col. 1, line 1, the title of the invention should read as follows:

HYBRID CARBON [NANOTUDE] NANOTUBE FET(CNFET)-FET STATIC RAM (SRAM) AND METHOD OF MAKING SAME

On the title page, item (73), the Assignee's name should read as follows:

[Nanotero] Nantero, Inc.

Signed and Sealed this

Twenty-second Day of December, 2009

David J. Kappos
*Director of the United States Patent and Trademark Office*

UNITED STATES PATENT AND TRADEMARK OFFICE
CERTIFICATE OF CORRECTION

PATENT NO. : 7,598,544 B2
APPLICATION NO. : 11/332080
DATED : October 6, 2009
INVENTOR(S) : Bertin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 688 days.

Signed and Sealed this

Twenty-eighth Day of September, 2010

David J. Kappos
*Director of the United States Patent and Trademark Office*